United States Patent
Yang et al.

(10) Patent No.: US 11,206,493 B2
(45) Date of Patent: Dec. 21, 2021

(54) SENSOR DEVICE AND MANUFACTURING METHOD THEREOF

(71) Applicant: TAIWAN SEMICONDUCTOR MANUFACTURING CO., LTD., Hsinchu (TW)

(72) Inventors: Chen Hsiung Yang, Jhubei (TW); Chun-Wen Cheng, Zhubei (TW); Chia-Hua Chu, Zhubei (TW); En-Chan Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/174,159

(22) Filed: Oct. 29, 2018

(65) Prior Publication Data

US 2019/0306633 A1 Oct. 3, 2019

Related U.S. Application Data

(60) Provisional application No. 62/650,675, filed on Mar. 30, 2018.

(51) Int. Cl.
| | |
|---|---|
| H04R 19/04 | (2006.01) |
| B81B 3/00 | (2006.01) |
| B81C 1/00 | (2006.01) |
| H04R 19/00 | (2006.01) |
| H04R 7/06 | (2006.01) |
| H04R 31/00 | (2006.01) |

(52) U.S. Cl.
CPC .............. *H04R 19/04* (2013.01); *B81B 3/007* (2013.01); *B81C 1/00658* (2013.01); *H04R 7/06* (2013.01); *H04R 19/005* (2013.01); *H04R 31/003* (2013.01); *B81B 2201/0257* (2013.01); *B81B 2203/0127* (2013.01); *B81B 2203/0315* (2013.01); *B81B 2203/0361* (2013.01); *B81C 2201/0133* (2013.01); *H04R 2201/003* (2013.01)

(58) Field of Classification Search
CPC .............................................. B81C 2201/0133
See application file for complete search history.

(56) References Cited

U.S. PATENT DOCUMENTS 10,362,408 B2 * 7/2019 Kuntzman ............ B81B 3/0021
10,464,807 B2 * 11/2019 Barzen ................... H04R 31/00
(Continued)

FOREIGN PATENT DOCUMENTS

| CN | 103686570 A | 3/2014 |
| CN | 104113812 A | 10/2014 |

(Continued)

*Primary Examiner* — Fan S Tsang
*Assistant Examiner* — Angelica M McKinney
(74) *Attorney, Agent, or Firm* — McDermott Will & Emery LLP

(57) ABSTRACT

A micro electro mechanical system (MEMS) microphone includes a first membrane, a second membrane, a third membrane disposed between the first membrane and the second membrane, a first cavity disposed between the first membrane and the third membrane and surrounded by a first wall, a second cavity disposed between the second membrane and the third membrane and surrounded by a second wall, and one or more first supports disposed in the first cavity and connecting the first membrane and the third membrane.

19 Claims, 78 Drawing Sheets

(56) References Cited

U.S. PATENT DOCUMENTS

| | | | |
|---|---|---|---|
| 2012/0091546 A1* | 4/2012 | Langereis | H04R 31/006 257/416 |
| 2014/0270271 A1* | 9/2014 | Dehe | H04R 31/00 381/174 |
| 2015/0001647 A1* | 1/2015 | Dehe | B81B 3/0021 257/416 |
| 2015/0189444 A1* | 7/2015 | Pan | H04R 19/04 381/173 |
| 2016/0088402 A1* | 3/2016 | Hu | H04R 19/04 381/174 |
| 2016/0241979 A1* | 8/2016 | Cho | H04R 1/04 |
| 2016/0304337 A1* | 10/2016 | Miao | H04R 31/003 |
| 2016/0340173 A1* | 11/2016 | Klein | H04R 19/04 |
| 2017/0180900 A1* | 6/2017 | Dehe | H04R 1/08 |
| 2018/0086624 A1* | 3/2018 | Cheng | B81C 1/00158 |
| 2018/0111824 A1* | 4/2018 | Wu | B81B 7/008 |
| 2018/0146296 A1* | 5/2018 | Meisel | H04R 9/08 |
| 2018/0152794 A1* | 5/2018 | Thomsen | H04R 3/06 |
| 2018/0170745 A1* | 6/2018 | Barzen | H04R 31/003 |
| 2020/0102209 A1* | 4/2020 | Lin | B81B 1/004 |
| 2020/0107130 A1* | 4/2020 | Cheng | B81C 1/00182 |

FOREIGN PATENT DOCUMENTS

| | | |
|---|---|---|
| CN | 107032289 A | 8/2017 |
| TW | 200738028 A | 10/2007 |
| TW | 201333530 A | 8/2013 |

* cited by examiner

SENSOR DEVICE AND MANUFACTURING METHOD THEREOF

RELATED APPLICATIONS

This application claims priority of U.S. Provisional Patent Application No. 62/650,675 filed on Mar. 30, 2018, the entire contents of which are incorporated herein by reference.

BACKGROUND

Micro-electro mechanical system (MEMS) devices have recently been developed. MEMS devices include devices fabricated using semiconductor technology to form mechanical and electrical features. The MEMS devices are implemented in pressure sensors, microphones, actuators, mirrors, heaters, and/or printer nozzles. Although existing devices and methods for forming the MEMS devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A corresponds to line X1-X1 of FIG. 1A, and FIG. 2B corresponds to line X2-X2 of FIG. 1A.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." In the present disclosure, at least one of A, B and C means "A," "B," "C," "A and B," "A and C," "B and C," or "A, B and C," and does not mean that one from A, one from B and one from C, unless otherwise indicated.

The performance of microphones is characterized by various parameters. For example, an signal-to-noise ratio (SNR) and an acoustic overload point (AOP) are important quality indicators for microphones, in particular for MEMS microphones. While AOP can be increased by increasing membrane (diaphragm) stiffness and/or by reducing a bias voltage, it may reduce the SNR and sensitivity of MEMS microphones.

In the present disclosure, one or more support structures are provided between membranes constituting a MEMS microphone to increase membrane stiffness without changing bias voltage, thereby improving the AOP.

Figure 1A:
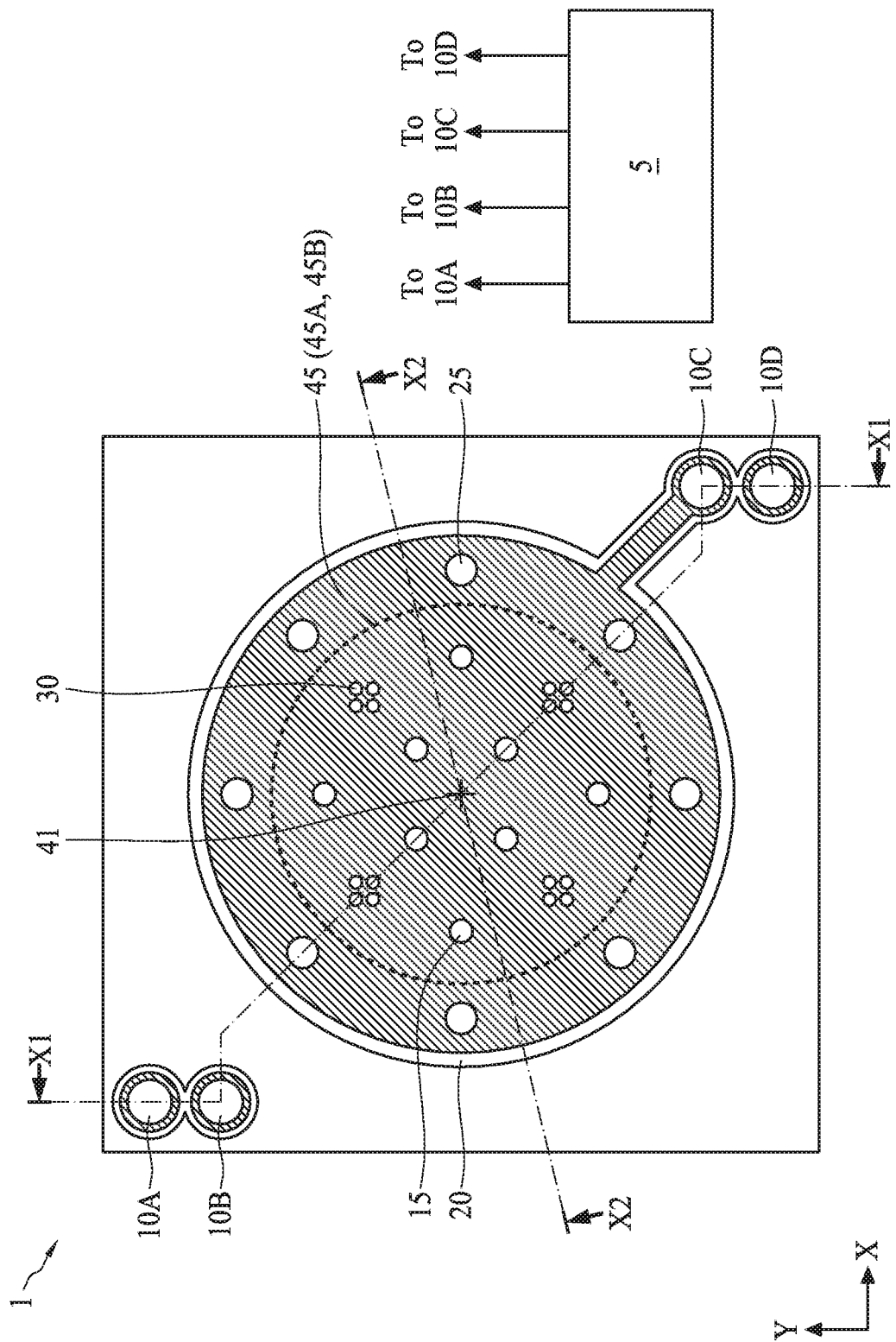
FIGS. 1A and 1B show schematic plan views of a MEMS microphone according to an embodiment of the present disclosure.
Figure 2A:
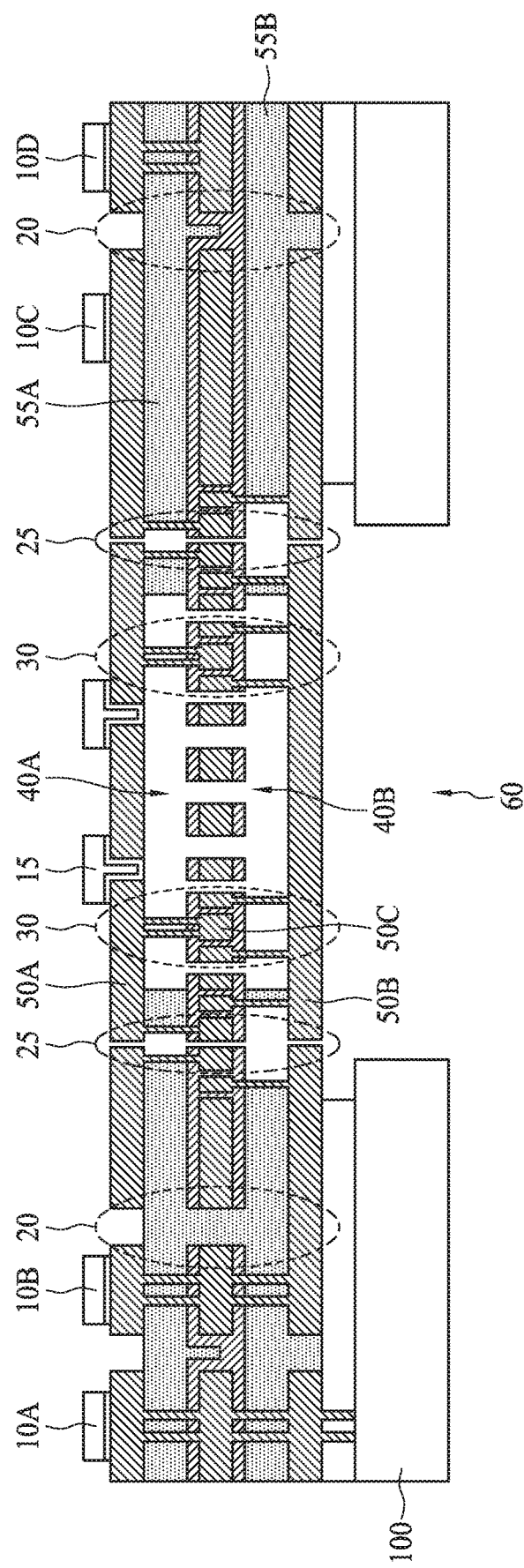
FIGS. 2A and 2B show schematic cross sectional views of a MEMS microphone according to an embodiment of the present disclosure.
Figure 2B:
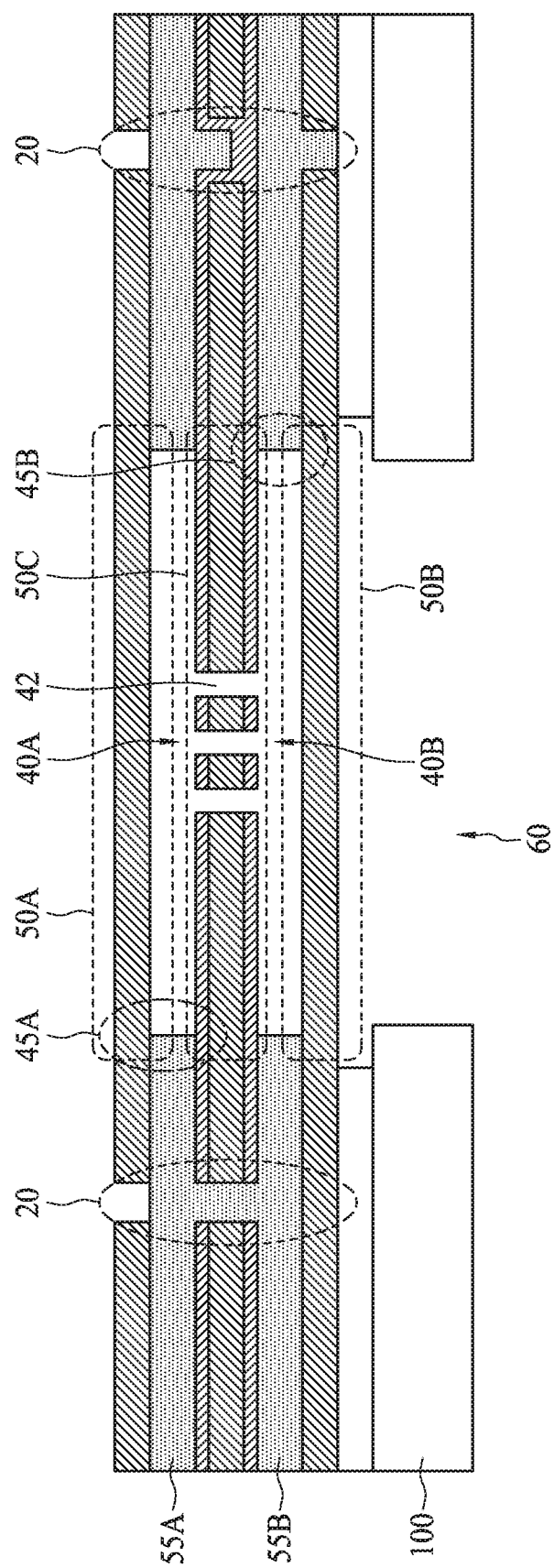

FIG. 1A shows a plan view (a view from the top) of a MEMS microphone according to an embodiment of the present disclosure. FIGS. 2A and 2B show cross sectional views of the MEMS microphone shown in FIG. 1A. FIG. 2A shows a cross sectional view corresponding to line X1-X1 of FIG. 1A, and FIG. 2B shows a cross sectional view corresponding to line X2-X2 of FIG. 1A.

Figure 1B:
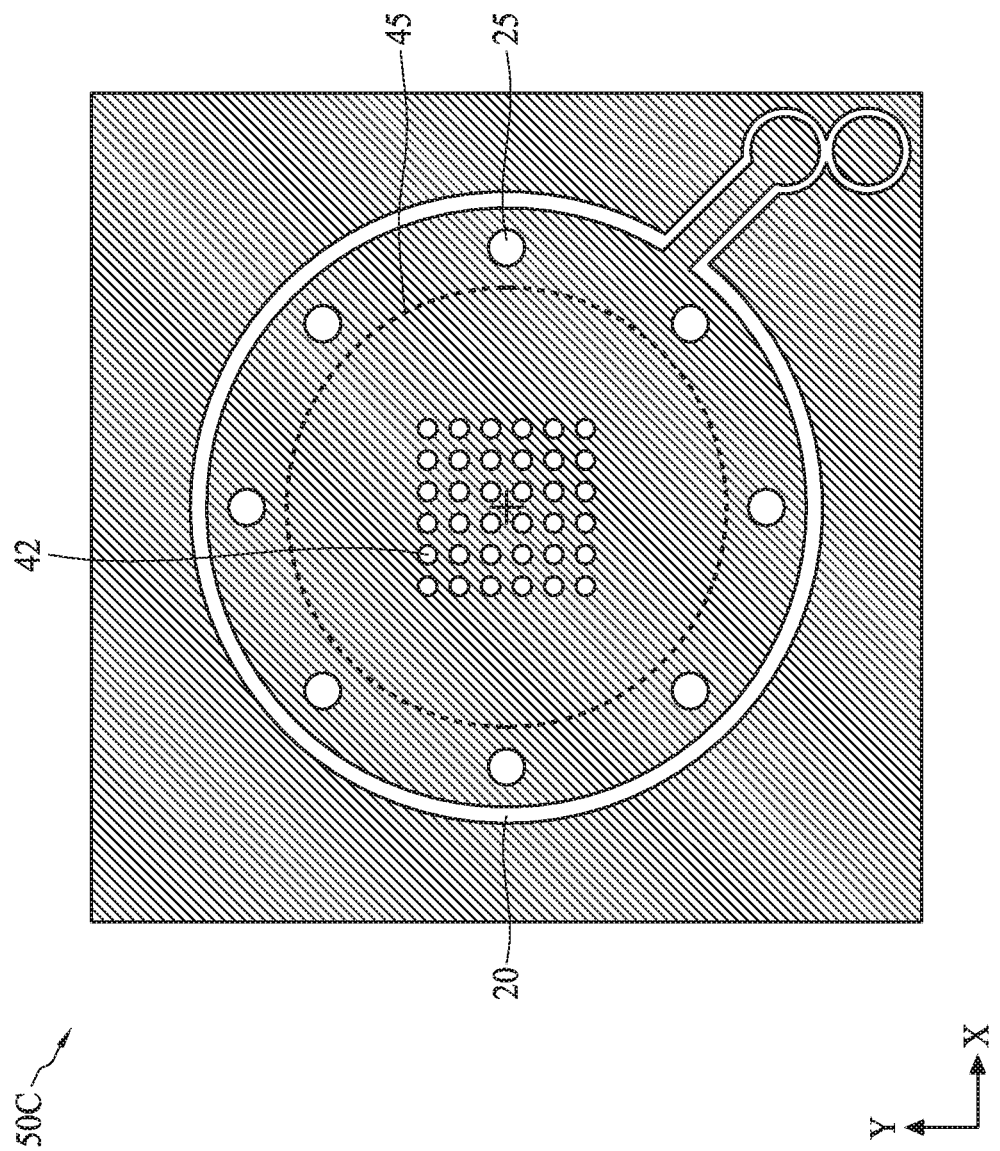

A MEMS microphone 1 includes a first electrode 10A, a second electrode 10B, a third electrode 10C and a fourth electrode 10D, which are electrically coupled to an electric circuit 5, as shown in FIG. 1A. The MEMS microphone 1 includes a first membrane (a first diaphragm) 50A, a second membrane (a second diaphragm) 50B and a base plate 50C disposed between the first membrane 50A and the second membrane 50B. A first cavity 40A is disposed between the first membrane 50A and the base plate 50C and surrounded by a wall 45A formed by an insulating layer 55A, and a second cavity 40B is disposed between the second membrane 50B and the base plate 50C and surrounded by a wall 45B formed by an insulating layer 55B. FIG. 1A shows a wall part 45 corresponding to the wall 45A and the wall 45B. The first cavity 40A and the second cavity 40B are connected by one or more through holes 42 (e.g., acoustic holes) formed in the base plate 50C, as shown in FIGS. 1A and 1B. FIG. 1B is plan view of the base plate 50C.

In some embodiments, the first electrode 10A is electrically connected to a substrate 100, and electrically coupled to the ground, the second electrode 10B is electrically coupled to the second membrane 50B, the third electrode 10C is electrically coupled to the first membrane 50A, and the fourth electrode 10D is electrically coupled to the base plate 50C. By the electric circuit, a bias voltage is applied between the second electrode 10B and the fourth electrode 10D and between the third electrode 10C and the fourth electrode 10D.

In some embodiments, the first membrane 50A is separated by a separation groove 20 from the remaining portion on which the first, second and fourth electrodes are disposed. The first membrane 50A has a neck portion connecting the first membrane 50A and a pad portion on which the third electrode 10C is disposed. Similarly, the second membrane 50B and the base plate 50C are similarly separated by grooves.

When sound pressure is applied to the first membrane 50A, the first membrane is bent and a distance of a first capacitor formed by the first membrane 50A and the base plate 50C changes, thereby causing a capacitance change between the first membrane 50A and the base plate 50B. Further, the bent of the first membrane causes a bent of the second membrane 50B. Then, a distance between the second membrane 50B and the base plate 50C changes, thereby causing a capacitance change of a second capacitor formed by the second membrane 50B and the base plate 50C. The electric circuit 5 detects the capacitance change of the first capacitor and the capacitance change of the second capacitor, and outputs an electric signal responsive to the sound pressure based on the capacitance changes.

In some embodiments, one or more support structures 30 are provided between the first membrane 50A and the base plate 50C and/or between the second membrane 50B and the base plate 50C, as shown in FIGS. 1A and 2A.

Figure 2C:
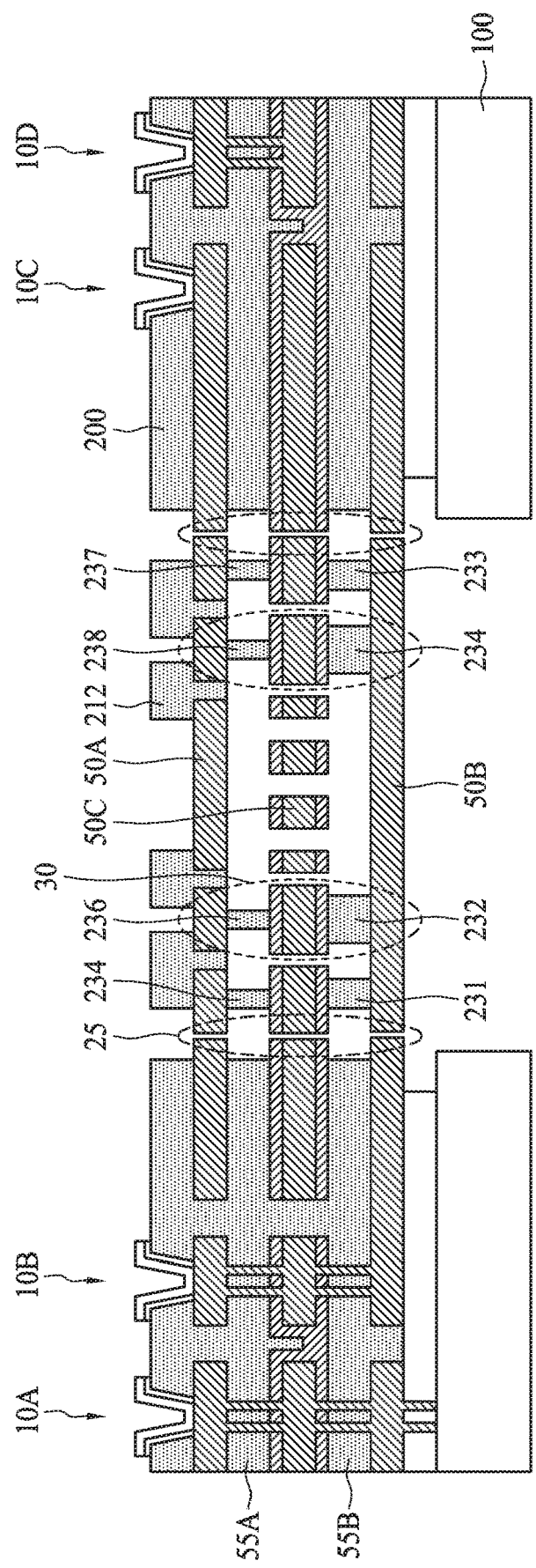
FIG. 2C shows a schematic cross sectional view of a MEMS microphone according to another embodiment of the present disclosure.

FIG. 2C is a schematic cross sectional view of the MEMS microphone according to another embodiment of the present disclosure. Material, configuration, dimensions and/or processes the same as or similar to the foregoing embodiments described with FIGS. 1A-2B may be employed in the following embodiments, and detailed explanation thereof may be omitted. In this embodiment, the support structures are made of insulating materials of the insulating layers.

As shown in FIG. 2C, the first support structure includes first supports 236, 238 disposed between the first membrane 50A and formed by the insulating material of the insulating layer 55A, and the base plate 50C, and second supports 232, 234 disposed between the second membrane 50B and the base plate 50C and formed by the insulating material of the insulating layer 55B. Further, the vent hole 25 is surrounded by the insulating material of the insulating layer 55A and the insulating layer 55B.

Figure 3C:
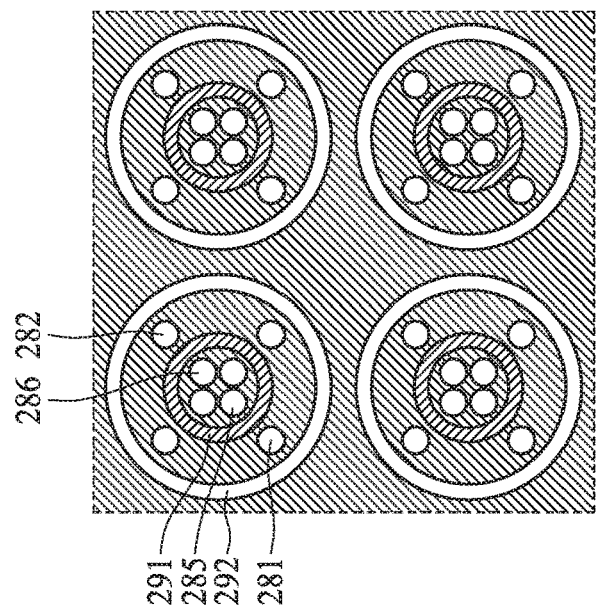
FIG. 3C shows schematic plan view of a support structure in a MEMS microphone according to another embodiment of the present disclosure.
Figure 3B:
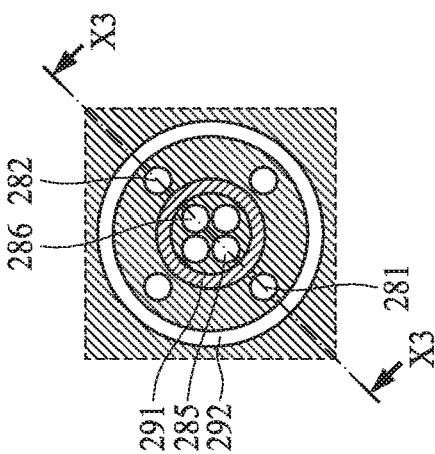
FIG. 3B shows schematic plan view of the support structure in a MEMS microphone according to an embodiment of the present disclosure.
Figure 3A:
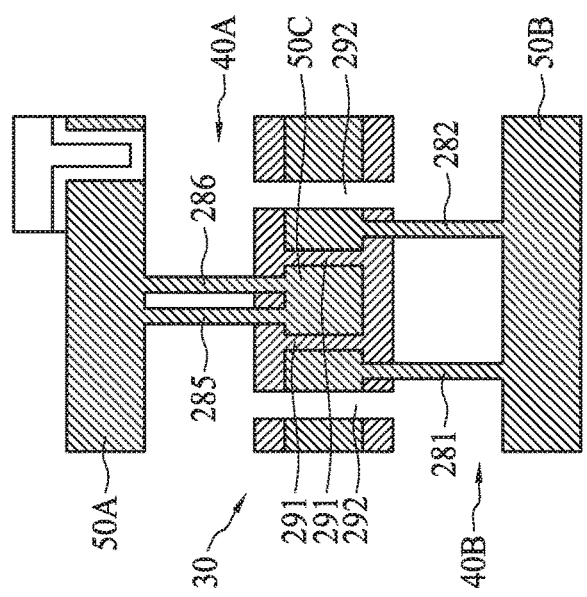
FIG. 3A shows a schematic cross sectional view of a support structure in a MEMS microphone according to an embodiment of the present disclosure.

FIG. 3A shows an enlarged cross sectional view of the support structure 30 and FIG. 3B is a plan view of the support structure 30. FIG. 3A corresponds to line X3-X3 of the support structure 30 of FIG. 3B. In some embodiments, the first membrane 50A and the base plate 50C are connected by one or more first supports 285 and 286. In some embodiments, the second membrane 50B and the base plate 50C are connected by one or more second supports 281 and 282. In some embodiments, the supports 281 and 282 are a pillar or a column made of the same material as the base plate 50C, and the supports 285 and 286 are a pillar or a column made of the same material as the first membrane 50A.

In some embodiments, the first supports 285 and 286 land on a part of the base plate 50C, which is surrounded and isolated by an isolation dielectric material 291 from other portions of the base plate 50C, from which the second supports 281 and 282 extend. Thus, the first supports 285 and 286 are electrically isolated from the supports 281 and 282. In some embodiments, four first supports including 285 and 286 are provided and surrounded by the isolation dielectric material 291, and four second supports including 281 and 282 surround the isolation dielectric material 291, in plan view. Further, in some embodiments, the four second supports are surrounded by a separation gap 292. Thus, the first membrane 50A is not electrically connected by the first pillars to the base plate 50C, and the second membrane 50B is not electrically connected by the second pillars to the base plate 50C. In other embodiments, the second supports are surrounded by the isolation dielectric material 291, the first supports surround the isolation dielectric material 291 and the separation gap surrounds the first support, in plan view. The number of first and/or second supports in one support structure 30 is not limited to four. The number can be one, two, three or more than four.

In some embodiments, a diameter of the first and second supports is in a range from about 100 nm to about 5000 nm, and is in a range from about 500 nm to about 2000 nm in other embodiments. In some embodiments, a width of the separation gap is in a range from about 100 nm to about 5000 nm, and is in a range from about 500 nm to about 2000 nm in other embodiments. In some embodiments, a width of the isolation dielectric material is in a range from about 100 nm to about 5000 nm, and is in a range from about 500 nm to about 2000 nm in other embodiments.

FIG. 3C shows four support structures arranged as a 2×2 matrix, constituting a group of support structures. In some embodiments, as shown in FIG. 1A, four groups of the support structures 30 are provided in the MEMS microphone and arranged to be point symmetric with respect to the center 41 of the first and/or second cavities. In other embodiments, a plurality of support structures are provided in the MEMS microphone and arranged to be point symmetric with respect to the center 41 of the first and/or second cavities. In certain embodiments, a plurality of first and/or second supports are provided in the MEMS microphone and arranged to be point symmetric with respect to the center 41 of the first and/or second cavities. In some embodiments, the supports or the support structures are disposed closer to the wall part 45 than to the center 41 of the cavities.

Figure 3G:
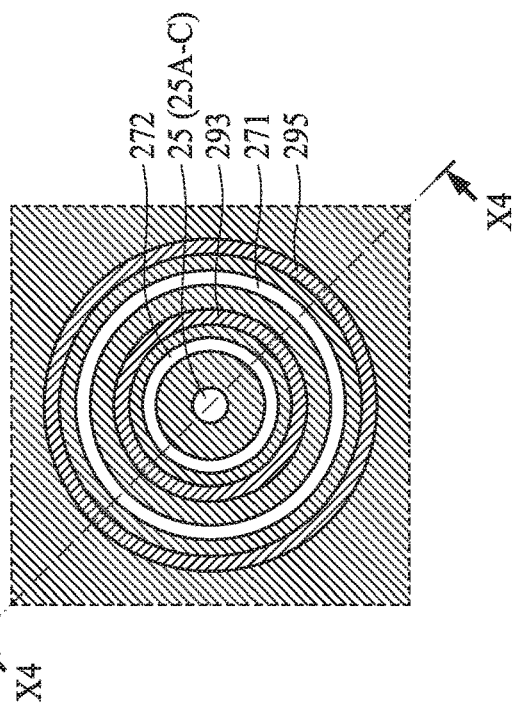
FIG. 3G shows schematic plan view of the vent hole structure in a MEMS microphone according to an embodiment of the present disclosure.
Figure 3F:
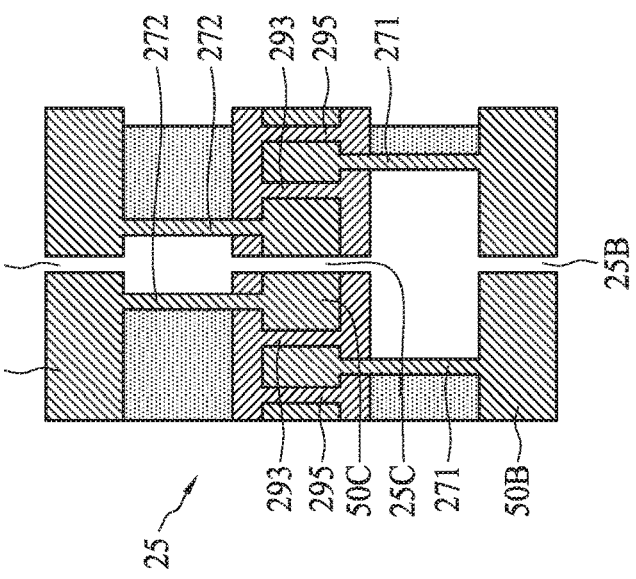
FIG. 3F shows a schematic cross sectional view of a vent hole structure in a MEMS microphone according to an embodiment of the present disclosure.
Figure 3D:
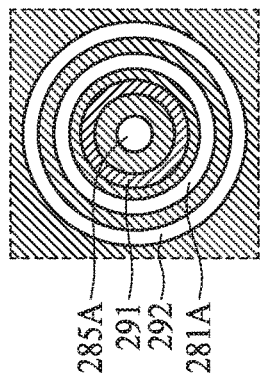
FIG. 3D shows schematic plan view of a support structure in a MEMS microphone according to another embodiment of the present disclosure.
Figure 3E:
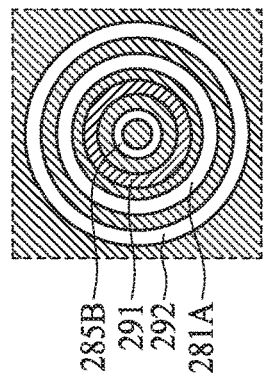
FIG. 3E shows schematic plan view of a support structure in a MEMS microphone according to another embodiment of the present disclosure.

FIGS. 3D and 3E show other embodiments of the support structure 30. In FIG. 3D, the first support 285A is a pillar or a column, and the second support 281A is a cylinder in some embodiments. In other embodiments, the second support is a center pillar or column surrounded by the isolation dielectric material 291, which is surrounded by a cylindrical first support. In FIG. 3E, the first support 285B is a cylinder, and the second support 281A is a cylinder in some embodiments. In other embodiments, the second support is a center cylinder surrounded by the isolation dielectric material 291, which is surrounded by a cylindrical first support. The cylinders shown in FIGS. 3D and 3E are concentric in some embodiments in plan view. In some embodiments, a diameter of the pillar is in a range from about 100 nm to about 5000 nm, and is in a range from about 500 nm to about 2000 nm in other embodiments. In some embodiments, a width of the cylinder wall is in a range from about 100 nm to about 5000 nm in some embodiments, and is in a range from about 500 nm to about 2000 nm in other embodiments.

In some embodiments, as shown in FIGS. 1A, 1B and 2A, one or more vent holes 25 passing through the first membrane 50A, the back plate 50C and the second membrane 50B are provided in the MEMS microphone 1. The vent hole 25 allows air flow from the first membrane side (a front side) to the second membrane side (a back side) to prevent membrane breakage when large air pressure is applied on the microphone 1.

FIGS. 3F and 3G show structures of the vent hole 25. FIG. 3F is a cross sectional view of line X4-X4 of plan view of FIG. 3G. A first cylindrical support 272 is disposed between the first membrane 50A and the base plate 50C, and a second cylindrical support 271 is disposed between the second membrane 50B and the base plate 50C. The first and second cylindrical supports are electrically isolated from the base plate 50C by a first isolation dielectric material 293 and a second isolation dielectric material 295. Through holes 25A, 25B and 25C are disposed in the first membrane 50A, the second membrane 50B and the base plate 50C, respectively. In some embodiments, the through holes, the first and second supports and the first and second isolation dielectric materials are arranged in a concentric manner. In some embodiments, a diameter of the through hole at the first and/or second membrane is in a range from about 100 nm to about 5000 nm, and is in a range from about 500 nm to about 2000 nm in other embodiments. In some embodiments, a width of the cylinder wall is in a range from about 100 nm to about 5000 nm, and is in a range from about 500 nm to about 2000 nm in other embodiments. In some embodiments, a width of the isolation dielectric material is in a range from about 100 nm to about 5000 nm, and is in a range from about 500 nm to about 2000 nm in other embodiments.

Figure 3J:
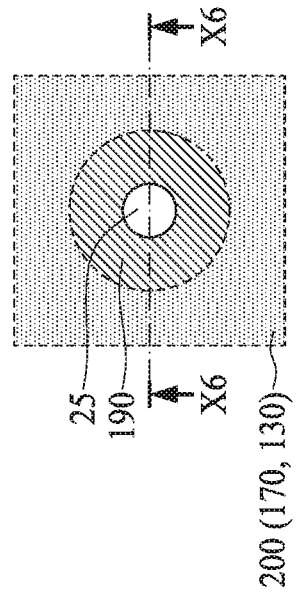
FIG. 3J shows a schematic cross sectional view of a vent hole structure in a MEMS microphone according to another embodiment of the present disclosure.
Figure 3K:
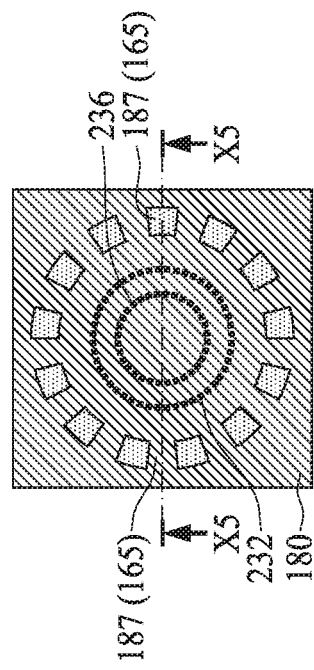
FIG. 3K shows schematic plan view of the vent hole structure in a MEMS microphone according to another embodiment of the present disclosure.
Figure 3H:
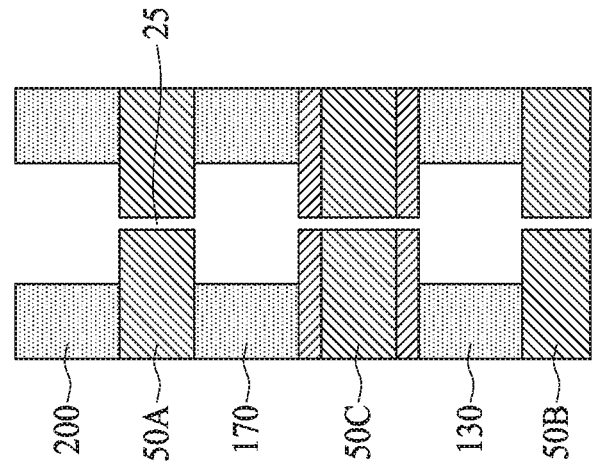
FIG. 3H shows a schematic cross sectional view of a support structure in a MEMS microphone according to another embodiment of the present disclosure.
Figure 3I:
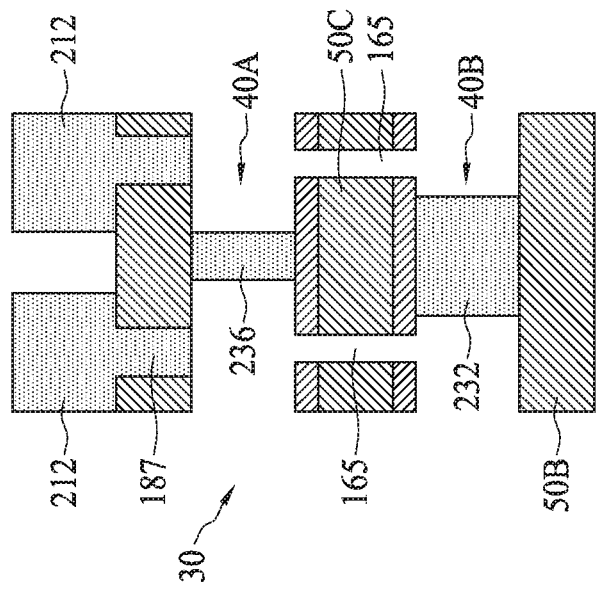
FIG. 3I shows schematic plan view of the support structure in a MEMS microphone according to another embodiment of the present disclosure.

FIG. 3H shows an enlarged cross sectional view of the support structure of FIG. 2C and FIG. 3I is a plan view of the support structure. FIG. 3H corresponds to line X5-X5 of the support structure 30 of FIG. 3I. In some embodiments, the first membrane 50A and the base plate 50C are connected by one or more first supports 236. In some embodiments, the second membrane 50B and the base plate 50C are connected by one or more second supports 232. In some embodiments, the supports 236 and 232 are a pillar or a column made of the same material as the insulating layer 55A and 55B, respectively. Further, as shown in FIG. 3H, the supports are surrounded by spaces of the cavities 40A and 40B, respectively. The via holes connecting the first cavity and the second cavity around the first and second supports are arranged in a concentric matter as shown in FIG. 3I. A plurality of via holes 165 surround the support in plan view. In some embodiments, a diameter of the first and second supports is in a range from about 100 nm to about 5000 nm, and is in a range from about 500 nm to about 2000 nm in other embodiments. In some embodiments, the diameter of the second supports is different form that of the first supports, and in certain embodiments, the diameter of the second supports is greater than that of the first supports. A diameter of via holes 165 is in a range from about 100 nm to about 5000 nm, and is in a range from about 500 nm to about 2000 nm in other embodiments.

FIGS. 3J and 3K show structures of the vent hole 25 of FIG. 2C. FIG. 3J is a cross sectional view of line X6-X6 of the plan view of FIG. 3K. The vent hole 25 is surrounded by the first membrane, the insulating layer 170, the base plate, the insulating layer 130 and the second membrane. In some embodiments, a diameter of the through hole (part of vent hole 25) at the first and/or second membrane is in a range from about 100 nm to about 5000 nm, and is in a range from about 500 nm to about 2000 nm in other embodiments.

FIGS. 4-22B show various stages of manufacturing operations for a MEMS microphone in accordance with an embodiment of the present disclosure. It is understood that additional operations can be provided before, during, and after the processes shown by FIGS. 4-22B, and some of the operations described below can be replaced or eliminated, for additional embodiments of the method. The order of the operations/processes may be interchangeable. Material, configuration, dimensions and/or processes the same as or similar to the foregoing embodiments described with FIGS. 1A-3K may be employed in the following embodiments, and detailed explanation thereof may be omitted.

Figure 4:
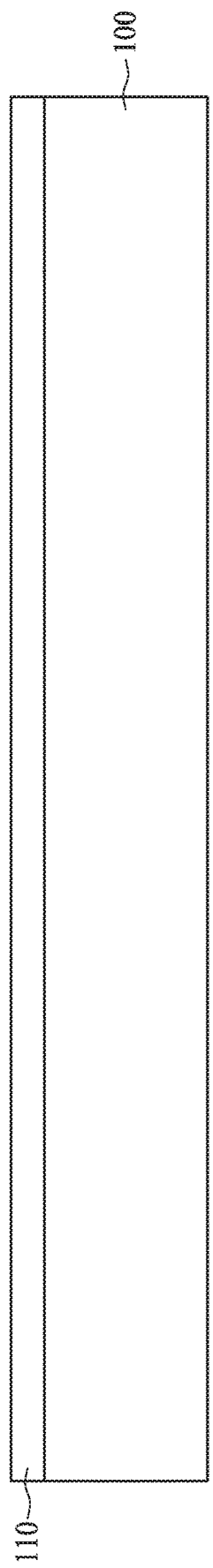
FIG. 4 shows a schematic cross sectional view of one of the various stages of a manufacturing operation for a MEMS microphone according to an embodiment of the present disclosure.

As shown in FIG. 4, a first insulating layer 110 is formed over a substrate 100. The substrate 100 is conductive, and is a Si wafer in some embodiments. In certain embodiments, the substrate 100 is p-type Si, and in other embodiments, the substrate 100 is n-type Si. In other embodiments, the substrate 100 is made of diamond or germanium, Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. A metal plate can be used as the substrate 100.

The first insulting layer 110 includes a silicon oxide based material (e.g., silicon oxide) or a silicon nitride based material (silicon nitride or SiON). In certain embodiments, the first insulating layer 110 is made of silicon oxide. The first insulating layer 110 can be formed by chemical vapor deposition (CVD), physical vapor deposition (PVD) or any other suitable film formation method. When the first insulating layer 110 is made of silicon oxide, the first insulating layer 110 can be formed by thermal oxidation. In some embodiments, the thickness of the first insulating layer 110 is in a range from about 400 nm to about 4000 nm.

Figure 5:
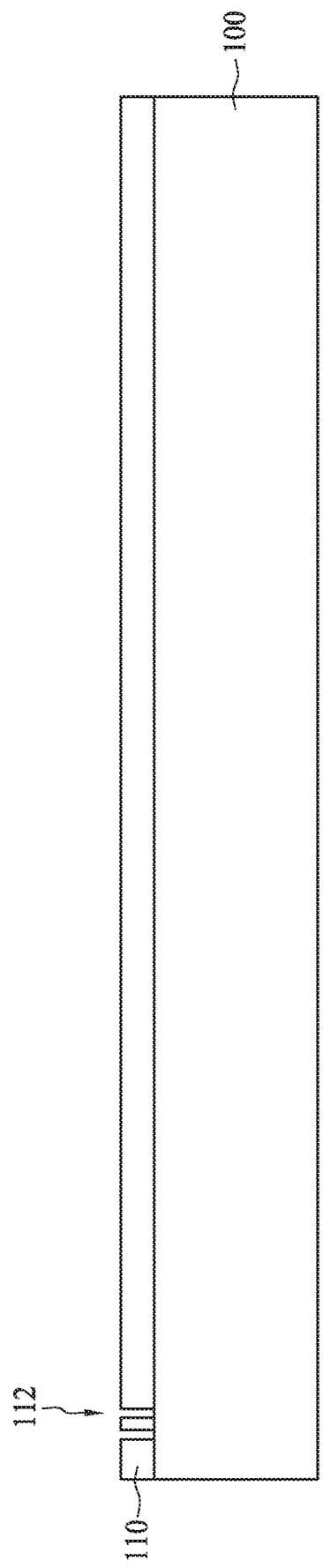
FIG. 5 shows a schematic cross sectional view of one of the various stages of a manufacturing operation for a MEMS microphone according to an embodiment of the present disclosure.

Next, as shown in FIG. 5, a patterning operation including one or more lithography and etching processes is performed to form a pattern 112 in the first insulating layer 110. The pattern 112 is subsequently used as an electrical path for connecting the substrate 100 and the first electrode 10A. In some embodiments, the pattern 112 has a cylindrical shape and in other embodiments, the pattern 112 is a single hole pattern.

Figure 6:
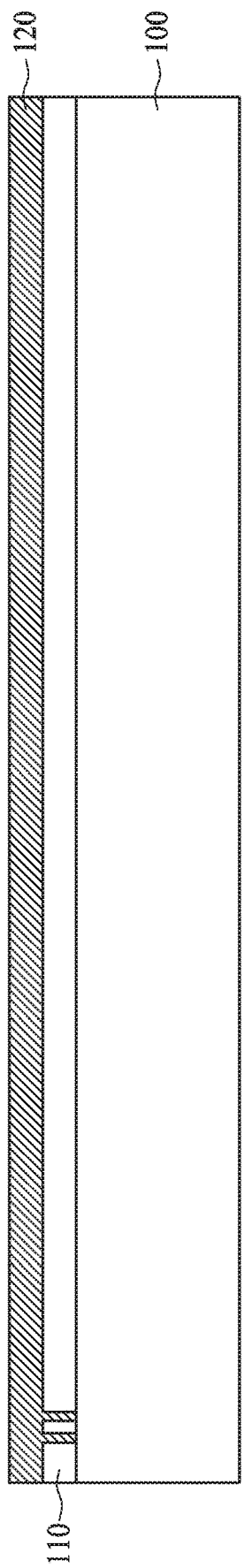
FIG. 6 shows a schematic cross sectional view of one of the various stages of a manufacturing operation for a MEMS microphone according to an embodiment of the present disclosure.

Then, as shown in FIG. 6, a first semiconductor layer 120 is formed over the first insulating layer 110. The first semiconductor layer includes poly silicon, amorphous silicon, polycrystalline diamond, amorphous carbon, or other polycrystalline or amorphous semiconductor material. In certain embodiments, polysilicon doped with impurities such as P, As, and/or B is used. The first semiconductor layer 120 can be formed by CVD, PVD or any other suitable film formation method. In some embodiments, the thickness of the first semiconductor layer 120 is in a range from about 300 nm to about 1500 nm. The first semiconductor layer 120 fills the pattern 112 formed in the first insulating layer 110.

Figure 7:
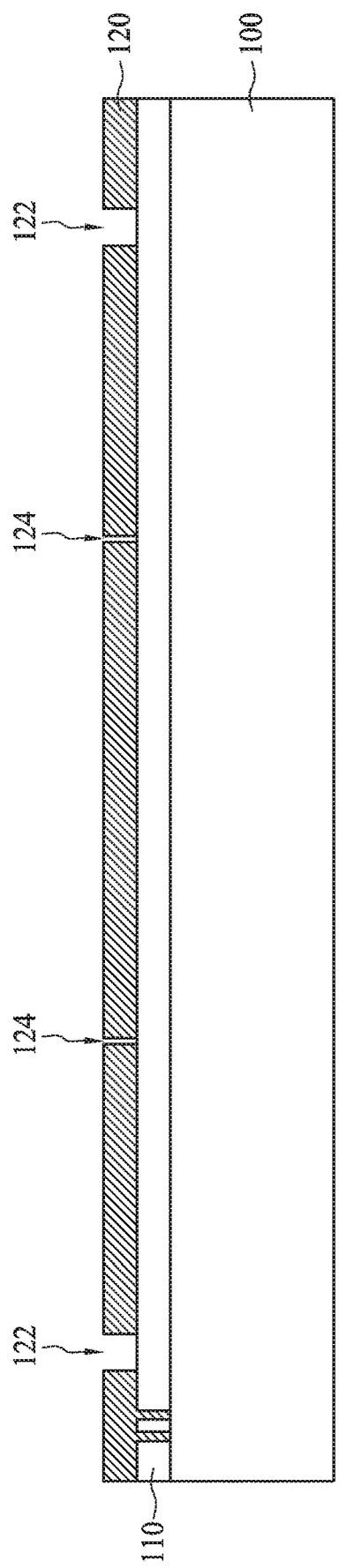
FIG. 7 shows a schematic cross sectional view of one of the various stages of a manufacturing operation for a MEMS microphone according to an embodiment of the present disclosure.

Next, as shown in FIG. 7, a patterning operation including one or more lithography and etching processes is performed to form patterns 122 and 124 in the first semiconductor layer 120. The pattern 122 is a groove for a separation groove 20 and the patterns 124 are hole patterns for vent holes 25.

Figure 8:
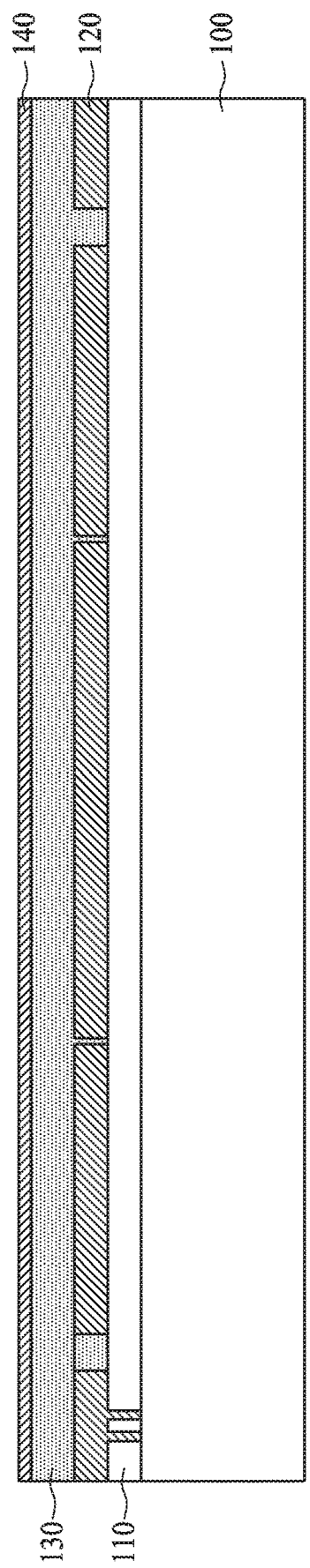
FIG. 8 shows a schematic cross sectional view of one of the various stages of a manufacturing operation for a MEMS microphone according to an embodiment of the present disclosure.

Then, as shown in FIG. 8, a second insulating layer 130 is formed over the first semiconductor layer 120. The second insulting layer 130 includes a silicon oxide based material (e.g., silicon oxide) or a silicon nitride based material (silicon nitride or SiON). In certain embodiments, the second insulating layer 130 is made of silicon oxide. The second insulating layer 130 can be formed by CVD, PVD or any other suitable film formation method. In some embodiments, the thickness of the second insulating layer 130 is in a range from about 1000 nm to about 4000 nm. The second insulating layer 130 fills the patterns 122 and 124 in the first semiconductor layer 120. In some embodiments, after the deposition of the second insulating layer, a planarization operation, such as an etch-back process or a chemical mechanical polishing (CMP) process, is performed to flatten the surface of the second insulating layer 130.

Further, in some embodiments, a first dielectric layer 140 is formed over the second insulating layer 130. In some embodiments, the first dielectric layer 140 is made of a different material than the second insulating layer and includes a silicon oxide based material (e.g., silicon oxide) or a silicon nitride based material (silicon nitride or SiON). In certain embodiments, the first dielectric layer 140 is made of silicon nitride. The first dielectric layer 140 can be formed by CVD, PVD or any other suitable film formation method. In some embodiments, the thickness of the first dielectric layer 140 is in a range from about 100 nm to about 500 nm.

Figure 9:
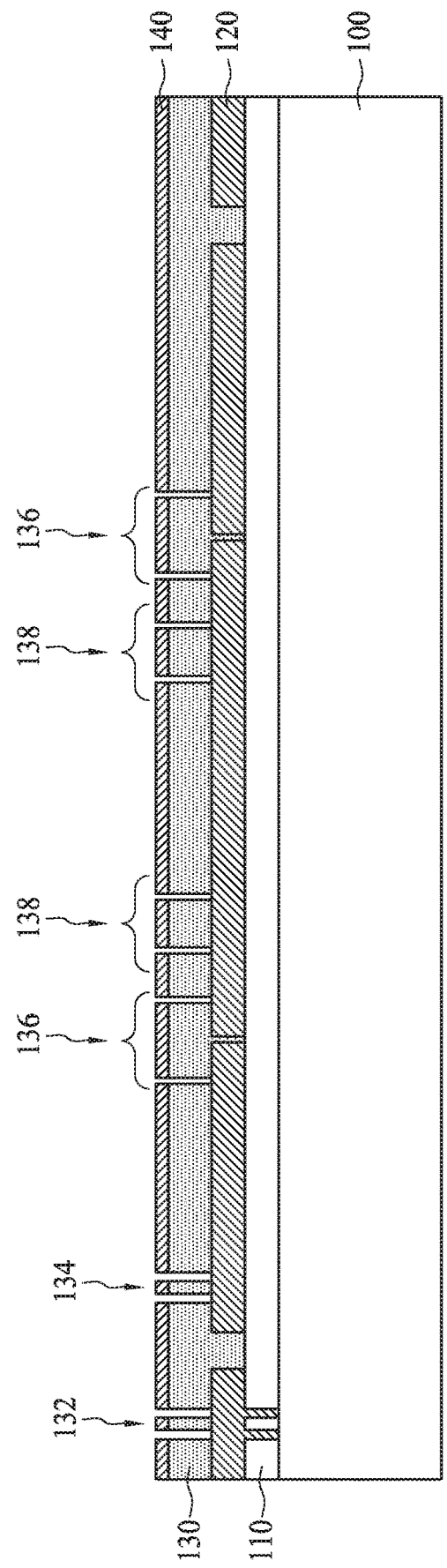
FIG. 9 shows a schematic cross sectional view of one of the various stages of a manufacturing operation for a MEMS microphone according to an embodiment of the present disclosure.

Then, as shown in FIG. 9, one or more via holes 132, 134, 136 and 138 passing through the first dielectric layer 140 and the second insulating layer 130 are formed by a patterning operation including one or more lithography and etching processes. The pattern 132 is subsequently used as the electrical path for connecting the substrate 100 and the first electrode 10A, and the pattern 134 is subsequently used as an electrical path for connecting the second membrane 50B formed by the first semiconductor layer 120 and the second electrode 10B. In some embodiments, the pattern 132 and/or 134 has a cylindrical shape and in other embodiments, the pattern 132 and/or 134 is a single hole pattern. The patterns 136 are for cylindrical patterns 271 of the vent hole 25, and the patterns 138 are for the second supports 281-284 (see, FIG. 19).

Figure 10:
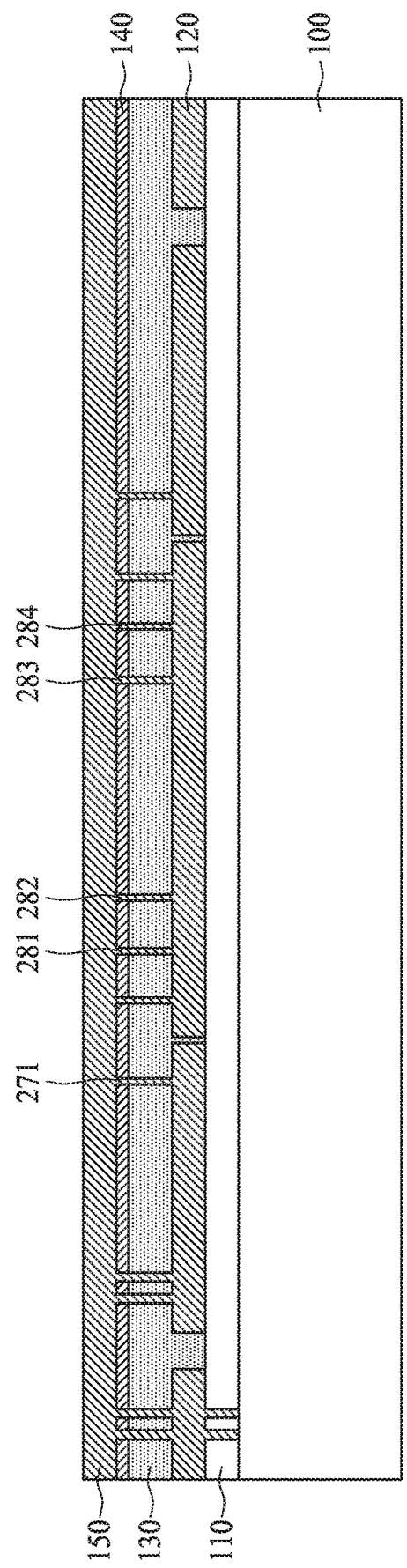
FIG. 10 shows a schematic cross sectional view of one of the various stages of a manufacturing operation for a MEMS microphone according to an embodiment of the present disclosure.

Subsequently, as shown in FIG. 10, a second semiconductor layer 150 is formed over the first dielectric layer 140. The second semiconductor layer includes poly silicon, amorphous silicon, polycrystalline diamond, amorphous carbon, or other polycrystalline or amorphous semiconductor materials. In certain embodiments, polysilicon doped with impurities such as P, As, and/or B is used. The second semiconductor layer 150 can be formed by CVD, PVD or any other suitable film formation method. In some embodiments, the thickness of the second semiconductor layer 150 is in a range from about 300 nm to about 1500 nm. The second semiconductor layer 150 fills the via holes 132, 134, 136 and 138. Thus, the second supports 271, 281, 282, 283 and 284 are formed in the second insulating layer 130.

Figure 11:
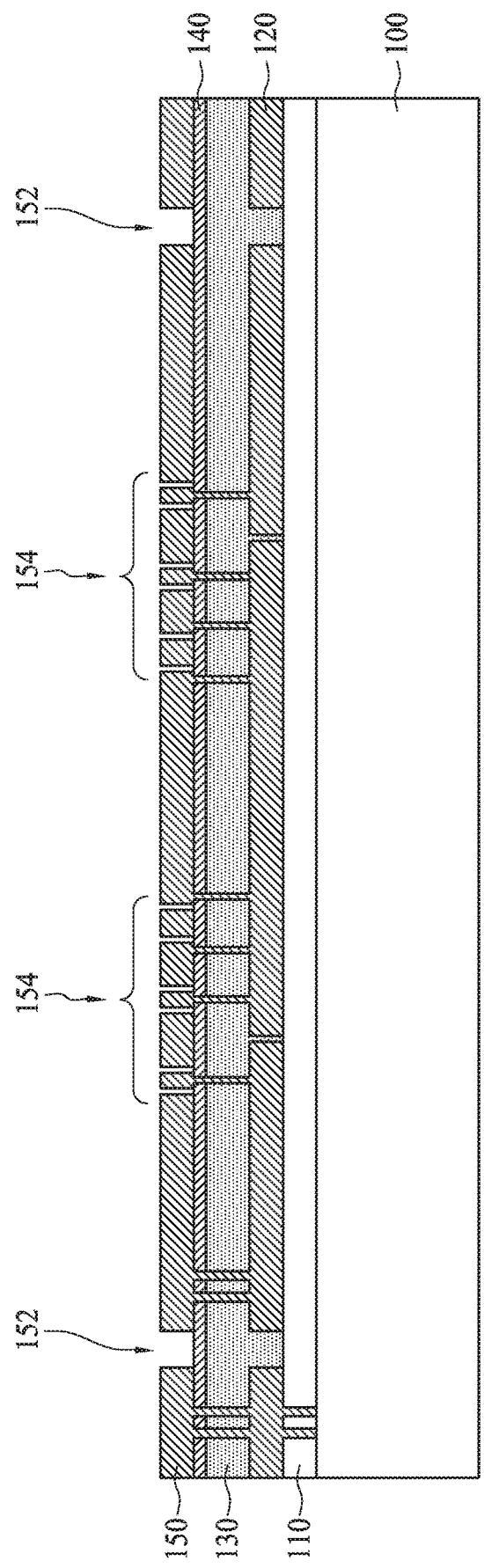
FIG. 11 shows a schematic cross sectional view of one of the various stages of a manufacturing operation for a MEMS microphone according to an embodiment of the present disclosure.

Then, as shown in FIG. 11, one or more openings 152 and 154 passing through the second semiconductor layer 150 are formed by a patterning operation including one or more lithography and etching processes. The opening pattern 152 is for the isolation groove and the opening patterns 154 are for the isolation dielectric materials 291, 293 and 295.

Figure 12:
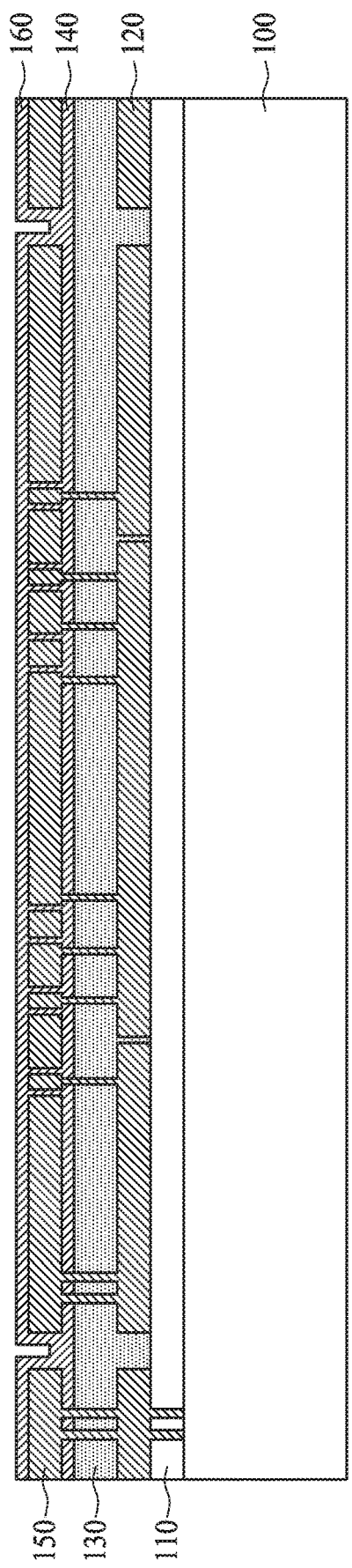
FIG. 12 shows a schematic cross sectional view of one of the various stages of a manufacturing operation for a MEMS microphone according to an embodiment of the present disclosure.

Next, as shown in FIG. 12, a second dielectric layer 160 is formed over the second semiconductor layer 150. In some embodiments, the second dielectric layer 160 is made of a different material than the second insulating layer and includes a silicon oxide based material (e.g., silicon oxide) or a silicon nitride based material (silicon nitride or SiON). In some embodiments, the second dielectric layer 160 is made of the same material as the first dielectric layer. In certain embodiments, the second dielectric layer 160 is made of silicon nitride. The second dielectric layer 160 can be formed by CVD, PVD or any other suitable film formation method. In some embodiments, the thickness of the second dielectric layer 160 is in a range from about 100 nm to about 500 nm. The second dielectric layer fully fills the openings 154 and at least partially fills the opening 152.

Figure 13:
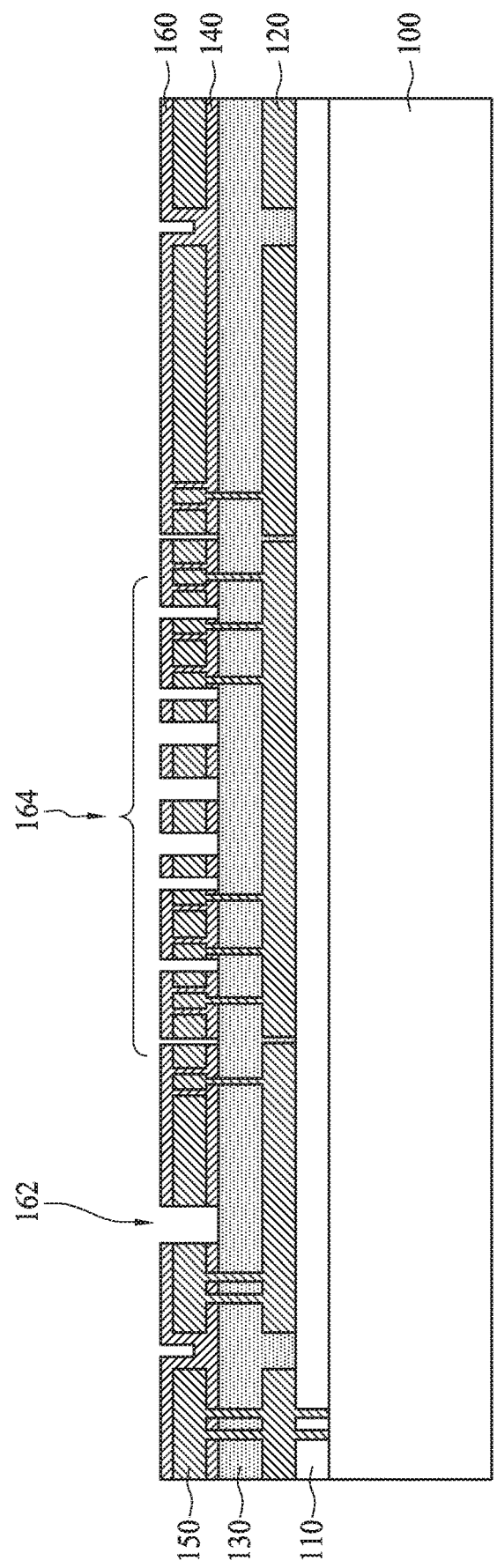
FIG. 13 shows a schematic cross sectional view of one of the various stages of a manufacturing operation for a MEMS microphone according to an embodiment of the present disclosure.

Then, as shown in FIG. 13, one or more openings 162 and 164 passing through the second dielectric layer 160, the second semiconductor layer 150 and the first dielectric layer 140 are formed by a patterning operation including one or more lithography and etching processes. The opening pattern 162 is for the isolation groove and the opening patterns 164 are for the acoustic holes connecting the first and second cavities subsequently formed and for isolating the support structures.

Figure 14:
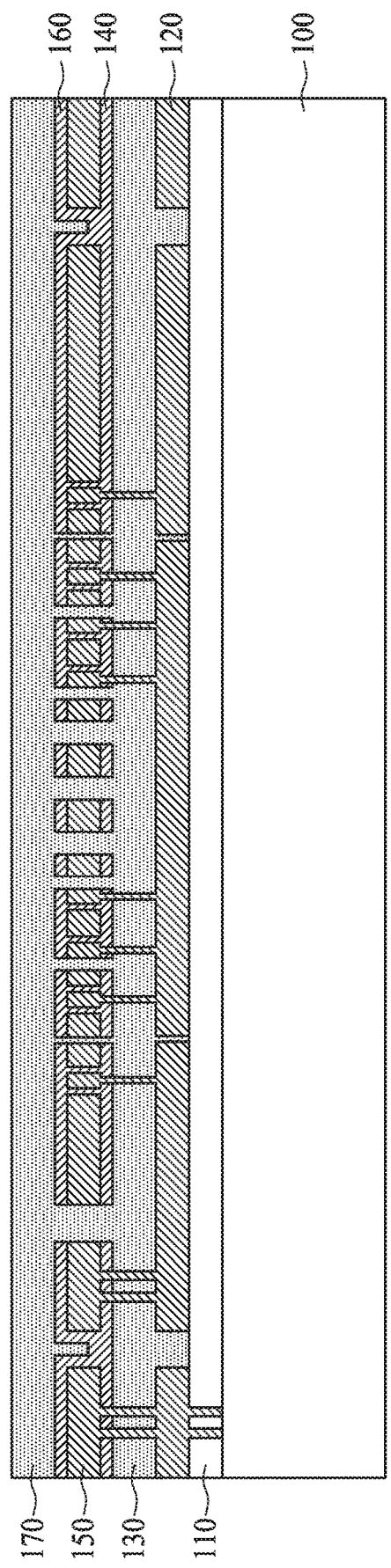
FIG. 14 shows a schematic cross sectional view of one of the various stages of a manufacturing operation for a MEMS microphone according to an embodiment of the present disclosure.

Subsequently, as shown in FIG. 14, a third insulating layer 170 is formed over the second dielectric layer 160. The third insulting layer 170 includes a silicon oxide based material (e.g., silicon oxide) or a silicon nitride based material (silicon nitride or SiON). In certain embodiments, the third insulating layer 170 is made of silicon oxide. The third insulating layer 170 can be formed by CVD, PVD or any other suitable film formation method. In some embodiments, the thickness of the third insulating layer 170 is in a range from about 1000 nm to about 4000 nm. The third insulating layer 170 fills the openings 162 and 164. In some embodiments, after the deposition of the third insulating layer, a planarization operation, such as an etch-back process or a CMP process, is performed to flatten the surface of the third insulating layer 170.

Figure 15:
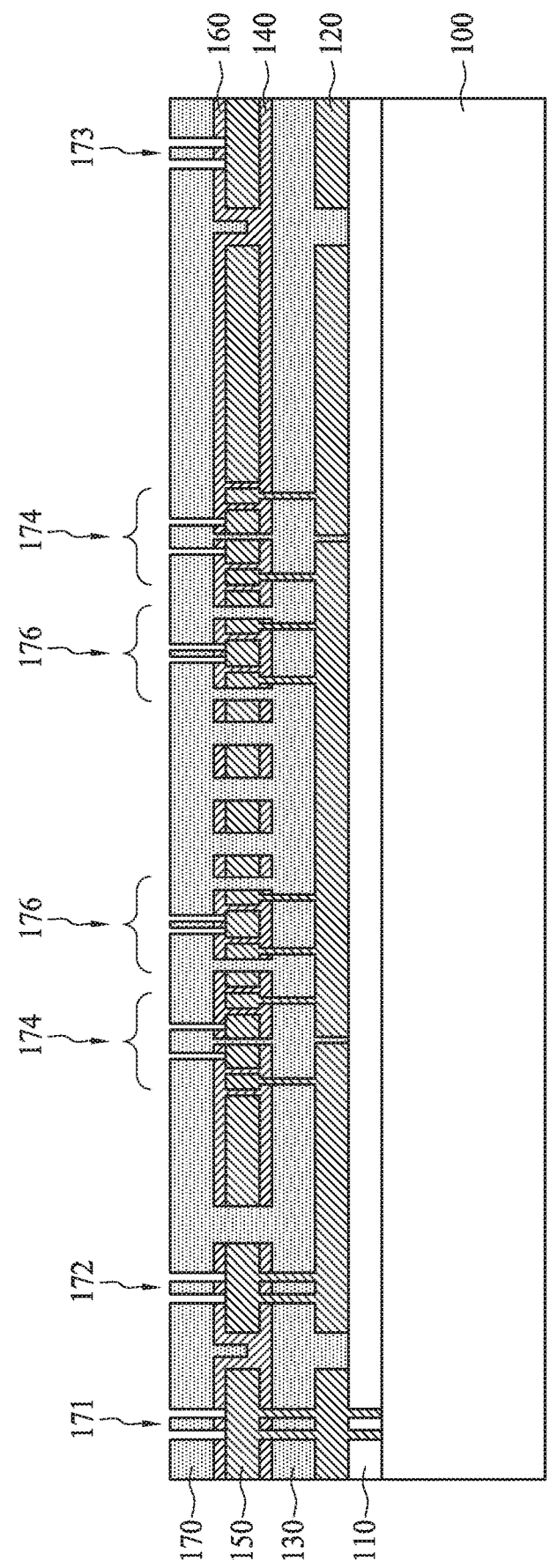
FIG. 15 shows a schematic cross sectional view of one of the various stages of a manufacturing operation for a MEMS microphone according to an embodiment of the present disclosure.

After the third insulating layer 170 is formed, one or more via holes 171, 172, 173, 174 and 176 passing through the third insulating layer 170 and the second dielectric layer 160 are formed by a patterning operation including one or more lithography and etching processes, as shown in FIG. 15.

The pattern 171 is subsequently used as the electrical path for connecting the substrate 100 and the first electrode 10A, the pattern 172 is subsequently used as the electrical path for connecting the second membrane 50B formed by the first semiconductor layer 120 and the second electrode 10B, and the pattern 173 is subsequently used as an electrical path for connecting the base plate 50C formed by the second semiconductor layer 150 and the fourth electrode 10D. In some embodiments, the patterns 171-173 have a cylindrical shape and in other embodiments, the patterns 171-173 are a single hole pattern. The patterns 174 are for the cylindrical support 272 of the vent holes 25, and the patterns 176 are for the first supports 285-288 (see, FIG. 19).

Figure 16:
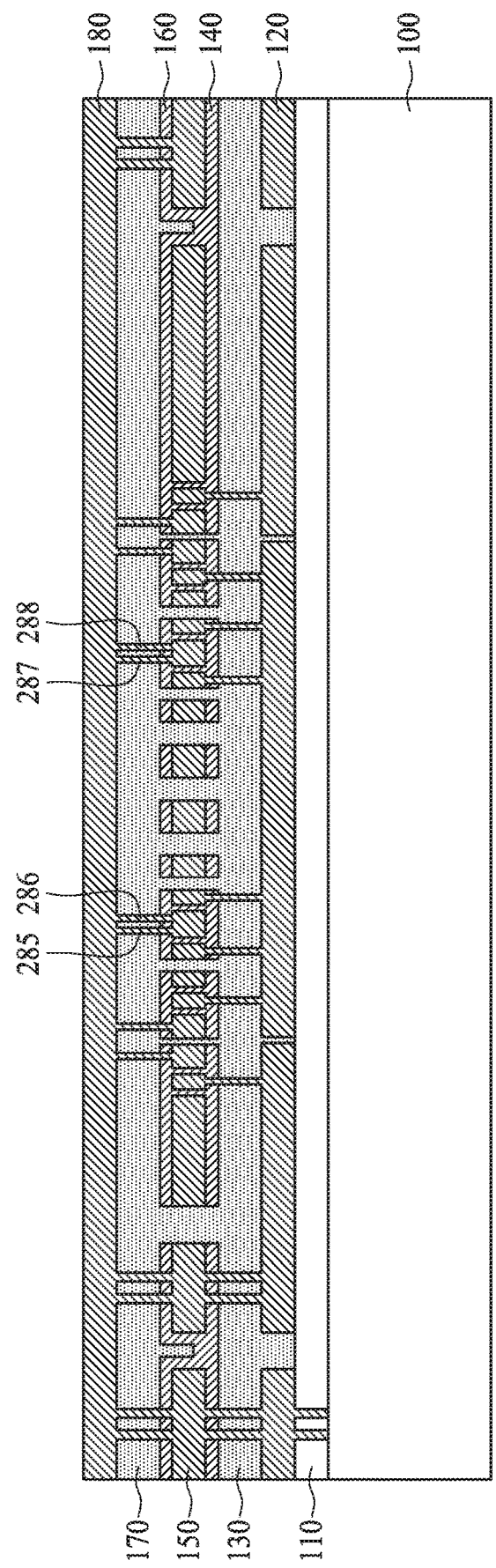
FIG. 16 shows a schematic cross sectional view of one of the various stages of a manufacturing operation for a MEMS microphone according to an embodiment of the present disclosure.

Next, as shown in FIG. 16, a third semiconductor layer 180 is formed over the third insulating layer 170. The third semiconductor layer includes poly silicon, amorphous silicon, polycrystalline diamond, amorphous carbon, or other polycrystalline or amorphous semiconductor material. In certain embodiments, polysilicon doped with impurities such as P, As, and/or B is used. The third semiconductor layer 180 can be formed by CVD, PVD or any other suitable film formation method. In some embodiments, the thickness of the third semiconductor layer 180 is in a range from about 300 nm to about 1500 nm. The third semiconductor layer fills the via holes 171, 172, 173, 174 and 176. Thus, the first supports 285, 286, 287 and 288 (see, FIG. 19) are formed in the third insulating layer 170.

Figure 17:
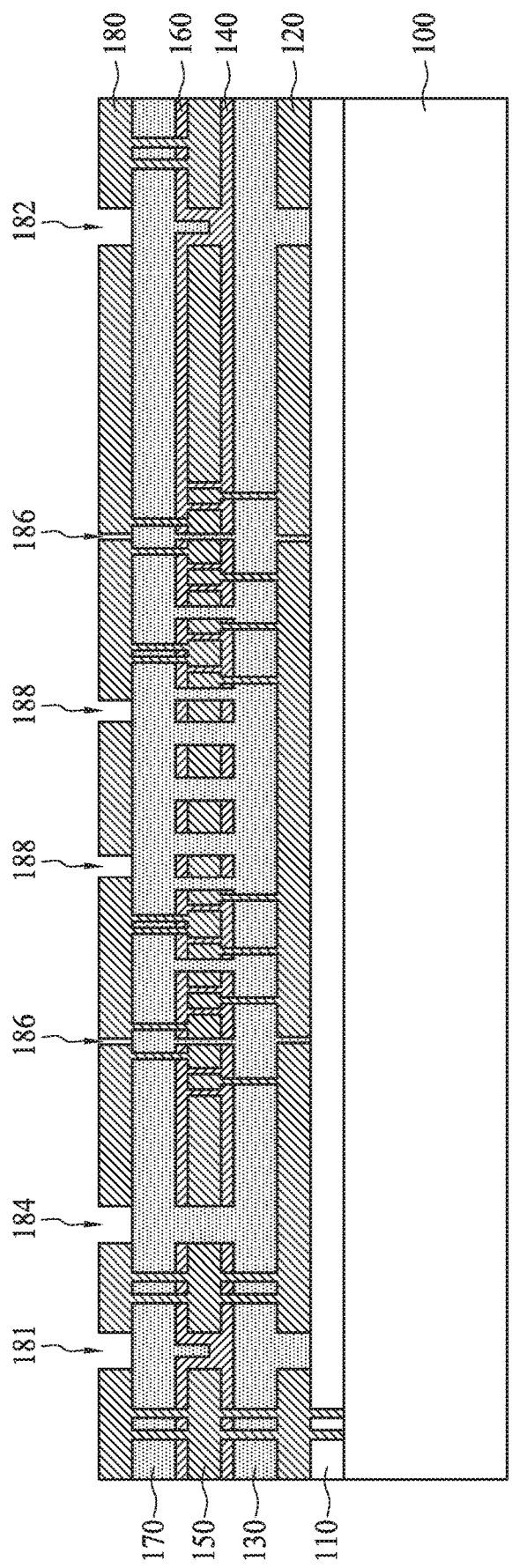
FIG. 17 shows a schematic cross sectional view of one of the various stages of a manufacturing operation for a MEMS microphone according to an embodiment of the present disclosure.

Then, as shown in FIG. 17, one or more openings 181, 182, 184, 186 and 188 passing through the third semiconductor layer 180 are formed by a patterning operation including one or more lithography and etching processes. The opening patterns 181, 182 and 184 are for the isolation groove, the opening patterns 186 are for the vent holes and the opening patterns 188 are for release holes.

Figure 18:
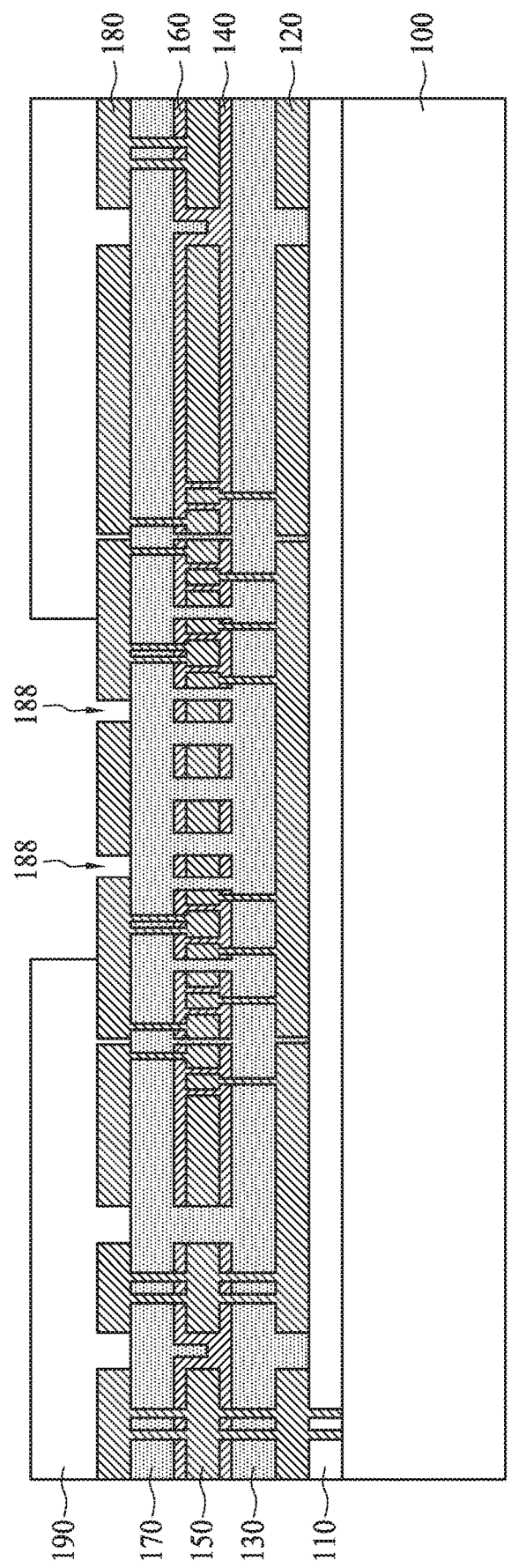
FIG. 18 shows a schematic cross sectional view of one of the various stages of a manufacturing operation for a MEMS microphone according to an embodiment of the present disclosure.

Next, as shown in FIG. 18, a mask pattern 190 is formed over the third semiconductor layer 180. The mask pattern 190 is a photo resist pattern in some embodiments. The opening patterns 188 for the release holes are exposed from the resist pattern 190.

Figure 19:
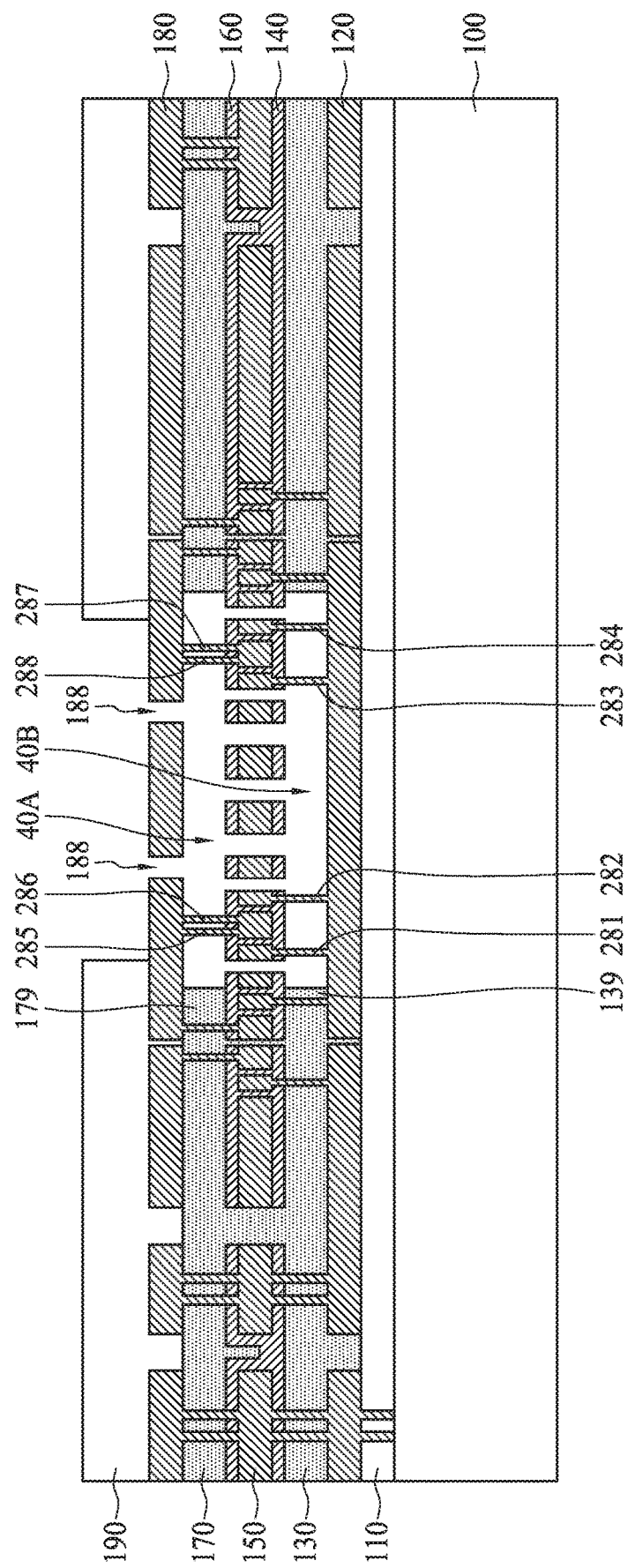
FIG. 19 shows a schematic cross sectional view of one of the various stages of a manufacturing operation for a MEMS microphone according to an embodiment of the present disclosure.

Then, the third insulating layer 170 and the second insulting layer 130 are partially etched to form a first cavity 40A and a second cavity 40B as shown in FIG. 19. In some embodiments, a wet etching operation using buffered HF (BHF) as an etchant is employed. The etchant penetrates through the release holes 188 and dissolves a part of the third insulating layer 170. The etchant further penetrates through the acoustic holes and dissolves a part of the second insulating layer 130. By controlling an etching time, the first cavity 40A and the second cavity 40B with a desired size are obtained. Further, the third insulating layer 170 around the first supports 251, 286, 287, 287 and the second insulating layer 130 around the second supports 281, 282, 283, 284 are also removed, thereby exposing the first and second supports in the first and second cavities, respectively. The first cavity 40A is surrounded by a first wall 179 formed by the third insulating layer 170 and the second cavity 40B is surrounded by a second wall 139 formed by the second insulating layer 130.

Figure 20:
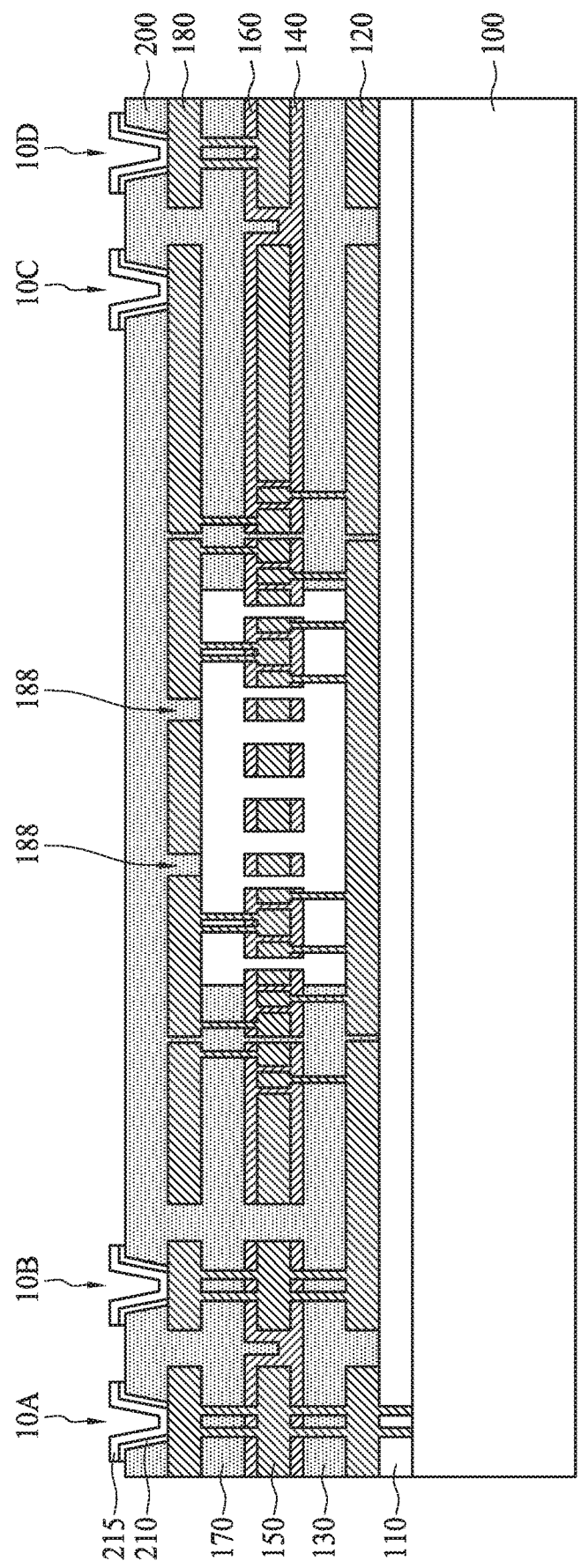
FIG. 20 shows a schematic cross sectional view of one of the various stages of a manufacturing operation for a MEMS microphone according to an embodiment of the present disclosure.

Next, as shown in FIG. 20, a fourth insulating layer 200 is formed over the third semiconductor layer 180. The fourth insulting layer 200 includes a silicon oxide based material (e.g., silicon oxide) or a silicon nitride based material (silicon nitride or SiON). In certain embodiments, the fourth insulating layer 200 is made of silicon oxide. The fourth insulating layer 200 can be formed by CVD, PVD or any other suitable film formation method. In some embodiments, the thickness of the fourth insulating layer 200 is in a range from about 1000 nm to about 4000 nm. The fourth insulating layer 200 fills and seals the release holes 188. In some embodiments, a film deposition method with a low conformal condition is used to seal the release holes 188 substantially without depositing the insulating material inside the cavities. In some embodiments, after the deposition of the fourth insulating layer, a planarization operation, such as an etch-back process or a CMP process, is performed to flatten the surface of the fourth insulating layer 200.

Subsequently, a patterning operation including one or more lithography and etching processes is performed to expose parts of the upper surface of the third semiconductor layer 180 and the electrodes 10A-10D are formed by metal deposition and patterning operations. In some embodiments, each of the electrodes includes one or more layers of conductive material. In certain embodiments, each of the electrodes includes an adhesion or barrier layer 210 and a body metal layer 215. In some embodiments, the adhesion or barrier layer 210 is made of Ti, Ta, TiN or TaN, and the body metal layer 215 is made of Cu, Al, AlCu or any other suitable metal. The conductive layers can be formed by CVD, PVD including sputtering, electroplating or any other suitable film formation method.

Figure 21:
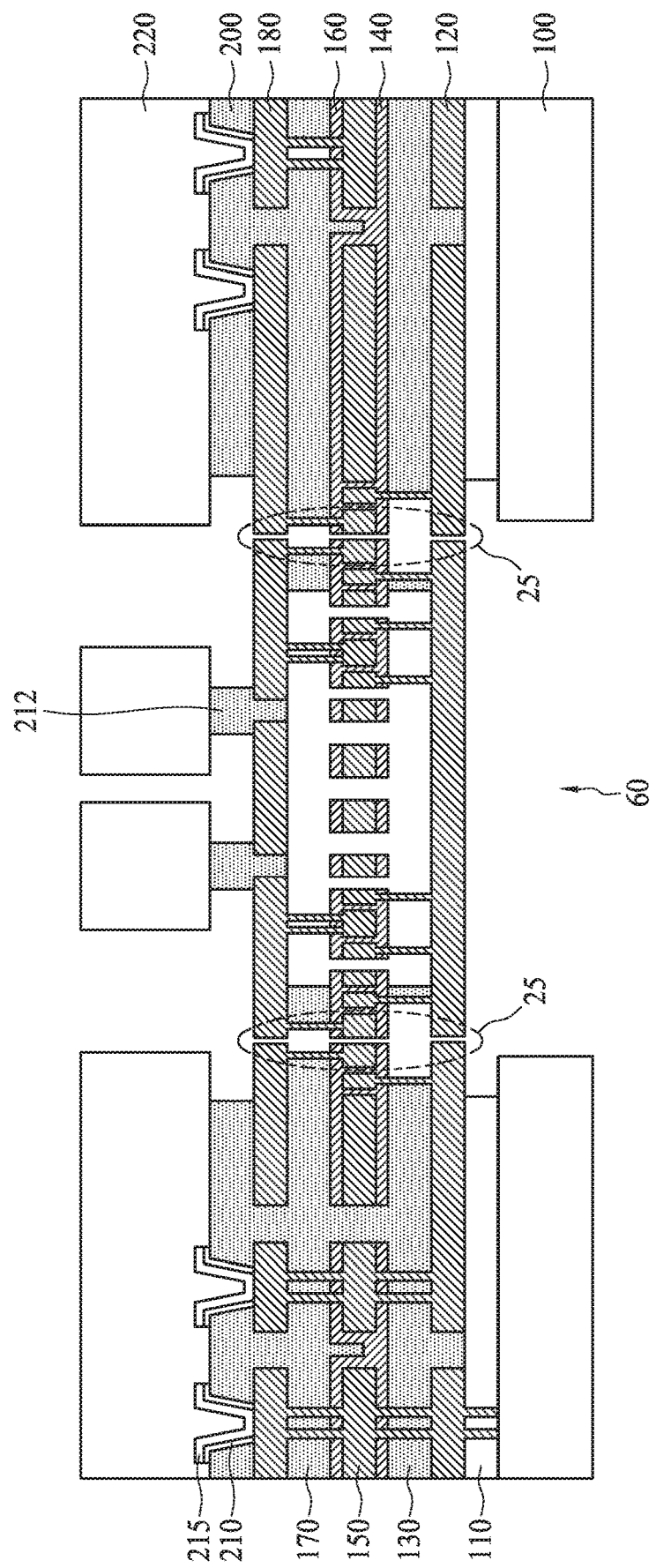
FIG. 21 shows a schematic cross sectional view of one of the various stages of a manufacturing operation for a MEMS microphone according to an embodiment of the present disclosure.

Further, as shown in FIG. 21, the backside of the substrate 100 is ground to reduce the thickness of the substrate 100. A mask layer 220 is formed over the fourth insulating layer 200, and a part of the fourth insulating layer 200 is removed through openings of the mask layer 220. In some embodiments, the mask layer 220 is a photo resist pattern. The fourth insulating layer 200 is removed by using wet etching. The etchant is BHF in some embodiments. By the wet etching, a part of the fourth insulating layer 200 is left as sealing members 212 (e.g., hermetic sealing) that seal the release holes 188, thereby making the cavities airtight. Further, by the wet etching, the third and second insulating layers around the vent holes 25 are removed. Further, the substrate 100 and the first insulating layer 110 are partially etched by one or more lithography and etching operations to form a backside opening 60. The substrate 100 may be etched after the mask layer 220 is formed and before the wet etching using BHF is performed in some embodiments. Thus, the vent holes 25 pass through the MEMS microphone structure from the front surface (the first membrane 50A formed by the third semiconductor layer 180) to the back surface (the second membrane 50B formed by the first semiconductor layer 120). The sealing member 212 (hermetic sealing) can reduce air-dumping in the first and second cavities and also prevent dirt, dust and/or moisture from entering the cavities, thereby improving microphone performances.

Figure 22A:
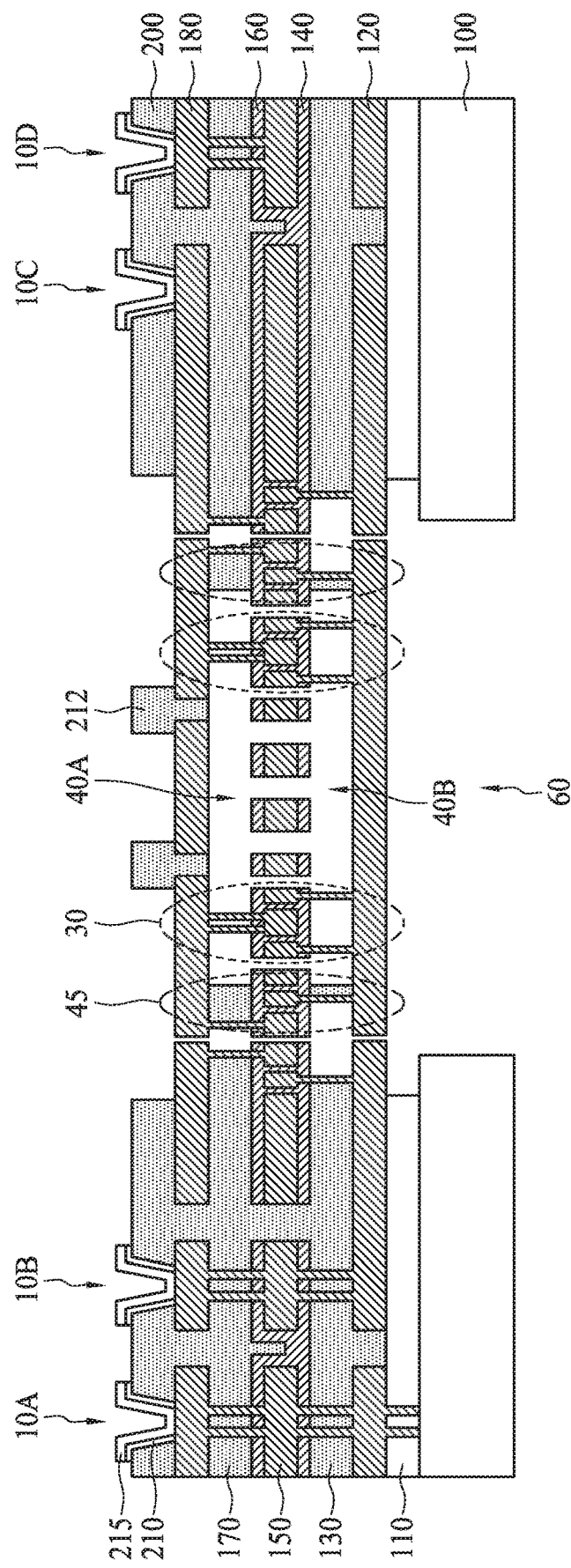
FIGS. 22A and 22B show schematic cross sectional views of one of the various stages of a manufacturing operation for a MEMS microphone according to an embodiment of the present disclosure.
Figure 22B:
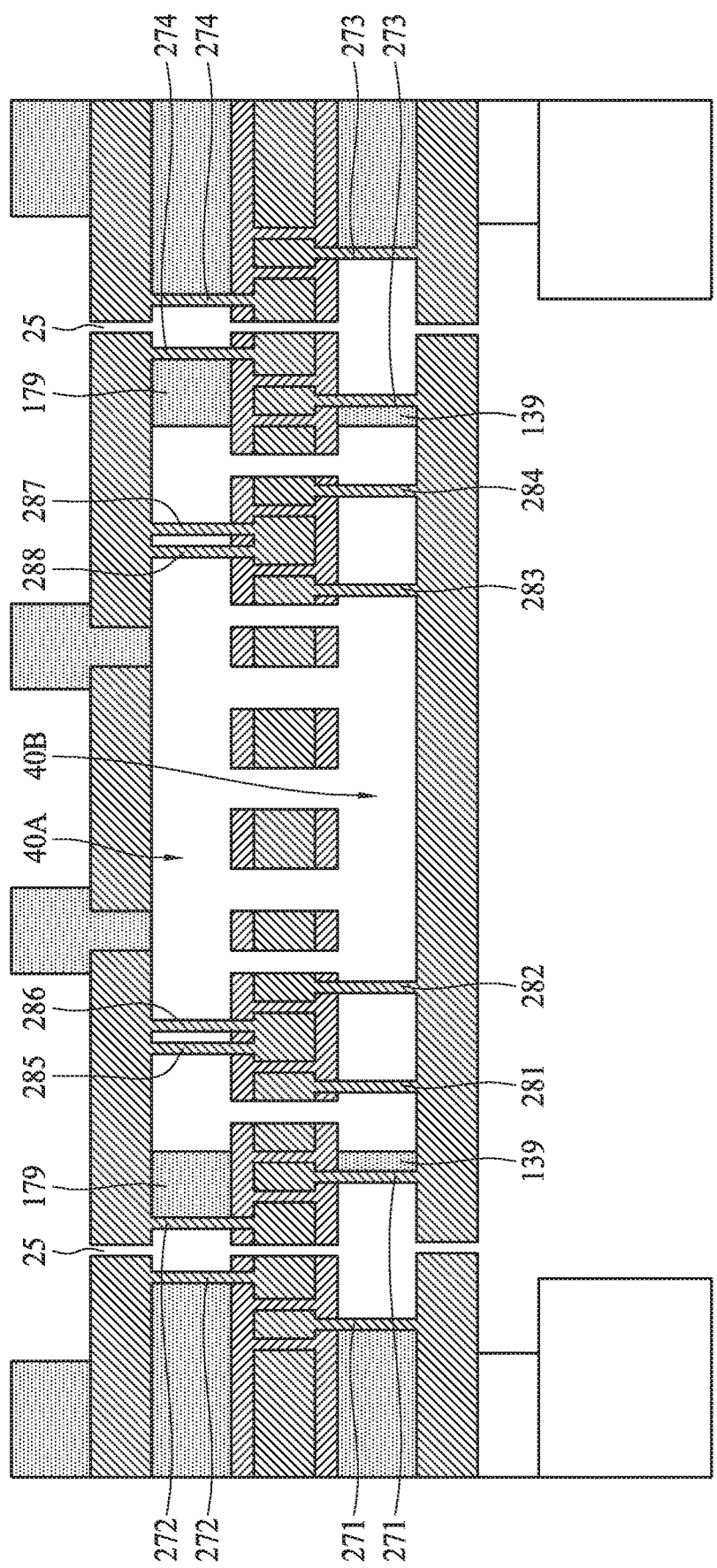

Then, after the mask pattern 220 is removed, a MEMS microphone is obtained, as shown in FIGS. 22A and 22B. FIG. 22B is an enlarged view around the cavities 40A and 40B of FIG. 22A.

FIGS. 23-26 show various stages of manufacturing operations for a MEMS microphone in accordance with another embodiment of the present disclosure. It is understood that additional operations can be provided before, during, and after the processes shown by FIGS. 23-26, and some of the operations described below can be replaced or eliminated, for additional embodiments of the method. The order of the operations/processes may be interchangeable. Material, configuration, dimensions and/or processes the same as or similar to the foregoing embodiments described with FIGS. 1A-22B may be employed in the following embodiments, and detailed explanation thereof may be omitted.

Figure 23:
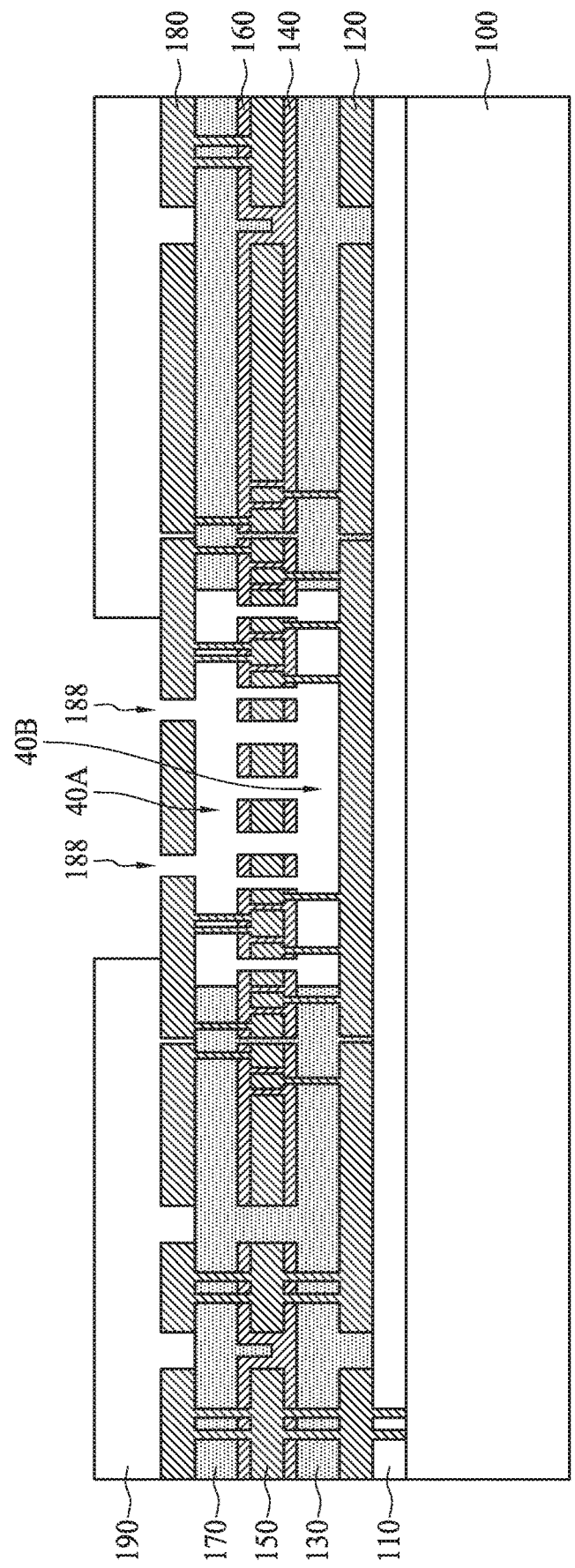
FIG. 23 shows a schematic cross sectional view of one of the various stages of a manufacturing operation for a MEMS microphone according to another embodiment of the present disclosure.
Figure 24:
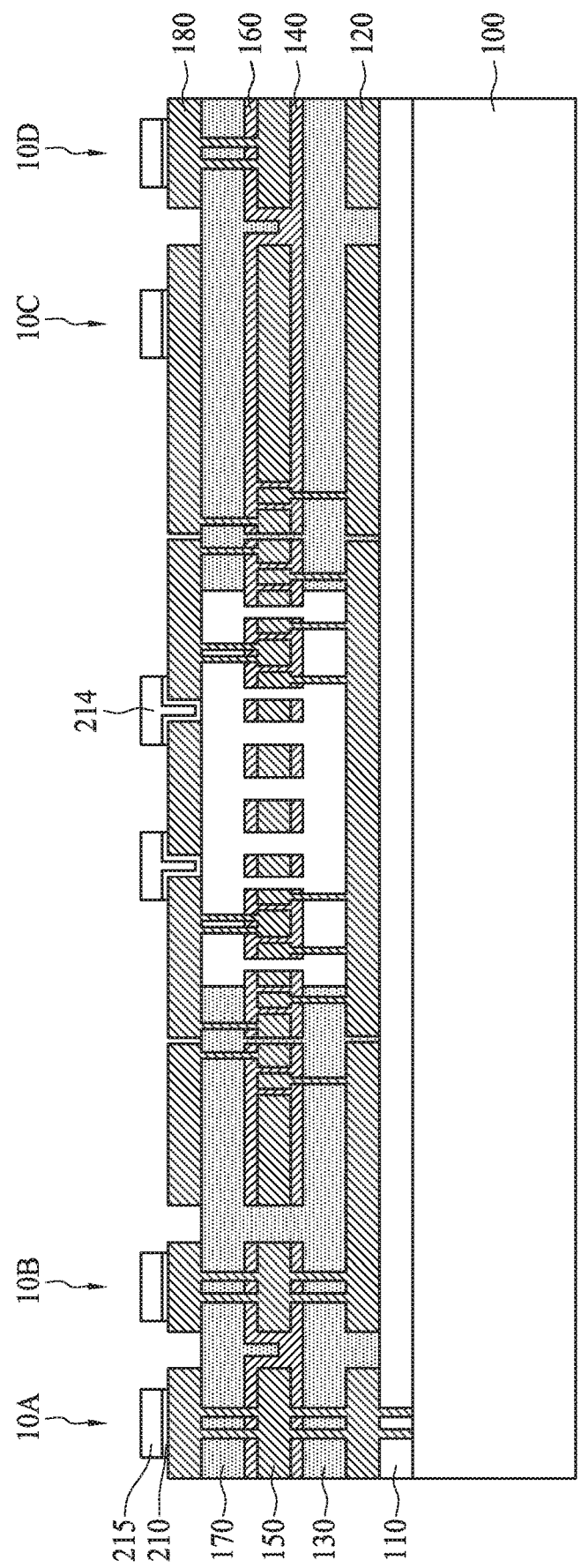
FIG. 24 shows a schematic cross sectional view of one of the various stages of a manufacturing operation for a MEMS microphone according to another embodiment of the present disclosure.

In this embodiment, the release holes are sealed by one or more conductive materials used for the electrodes 10A-10D. FIG. 23 is identical to FIG. 19. After the cavities are formed and the mask pattern 190 is removed, one or more conductive layers are formed over the third semiconductor layer 180 and a patterning operation including one or more lithography and etching processes is performed to form the electrodes 10A-10D and sealing members 214, as shown in FIG. 24. In certain embodiments, each of the electrodes and the sealing members includes an adhesion or barrier layer 210 and a body metal layer 215. In some embodiments, the adhesion or barrier layer 210 is made of Ti, Ta, TiN or TaN, and the body metal layer 215 is made of Cu, Al, AlCu or any other suitable metal. The conductive layers can be formed by CVD, PVD including sputtering, electroplating or any other suitable film formation method. In some embodiments, a film deposition method with a low conformal condition is used to seal the release holes 188 substantially without depositing the conductive material inside the cavities. The sealing member 214 (hermetic sealing) can reduce air-dumping in the first and second cavities and also prevent dirt, dust and/or moisture from entering the cavities, thereby improving microphone performances.

Figure 25:
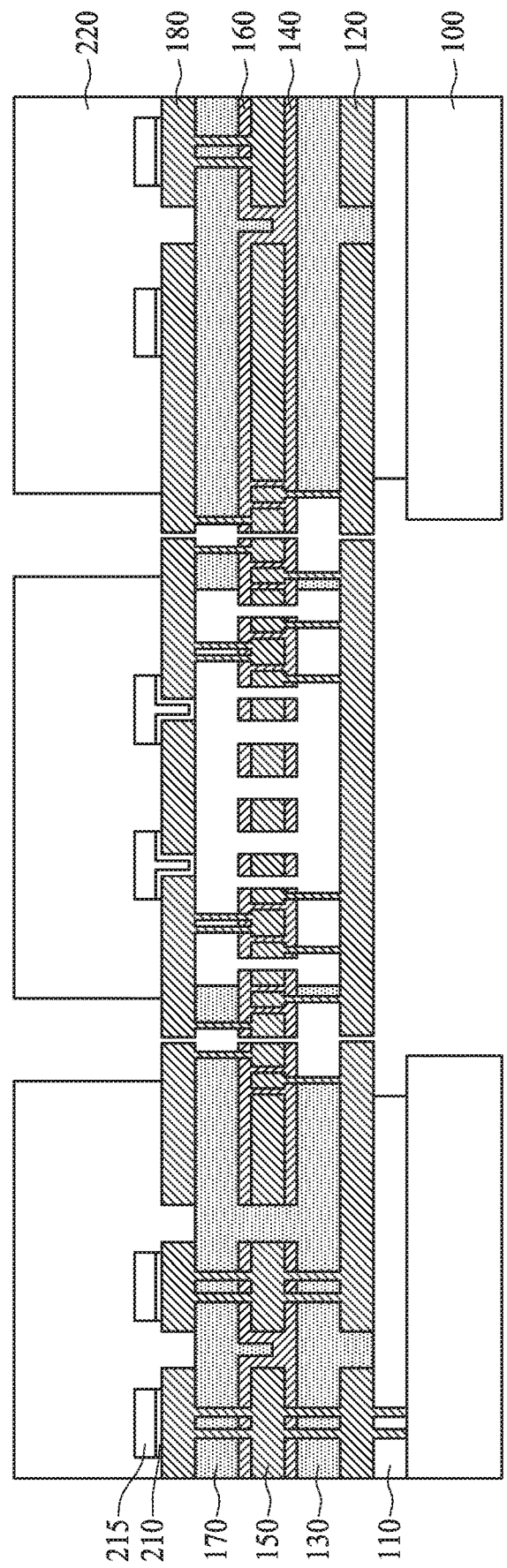
FIG. 25 shows a schematic cross sectional view of one of the various stages of a manufacturing operation for a MEMS microphone according to another embodiment of the present disclosure.
Figure 26:
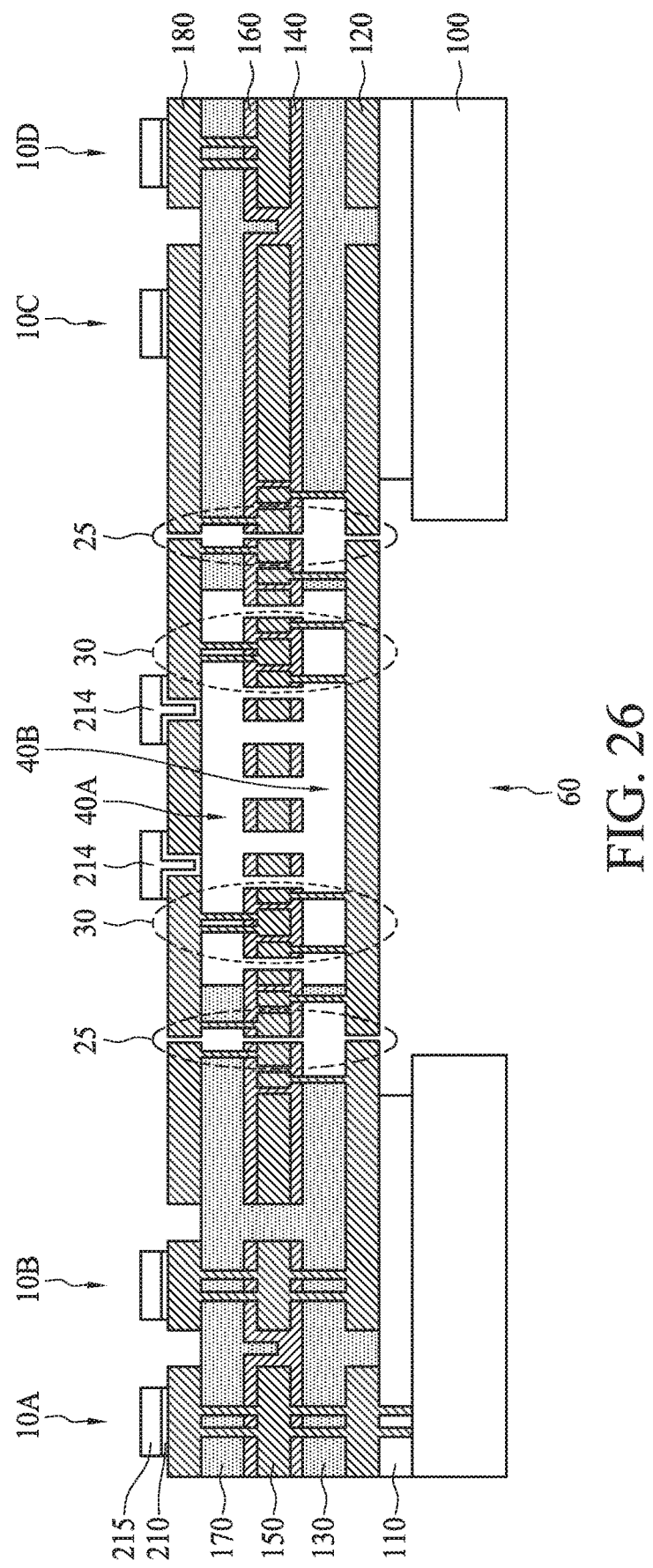
FIG. 26 shows a schematic cross sectional view of one of the various stages of a manufacturing operation for a MEMS microphone according to another embodiment of the present disclosure.

Then, similar to FIG. 21, a mask layer 220 is formed over the third semiconductor layer 180, the electrodes and the sealing members. In some embodiments, the mask layer 220 is a photo resist pattern, as shown in FIG. 25. By wet etching using BHF, the third and second insulating layers 170, 130 around the vent holes 25 are removed. Further, the substrate 100 and the first insulating layer 110 are partially etched to form a backside opening 60. The substrate 100 may be etched after the mask layer 220 is formed and before the wet etching using BHF is performed in some embodiments. Thus, the vent holes 25 pass through the MEMS microphone structure from the front surface to the back surface. Then, after the mask pattern 220 is removed, a MEMS microphone is obtained, as shown in FIG. 26.

FIGS. 27-40B show various stages of manufacturing operations for a MEMS microphone in accordance with another embodiment of the present disclosure. It is understood that additional operations can be provided before, during, and after the processes shown by FIGS. 27-40B, and some of the operations described below can be replaced or eliminated, for additional embodiments of the method. The order of the operations/processes may be interchangeable. Material, configuration, dimensions and/or processes the same as or similar to the foregoing embodiments described with FIGS. 1A-26 may be employed in the following embodiments, and detailed explanation thereof may be omitted.

In this embodiment, the release holes are sealed by an insulating material, and the first and second membranes, as back plates, are covered by dielectric material layers.

Figure 27:
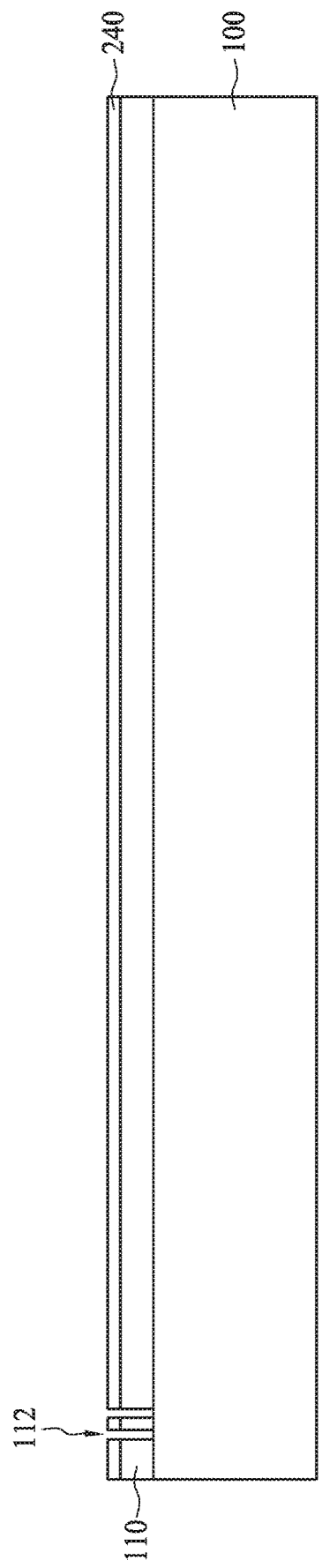
FIG. 27 shows a schematic cross sectional view of one of the various stages of a manufacturing operation for a MEMS microphone according to another embodiment of the present disclosure.

Similar to FIGS. 4 and 5, a first insulating layer 110 is formed over a substrate 100, as shown in FIG. 27. Further, a first dielectric layer 240 is formed over the first insulating layer 110. In some embodiments, the first insulating layer 110 is made of silicon oxide, and the first dielectric layer 240 is made of silicon nitride. In some embodiments, the thickness of the first insulating layer 110 is in a range from about 400 nm to about 4000 nm, and the thickness of the first dielectric layer 140 is in a range from about 100 nm to about 500 nm. Then, a patterning operation including one or more lithography and etching processes is performed to form a pattern 112 in the first dielectric layer 240 and the first insulating layer 110. The pattern 112 is subsequently used as an electrical path for connecting the substrate 100 and the first electrode 10A.

Figure 28:
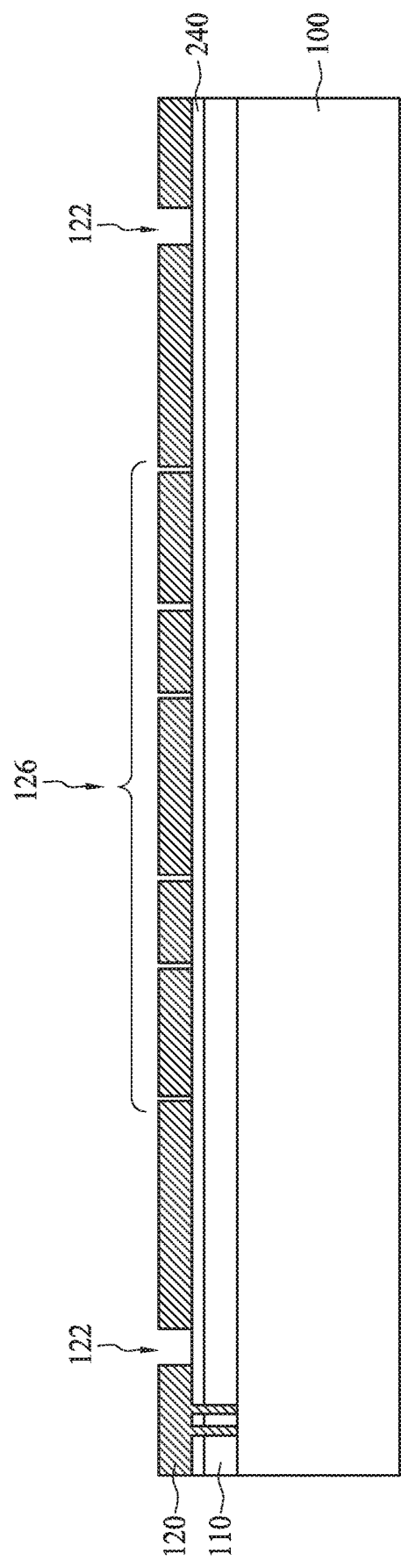
FIG. 28 shows a schematic cross sectional view of one of the various stages of a manufacturing operation for a MEMS microphone according to another embodiment of the present disclosure.

Then, similar to FIG. 6, a first semiconductor layer 120 is formed over the first dielectric layer 240, as shown in FIG. 28. In some embodiments, polysilicon doped with impurities such as P, As, and/or B is used as the first semiconductor layer. In some embodiments, the thickness of the first semiconductor layer 120 is in a range from about 300 nm to about 1500 nm. In the embodiment represented in FIG. 28, the first semiconductor layer 120 fills the pattern 112 formed in the first dielectric layer 240 and the first insulating layer 110. Next, similar to FIG. 7, a patterning operation including one or more lithography and etching processes is performed to form patterns 122 and 126 in the first semiconductor layer 120, as shown in FIG. 28. The pattern 122 is a groove for a separation groove 20 and the patterns 126 are for isolation dielectric materials.

Figure 29:
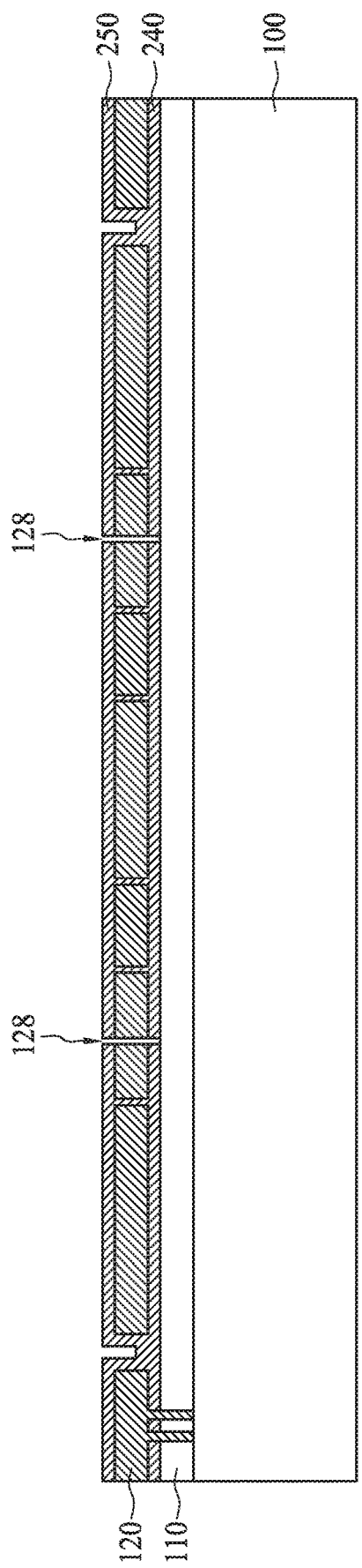
FIG. 29 shows a schematic cross sectional view of one of the various stages of a manufacturing operation for a MEMS microphone according to another embodiment of the present disclosure.

Next, as shown in FIG. 29, a second dielectric layer 250 is formed over the first semiconductor layer 120. The second dielectric layer fully fills the patterns 126 and at least partially fills the patterns 122. Further, as shown in FIG. 29, one or more via holes 128 passing through the second dielectric layer 250, the first semiconductor layer 120 and the first dielectric layer 240 are formed. The via holes 128 are for vent holes 25.

Figure 30:
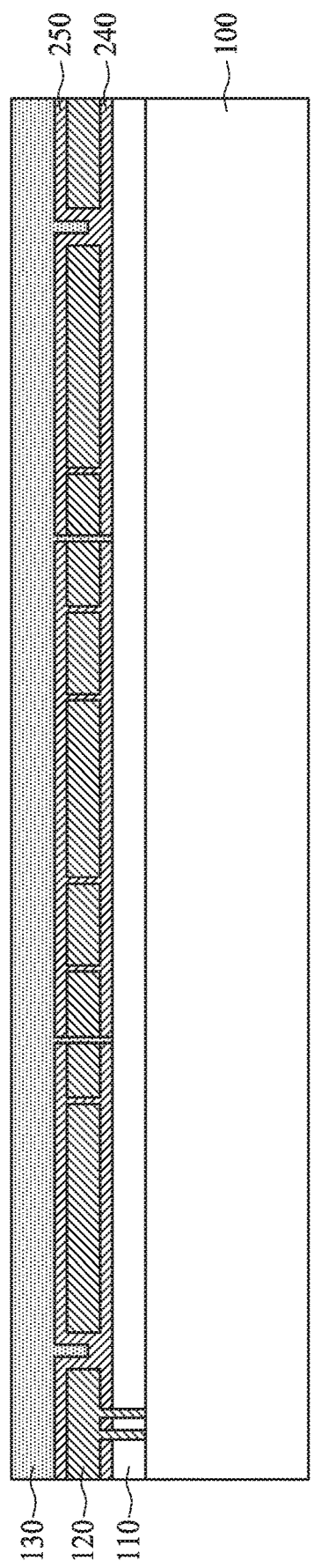
FIG. 30 shows a schematic cross sectional view of one of the various stages of a manufacturing operation for a MEMS microphone according to another embodiment of the present disclosure.

Then, similar to FIG. 8, a second insulating layer 130 is formed over the second dielectric layer 250, as shown in FIG. 30. In some embodiments, the second insulating layer 130 is made of silicon oxide, and has a thickness in a range from about 1000 nm to about 4000 nm. The second insulating layer 130 fills the vial holes 128.

Figure 31:
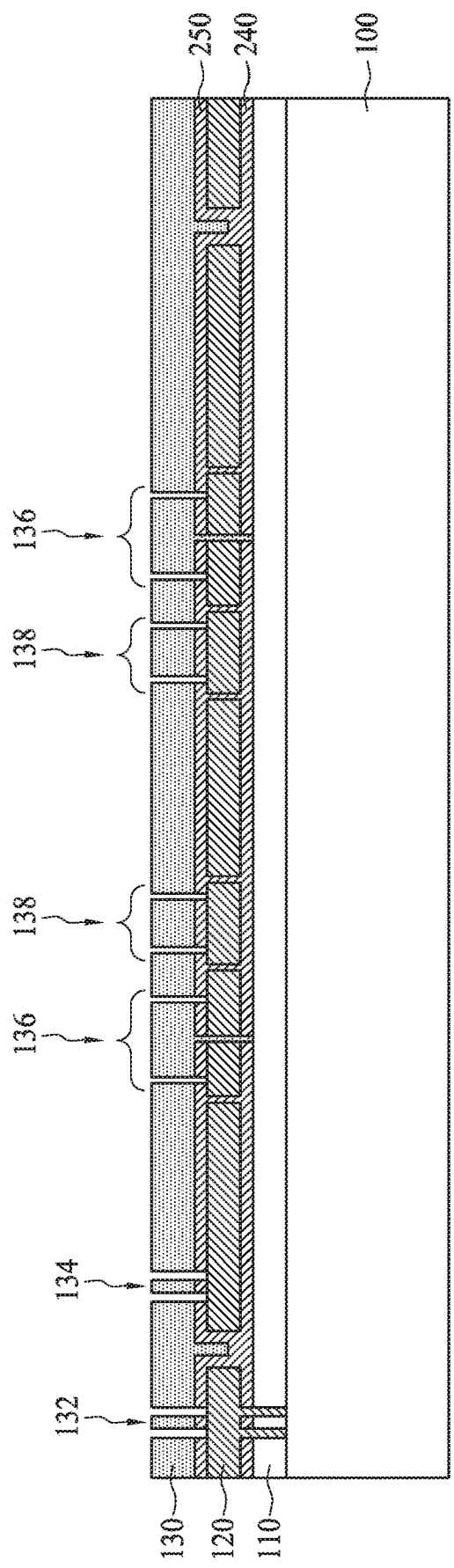
FIG. 31 shows a schematic cross sectional view of one of the various stages of a manufacturing operation for a MEMS microphone according to another embodiment of the present disclosure.

Next, similar to FIG. 9, one or more via holes 132, 134, 136 and 138 passing through the second insulating layer 130 and the second dielectric layer 250 are formed by a patterning operation including one or more lithography and etching processes, as shown in FIG. 31. The pattern 132 is subsequently used as the electrical path for connecting the substrate 100 and the first electrode 10A, and the pattern 134 is subsequently used as an electrical path for connecting the second membrane 50B formed by the first semiconductor layer 120 and the second electrode 10B. In some embodiments, the pattern 132 and/or 134 has a cylindrical shape and in other embodiments, the pattern 132 and/or 134 is a single hole pattern. The patterns 136 are for cylindrical patterns 271 of the vent hole 25, and the patterns 138 are for the second supports 281 and 282.

Figure 32:
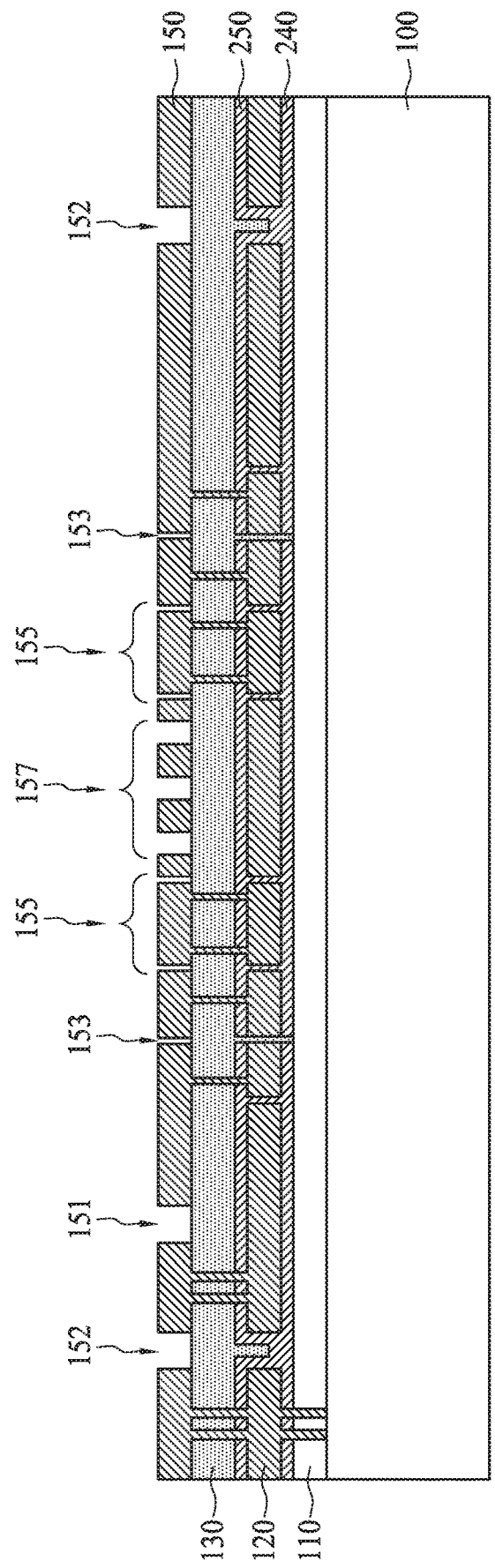
FIG. 32 shows a schematic cross sectional view of one of the various stages of a manufacturing operation for a MEMS microphone according to another embodiment of the present disclosure.

Further, similar to FIG. 10, a second semiconductor layer 150 is formed over the second insulating layer 130, as shown in FIG. 32. In some embodiments, polysilicon doped with impurities such as P, As, and/or B is used as the second semiconductor layer 150. In some embodiments, the thickness of the second semiconductor layer 150 is in a range from about 300 nm to about 1500 nm. The second semiconductor layer fills the via holes 132, 134, 136 and 138. Thus, the second supports 281 and 282 are formed in the second insulating layer 130. Then, similar to FIG. 11, one or more openings 151, 152, 153, 155 and 157 passing through the second semiconductor layer 150 are formed by a patterning operation including one or more lithography and etching processes, as shown in FIG. 32. The opening patterns 151 and 152 are for the isolation grooves, the opening patterns 153 are for the vent holes, the opening patterns 157 are for support structures and the opening patterns 157 are acoustic holes.

Figure 33:
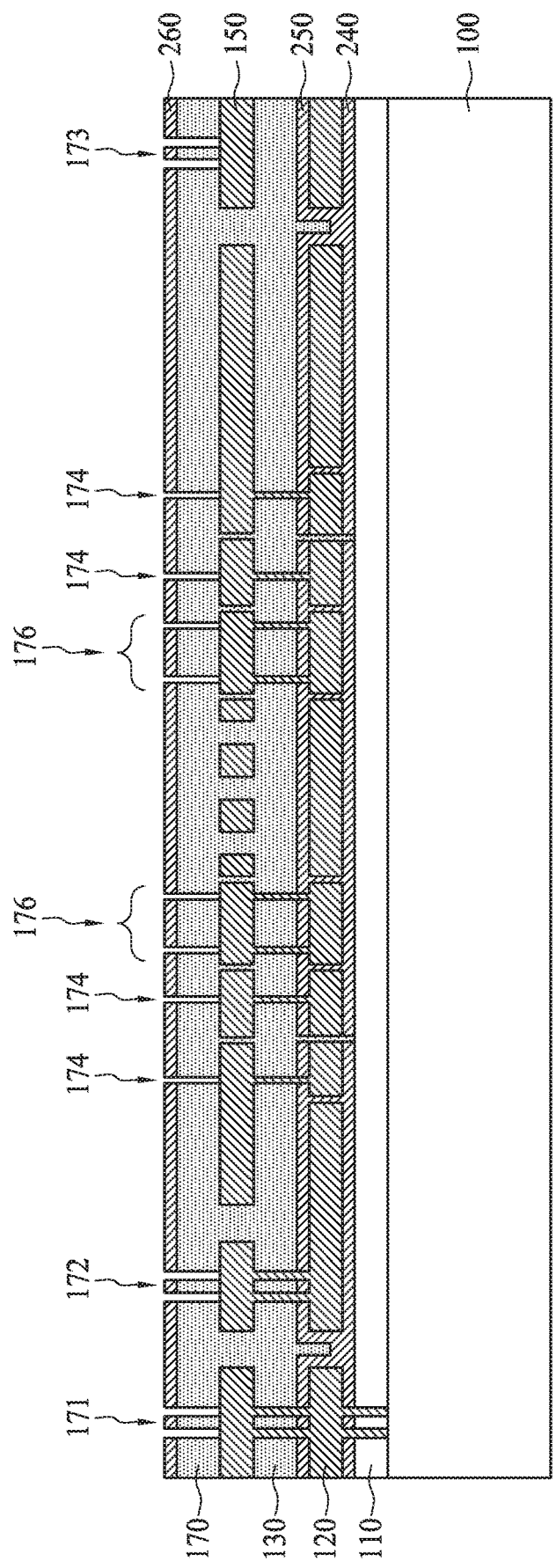
FIG. 33 shows a schematic cross sectional view of one of the various stages of a manufacturing operation for a MEMS microphone according to another embodiment of the present disclosure.

Then, similar to FIG. 14, a third insulating layer 170 is formed over the second semiconductor layer 150 and a third dielectric layer 260 is formed over the third insulating layer 170, as shown in FIG. 33. In some embodiments, the third insulating layer 170 is made of silicon oxide, and has a thickness in a range from about 1000 nm to about 4000 nm. The third insulating layer 170 fills the openings 151, 152, 153, 155 and 157. In some embodiments, the third dielectric layer 260 is made of silicon nitride, and has a thickness in a range from about 100 nm to about 500 nm. Then, one or more via holes 171, 172, 173, 174 and 176 and passing through the third dielectric layer 260 and the third insulating layer 170 are formed by a patterning operation including one or more lithography and etching processes, as shown in FIG. 33. The patterns 171, 172 and 173 are for electrical paths from the first, second and fourth electrodes to the substrate, the second membrane and the base plate, respectively. The patterns 174 are for the vent holes and the patterns 176 are for the support structure.

Figure 34:
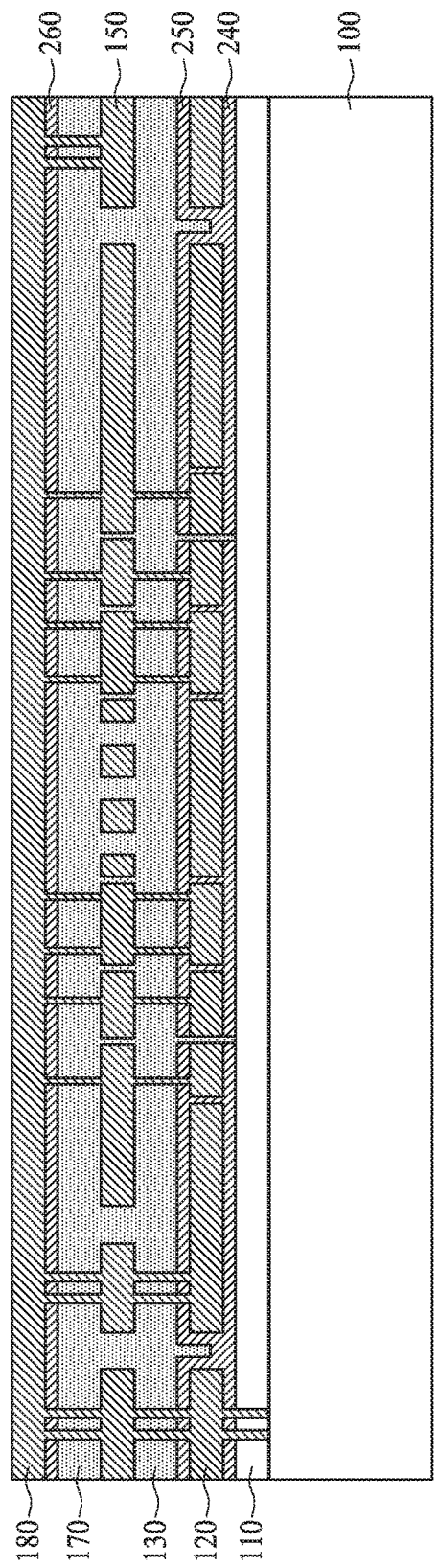
FIG. 34 shows a schematic cross sectional view of one of the various stages of a manufacturing operation for a MEMS microphone according to another embodiment of the present disclosure.

Next, similar to FIG. 16, a third semiconductor layer 180 is formed over the third dielectric layer 260, as shown in FIG. 34. In some embodiments, polysilicon doped with impurities such as P, As, and/or B is used as the third semiconductor layer 180. In some embodiments, the thickness of the third semiconductor layer 180 is in a range from about 300 nm to about 1500 nm. The third semiconductor layer fills the via holes 171, 172, 173, 174 and 176. Thus, the first supports 285 and 286 are formed in the third insulating layer 170.

Figure 35:
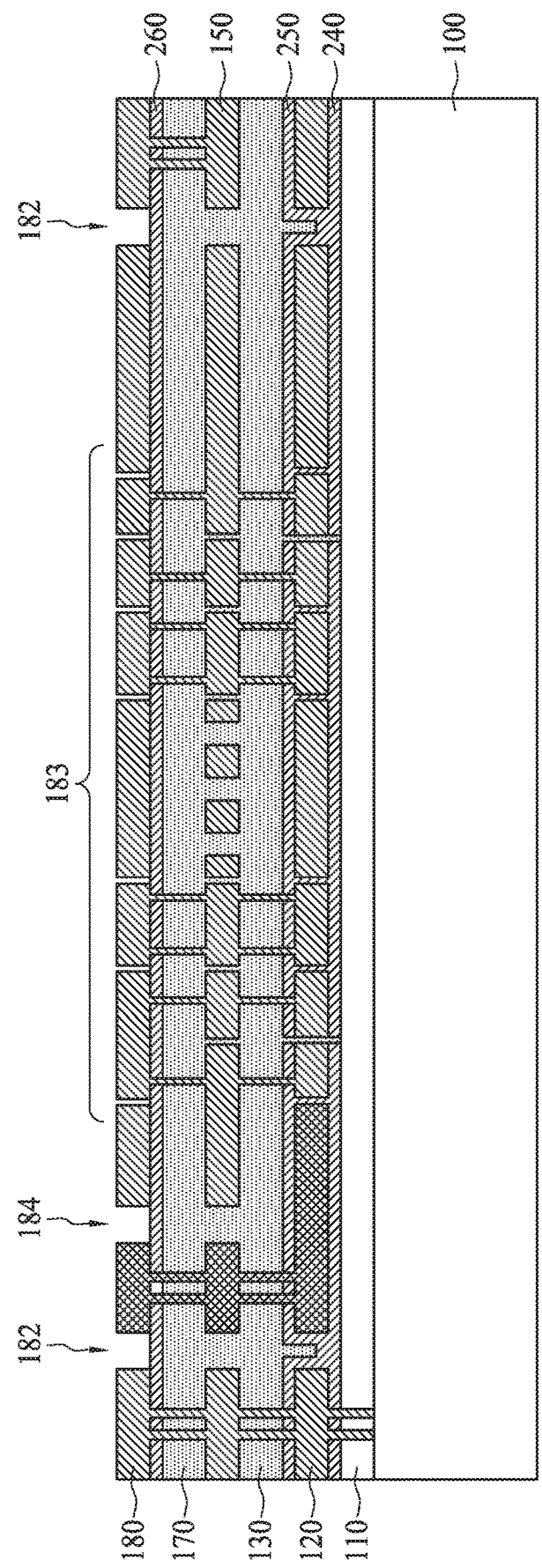
FIG. 35 shows a schematic cross sectional view of one of the various stages of a manufacturing operation for a MEMS microphone according to another embodiment of the present disclosure.

Then, similar to FIG. 17, one or more openings 182, 183 and 184 passing through the third semiconductor layer 180 are formed by a patterning operation including one or more lithography and etching processes, as shown in FIG. 35. The opening patterns 182 and 184 are for the isolation groove, and the opening patterns 183 are for the dielectric isolation materials.

Figure 36:
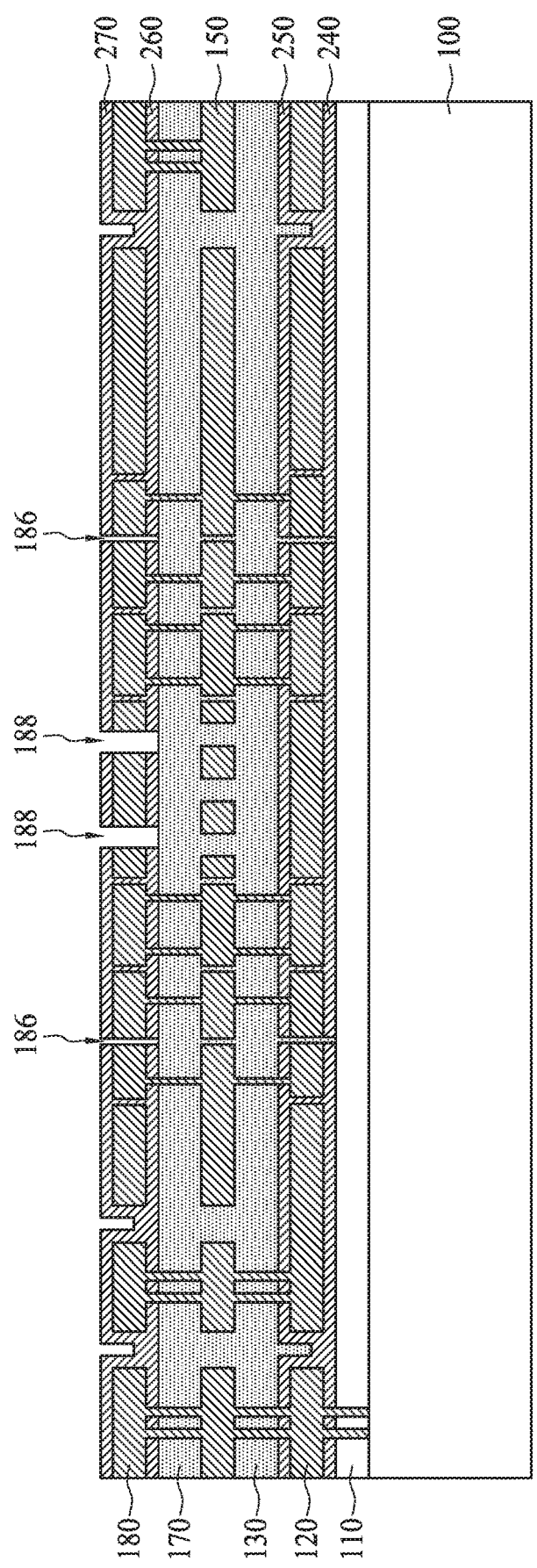
FIG. 36 shows a schematic cross sectional view of one of the various stages of a manufacturing operation for a MEMS microphone according to another embodiment of the present disclosure.

Further, as shown in FIG. 36, a fourth dielectric layer 270 is formed over the third semiconductor layer 180. In some embodiments, the fourth dielectric layer 270 is made of silicon nitride, and has a thickness in a range from about 100 nm to about 500 nm. Further, as shown in FIG. 36, one or more openings 186 and 188 passing through the fourth dielectric layer 270, the third semiconductor layer 180 and the third dielectric layer 260 are formed by a patterning operation including one or more lithography and etching processes. The opening patterns 186 are for the vent holes and the opening patterns 188 are for release holes.

Figure 37:
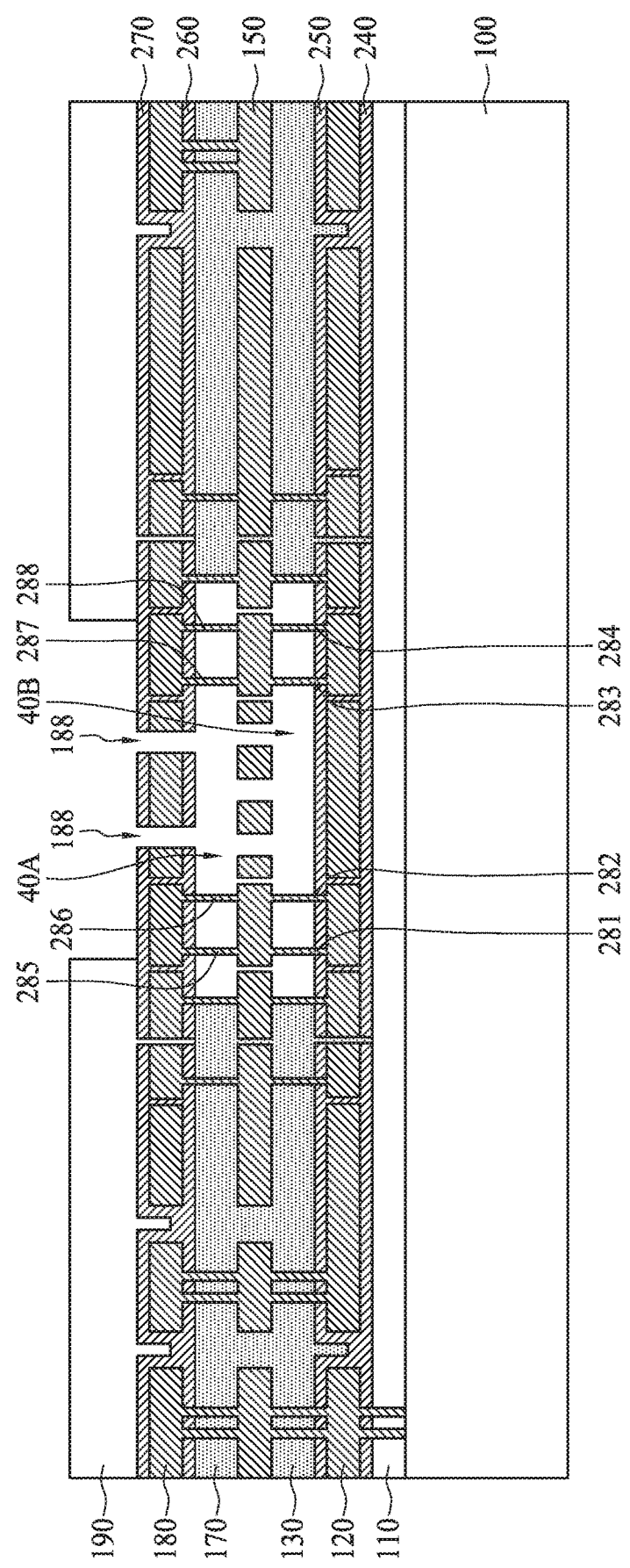
FIG. 37 shows a schematic cross sectional view of one of the various stages of a manufacturing operation for a MEMS microphone according to another embodiment of the present disclosure.

Next, similar to FIG. 18, a mask pattern 190, for example, a photo resist pattern, is formed over the fourth dielectric layer 270, such that the opening patterns 188 for the release holes are exposed from the resist pattern 190, as shown in FIG. 37. Then, the third insulating layer 170 and the second insulting layer 130 are partially etched to form a first cavity 40A and a second cavity 40B as shown in FIG. 37. The third insulating layer 170 around the first supports 285, 286, 287, 288 and the second insulating layer 130 around the second supports 281, 282, 283, 284 are removed, thereby exposing the first and second supports in the first and second cavities, respectively.

Figure 38:
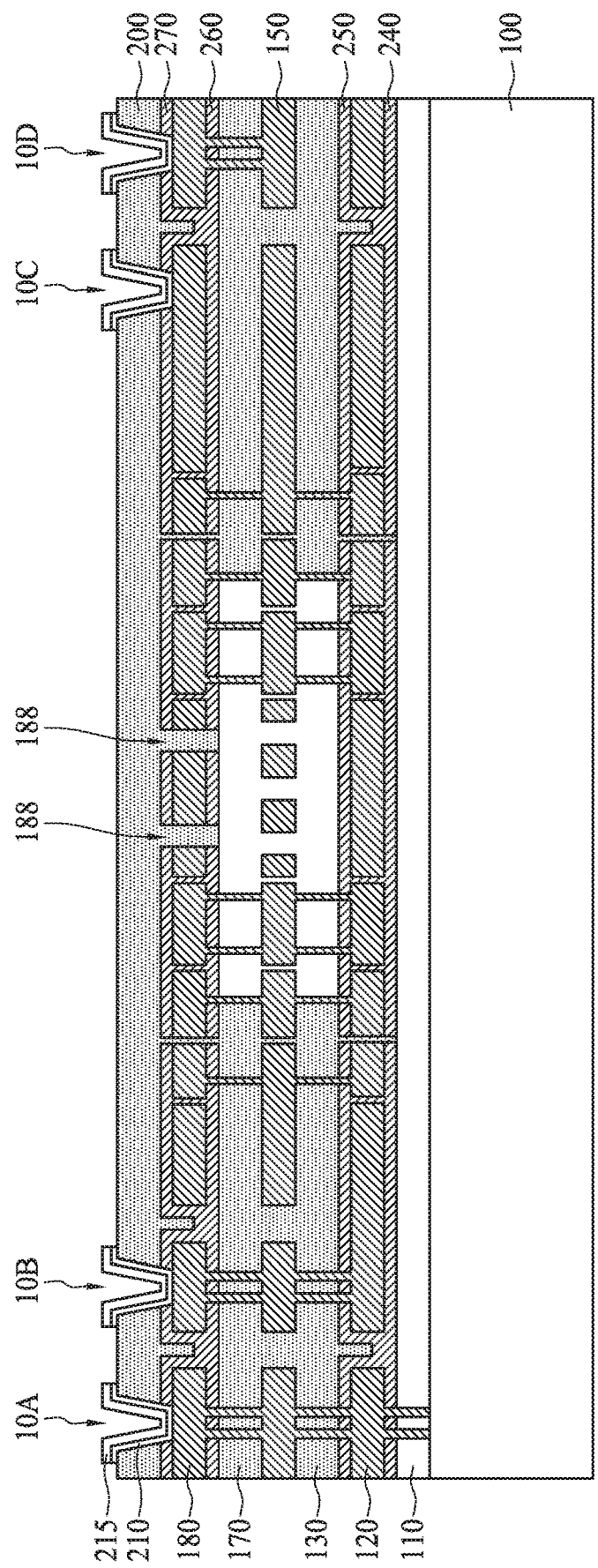
FIG. 38 shows a schematic cross sectional view of one of the various stages of a manufacturing operation for a MEMS microphone according to another embodiment of the present disclosure.

Next, similar to FIG. 20, a fourth insulating layer 200 is formed over the third semiconductor layer 180, as shown in FIG. 38. In some embodiments, the fourth insulating layer 200 is made of silicon oxide, and has a thickness in a range from about 1000 nm to about 4000 nm. The fourth insulating layer 200 fills and seals the release holes 188. Subsequently, a patterning operation including one or more lithography and etching processes is performed to expose parts of the upper surface of the third semiconductor layer 180 and the electrodes 10A-10D are formed by metal deposition and patterning operations, as shown in FIG. 38. In some embodiments, each of the electrodes includes one or more layers of conductive material. In certain embodiments, each of the electrodes includes an adhesion or barrier layer 210 and a body metal layer 215. In some embodiments, the adhesion or barrier layer 210 is made of Ti, Ta, TiN or TaN, and the body metal layer 215 is made of Cu, Al, AlCu or any other suitable metal.

Figure 39:
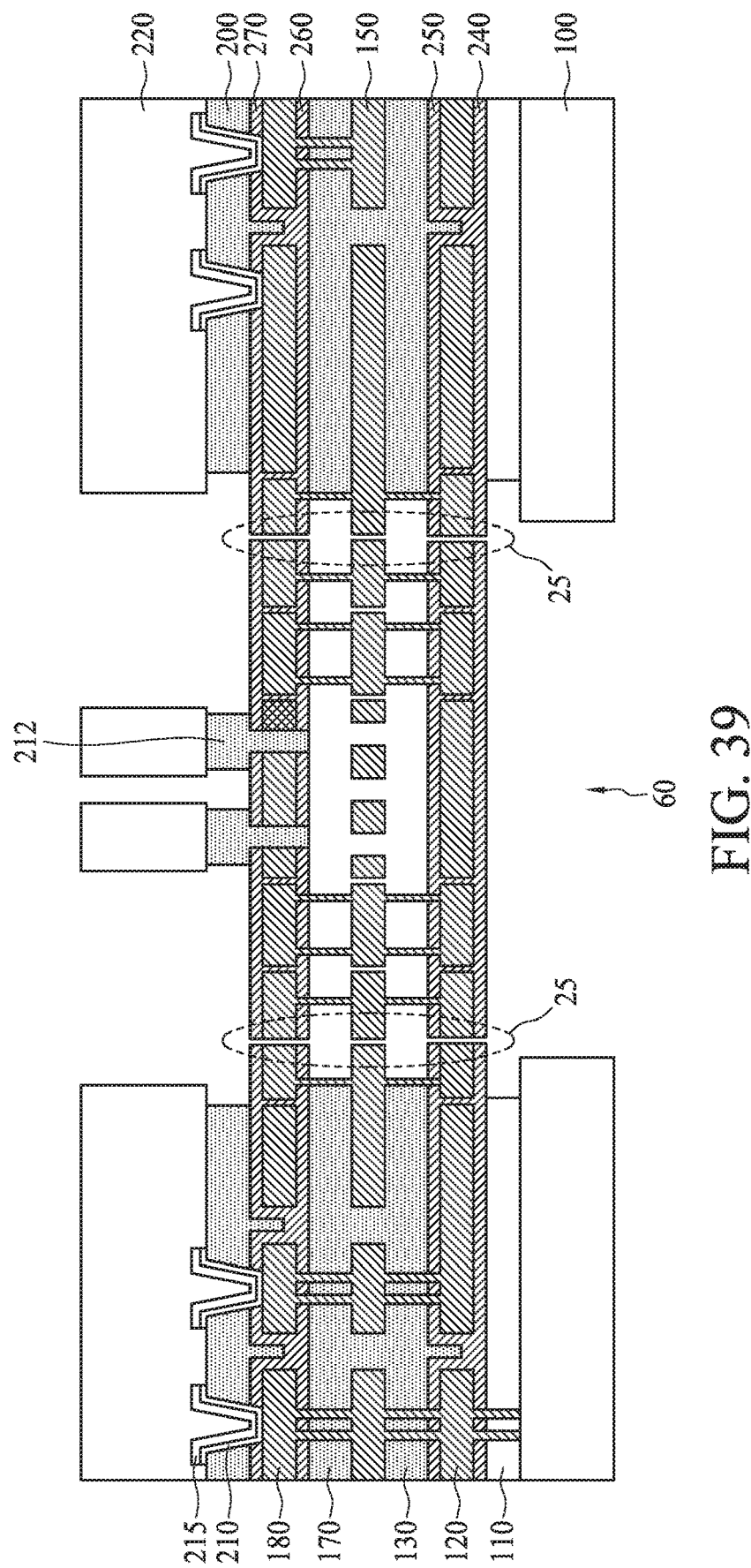
FIG. 39 shows a schematic cross sectional view of one of the various stages of a manufacturing operation for a MEMS microphone according to another embodiment of the present disclosure.

Further, similar to FIG. 21, the backside of the substrate 100 is ground to reduce the thickness of the substrate 100, as shown in FIG. 39. A mask layer 220, for example, a resist pattern, is formed over the fourth insulating layer 200, and a part of the fourth insulating layer 200 is removed through openings of the mask layer 220. The fourth insulating layer 200 is removed by using BHF wet etching in some embodiments. By the wet etching, a part of the fourth insulating layer 200 is left as sealing members 212 that seal the release holes 188, thereby making the cavities airtight. Further, by the wet etching, the third and second insulating layers around the vent holes 25 are removed. Further, the substrate 100 and the first insulating layer 110 are partially etched to form a backside opening 60. The substrate 100 may be etched after the mask layer 220 is formed and before the wet etching using BHF is performed in some embodiments. Thus, the vent holes 25 pass through the MEMS microphone structure from the front surface to the back surface.

Figure 40A:
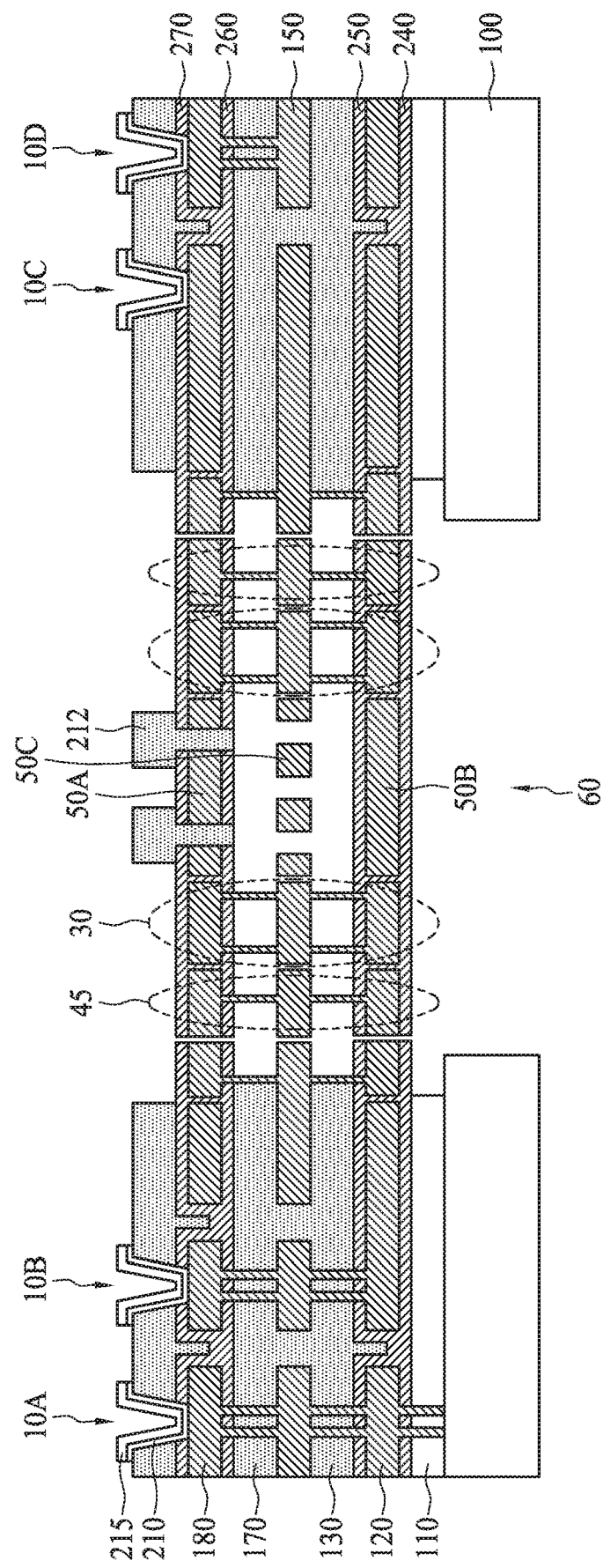
FIGS. 40A and 40B show schematic cross sectional views of one of the various stages of a manufacturing operation for a MEMS microphone according to an embodiment of the present disclosure.
Figure 40B:
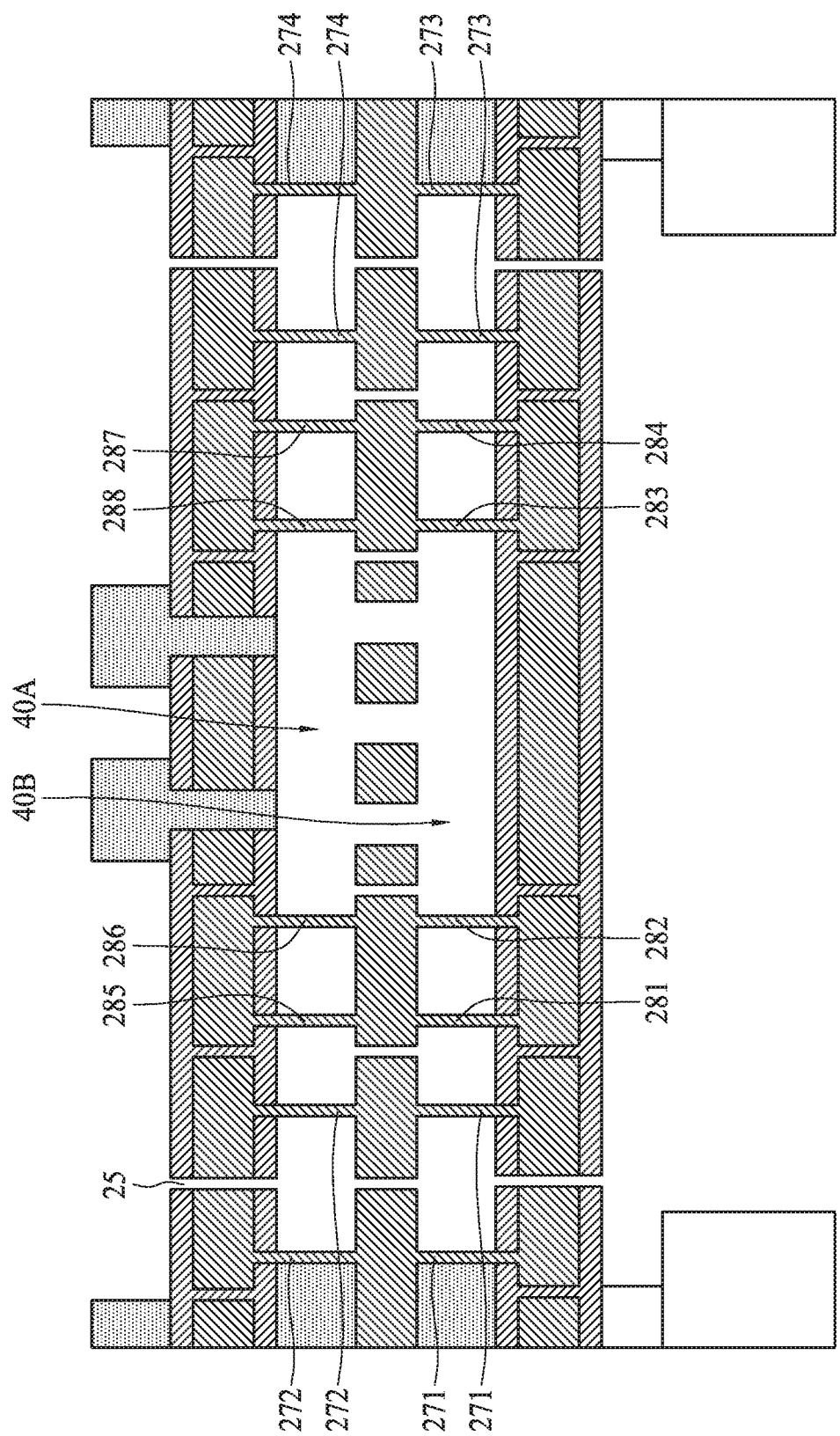

Then, after the mask pattern 220 is removed, a MEMS microphone is obtained, as shown in FIGS. 40A and 40B. FIG. 40B is an enlarged view around the cavities 40A and 40B of FIG. 40A. As shown in FIGS. 40A and 40B, the first membrane 50A formed by the third semiconductor layer and the second membrane 50B formed by the first semiconductor layer 120 are covered by dielectric layers, such as silicon nitride. Thus, the stiffness of the first membrane 50A and the second membrane 50B can increase. Further, the first supports 285, 286 and second supports 281, 281 are connected via a part of the second semiconductor layer 150. A part of the first semiconductor layer on which the second supports 281, 282, 283 and 284 land is electrically isolated from the second membrane 50B by the dielectric separation material, and a part of the third semiconductor layer from which the first supports 285 and 286 extend is electrically isolated from the first membrane 50A by the dielectric separation material. Further, a part of the second semiconductor layer to which the first and second supports are connected is electrically and physically isolated from the base plate 50C by a separation groove. Accordingly, electrical isolation among the first, second and third membranes is maintained. Similarly, the cylindrical supports 271 and 272 are also electrically isolated from the first, second and third membranes.

FIGS. 41-44 show various stages of manufacturing operations for a MEMS microphone in accordance with another embodiment of the present disclosure. It is understood that additional operations can be provided before, during, and after the processes shown by FIGS. 41-44, and some of the operations described below can be replaced or eliminated, for additional embodiments of the method. The order of the operations/processes may be interchangeable. Material, configuration, dimensions and/or processes the same as or similar to the foregoing embodiments described with FIGS. 1A-40 may be employed in the following embodiments, and detailed explanation thereof may be omitted.

Figure 41:
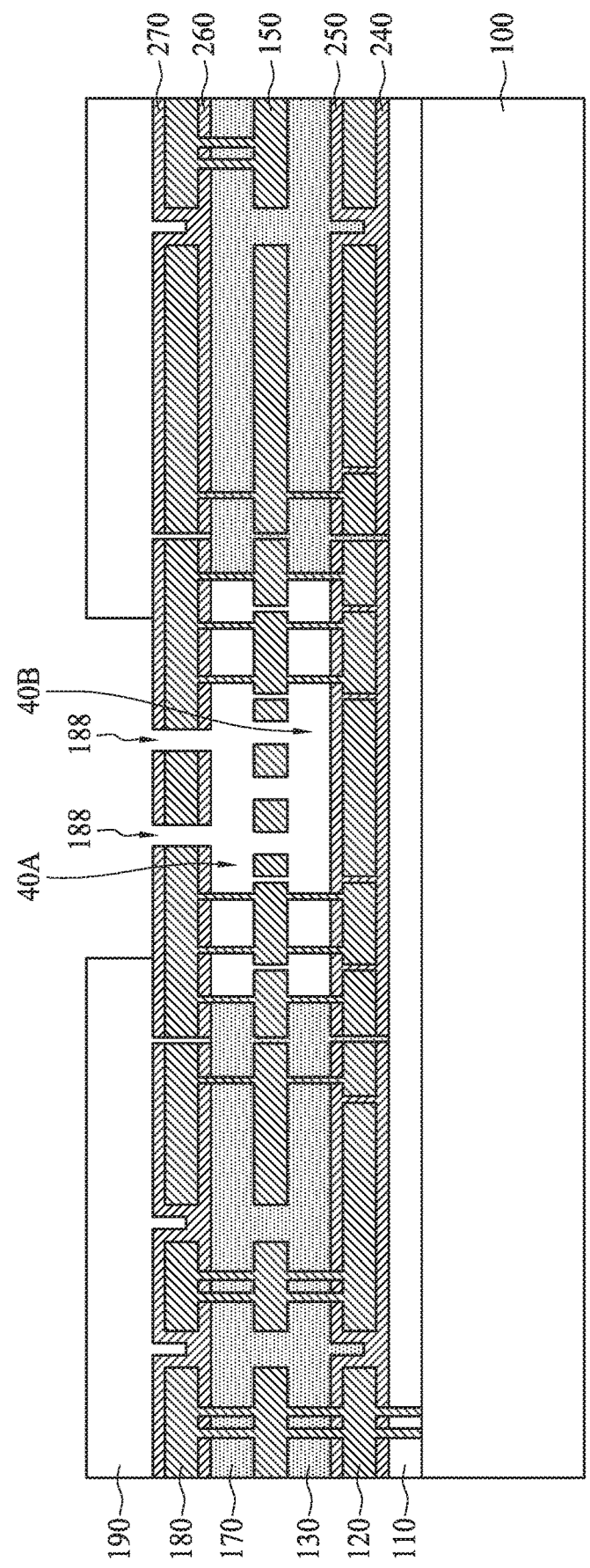
FIG. 41 shows a schematic cross sectional view of one of the various stages of a manufacturing operation for a MEMS microphone according to another embodiment of the present disclosure.
Figure 42:
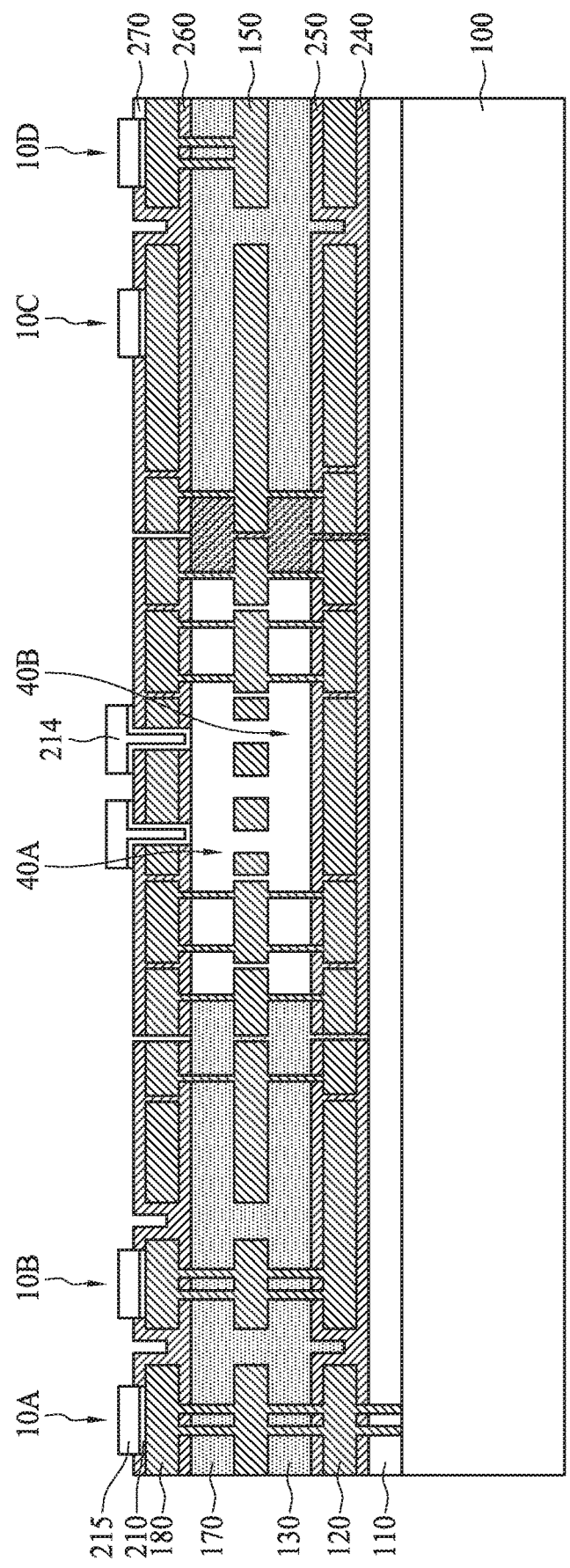
FIG. 42 shows a schematic cross sectional view of one of the various stages of a manufacturing operation for a MEMS microphone according to another embodiment of the present disclosure.

In this embodiment, the release holes are sealed by one or more conductive materials used for the electrodes 10A-10D. FIG. 41 is identical to FIG. 37. After the cavities are formed and the mask pattern 190 is removed, one or more conductive layers are formed over the fourth dielectric layer 270 and a patterning operation including one or more lithography and etching processes is performed to form the electrodes 10A-10D and sealing members 214, as shown in FIG. 42. In certain embodiments, each of the electrodes and the sealing members includes an adhesion or barrier layer 210 and a body metal layer 215. In some embodiments, the adhesion or barrier layer 210 is made of Ti, Ta, TiN or TaN, and the body metal layer 215 is made of Cu, Al, AlCu or any other suitable metal. The conductive layers can be formed by CVD, PVD including sputtering, electroplating or any other suitable film formation method. In some embodiments, a film deposition method with a low conformal condition is used to substantially seal the release holes 188 substantially without depositing the conductive material inside the cavities.

Figure 43:
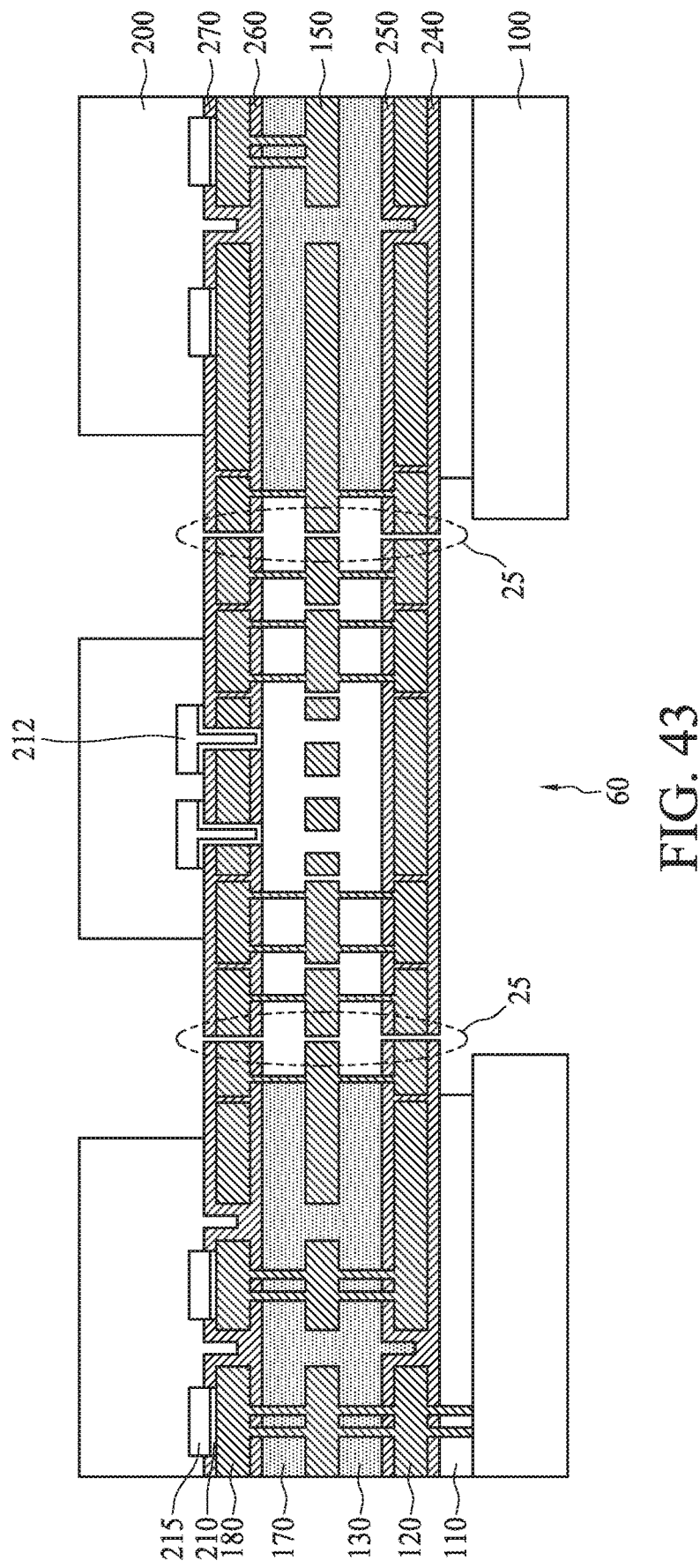
FIG. 43 shows a schematic cross sectional view of one of the various stages of a manufacturing operation for a MEMS microphone according to another embodiment of the present disclosure.
Figure 44:
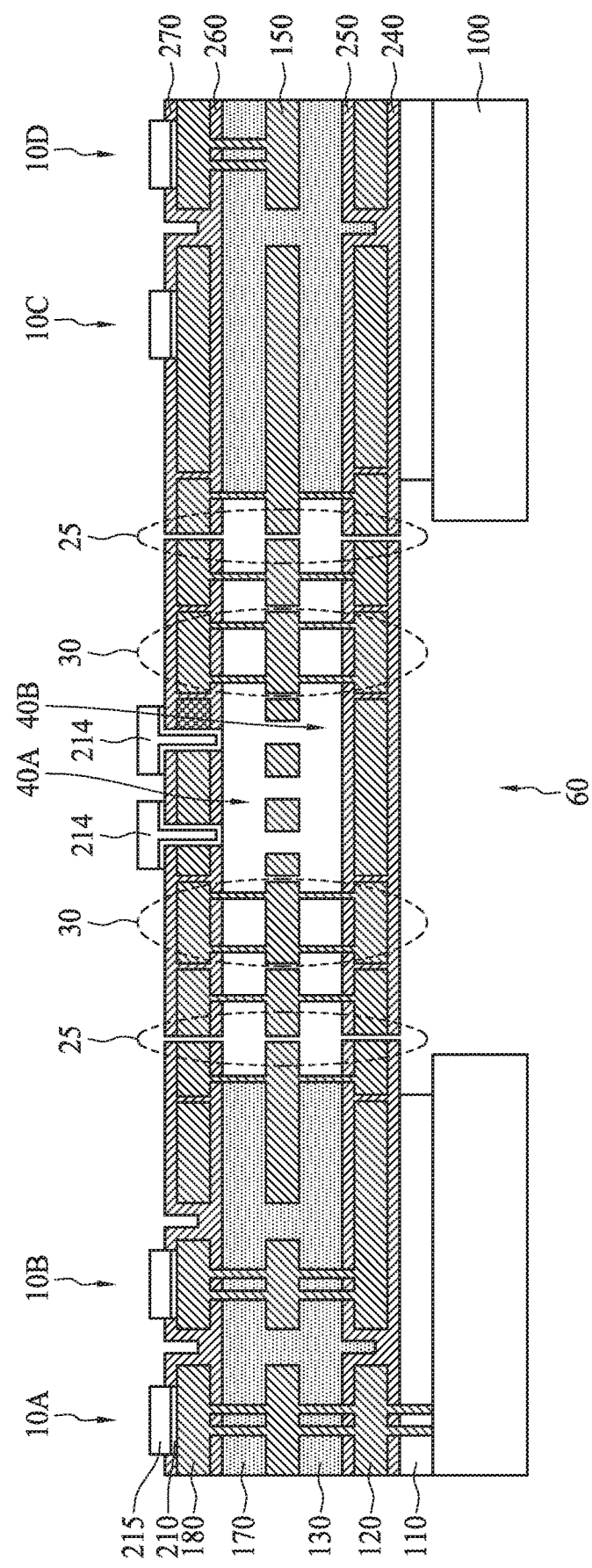
FIG. 44 shows a schematic cross sectional view of one of the various stages of a manufacturing operation for a MEMS microphone according to another embodiment of the present disclosure.

Then, similar to FIG. 21, a mask layer 220 is formed over the third semiconductor layer 180, the electrodes and the sealing members, as shown in FIG. 43. In some embodiments, the mask layer 220 is a photo resist pattern. By wet etching using BHF, the third and second insulating layers around the vent holes 25 are removed. Further, the substrate 100 and the first insulating layer 110 are partially etched to form a backside opening 60. The substrate 100 may be etched after the mask layer 220 is formed and before the wet etching using BHF is performed in some embodiments. Thus, the vent holes 25 pass through the MEMS microphone structure from the front surface to the back surface. Then, after the mask pattern 220 is removed, a MEMS microphone is obtained, as shown in FIG. 44.

FIGS. 45-52B show various stages of manufacturing operations for a MEMS microphone in accordance with an embodiment of the present disclosure. It is understood that additional operations can be provided before, during, and after the processes shown by FIGS. 45-52, and some of the operations described below can be replaced or eliminated, for additional embodiments of the method. The order of the operations/processes may be interchangeable. Material, configuration, dimensions and/or processes the same as or similar to the foregoing embodiments described with FIGS. 1A-44 may be employed in the following embodiments, and detailed explanation thereof may be omitted.

Figure 45:
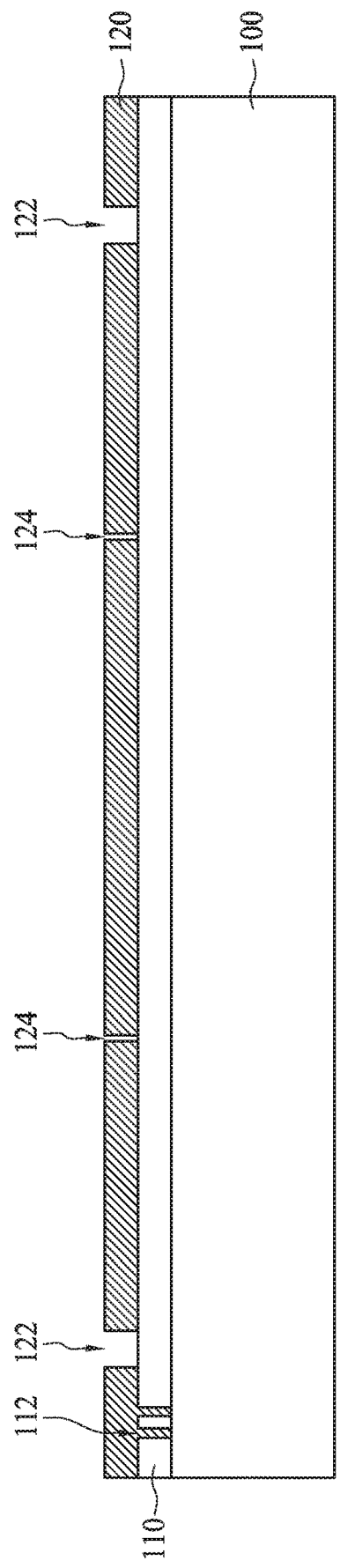
FIG. 45 shows a schematic cross sectional view of one of the various stages of a manufacturing operation for a MEMS microphone according to another embodiment of the present disclosure.

Similar to FIGS. 4-7, a first insulating layer 110 is formed over a substrate 100, and a first semiconductor layer 120 is formed over the first insulating layer 110, as shown in FIG. 45. In some embodiments, the substrate 100 is a doped Si wafer. In some embodiments, the first insulating layer 110 is made of silicon oxide having a thickness in a range from about 400 nm to about 4000 nm. In some embodiments, the first semiconductor layer is polysilicon doped with impurities such as P, As, and/or B and has a thickness in a range from about 300 nm to about 1500 nm. A patterning operation including one or more lithography and etching processes is performed to form a pattern 112 in the first insulating layer 110, and the pattern 112 is filled with the first semiconductor layer, as shown in FIG. 45. The pattern 112 is subsequently used as an electrical path for connecting the substrate 100 and the first electrode 10A. Further, as shown FIG. 45, a patterning operation including one or more lithography and etching processes is performed to form patterns 122 and 124 in the first semiconductor layer 120. The pattern 122 is a groove for a separation groove 20 and the patterns 124 are hole patterns for vent holes 25.

Then, similar to FIGS. 8-11, a second insulating layer 130 is formed over the first semiconductor layer 120, a first dielectric layer 140 is formed over the second insulating layer and a second semiconductor layer 150 is formed over the first dielectric layer 140. In some embodiments, the second insulating layer 130 is made of silicon oxide having a thickness in a range from about 1000 nm to about 4000 nm. The second insulating layer 130 fills the patterns 122 and 124 in the first semiconductor layer 120. In some embodiments, the first dielectric layer 140 is made of silicon nitride having a thickness in a range from about 100 nm to about 500 nm. In some embodiments, the second semiconductor layer 150 is made of polysilicon doped with impurities such as P, As, and/or B having a thickness in a range from about 300 nm to about 1500 nm.

Figure 46:
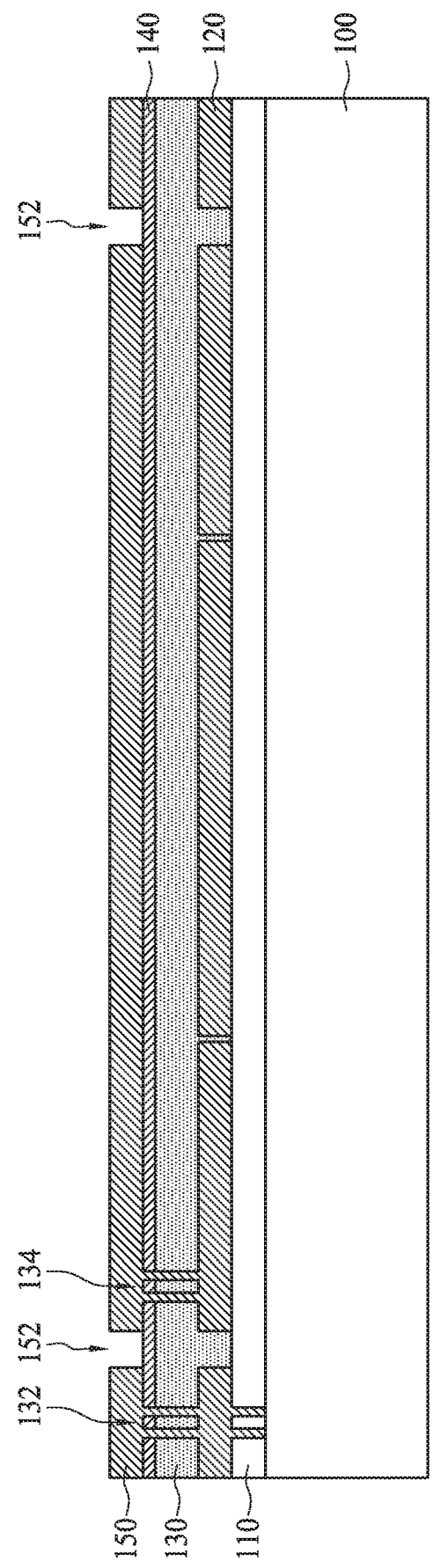
FIG. 46 shows a schematic cross sectional view of one of the various stages of a manufacturing operation for a MEMS microphone according to another embodiment of the present disclosure.

As shown in FIG. 46, one or more via holes 132 and 134 passing through the first dielectric layer 140 and the second insulating layer 130 are formed by a patterning operation including one or more lithography and etching processes. The pattern 132 is subsequently used as the electrical path for connecting the substrate 100 and the first electrode 10A, and the pattern 134 is subsequently used as an electrical path for connecting the second membrane 50B formed by the first semiconductor layer 120 and the second electrode 10B. The via holes 132 and 134 are filled by the second semiconductor layer 150. Then, as shown in FIG. 46, one or more openings 152 passing through the second semiconductor layer 150 are formed by a patterning operation including one or more lithography and etching processes. The opening pattern 152 is for the isolation groove. In some embodiments, no opening pattern other than openings 152 is formed in the second semiconductor layer 150.

Figure 47:
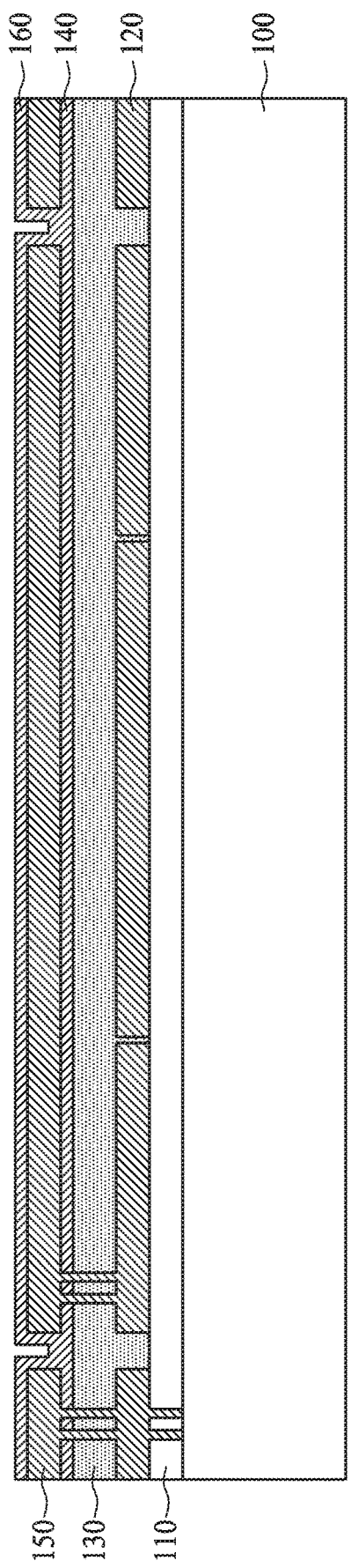
FIG. 47 shows a schematic cross sectional view of one of the various stages of a manufacturing operation for a MEMS microphone according to another embodiment of the present disclosure.

Next, similar to FIG. 12, a second dielectric layer 160 is formed over the second semiconductor layer 150, as shown in FIG. 47. In some embodiments, the second dielectric layer 160 is made of silicon nitride having a thickness in a range from about 100 nm to about 500 nm. The second dielectric layer 160 at least partially fills the opening 152.

Figure 48:
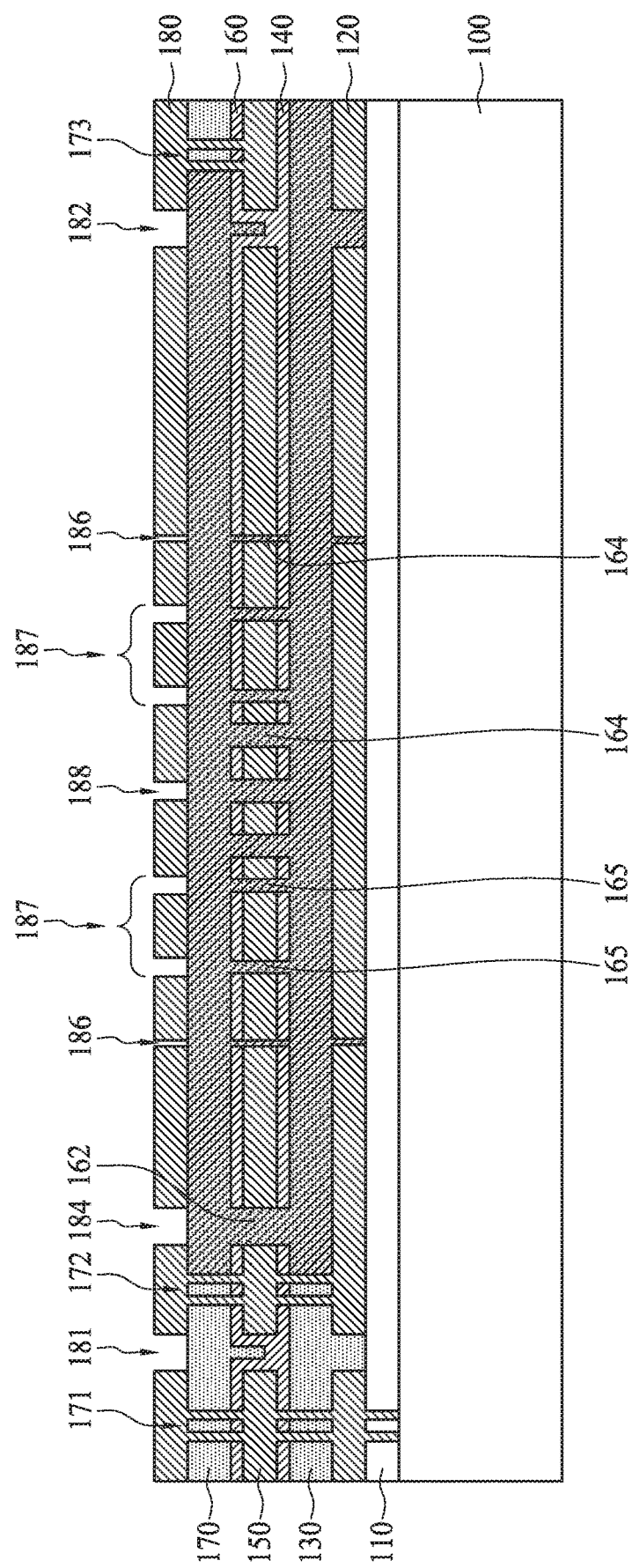
FIG. 48 shows a schematic cross sectional view of one of the various stages of a manufacturing operation for a MEMS microphone according to another embodiment of the present disclosure.

Then, similar to FIGS. 13-17, one or more openings 162 and 164 passing through the second dielectric layer 160, the second semiconductor layer 150 and the first dielectric layer 140 are formed by a patterning operation including one or more lithography and etching processes, as shown in FIG. 48. The opening pattern 162 is for the isolation groove and the opening patterns 164 are for the acoustic holes connecting the first and second cavities subsequently formed and for isolating the support structures. Subsequently, as shown in FIG. 48 a third insulating layer 170 is formed over the second dielectric layer 160. In some embodiments, the third insulating layer 170 is made of silicon oxide having a thickness in a range from about 1000 nm to about 4000 nm. After the third insulating layer 170 is formed, one or more via holes 171, 172 and 173 passing through the third insulating layer 170 and the second dielectric layer 160 are formed by a patterning operation including one or more lithography and etching processes, as shown in FIG. 48. The pattern 171 is subsequently used as the electrical path for connecting the substrate 100 and the first electrode 10A, the pattern 172 is subsequently used as the electrical path for connecting the second membrane 50B formed by the first semiconductor layer 120 and the second electrode 10B, and the pattern 173 is subsequently used as an electrical path for connecting the base plate 50C formed by the second semiconductor layer 150 and the fourth electrode 10D. The third semiconductor layer 180 fills the via holes 171, 172, and 173. Further, one or more openings 181, 182, 184, 186, 187 and 188 passing through the third semiconductor layer 180 are formed by a patterning operation including one or more lithography and etching processes. The opening patterns 181, 182 and 184 are for the isolation groove, the opening patterns 186 are for the vent holes, and the opening patterns 187 and 188 are for release holes.

Figure 49A:
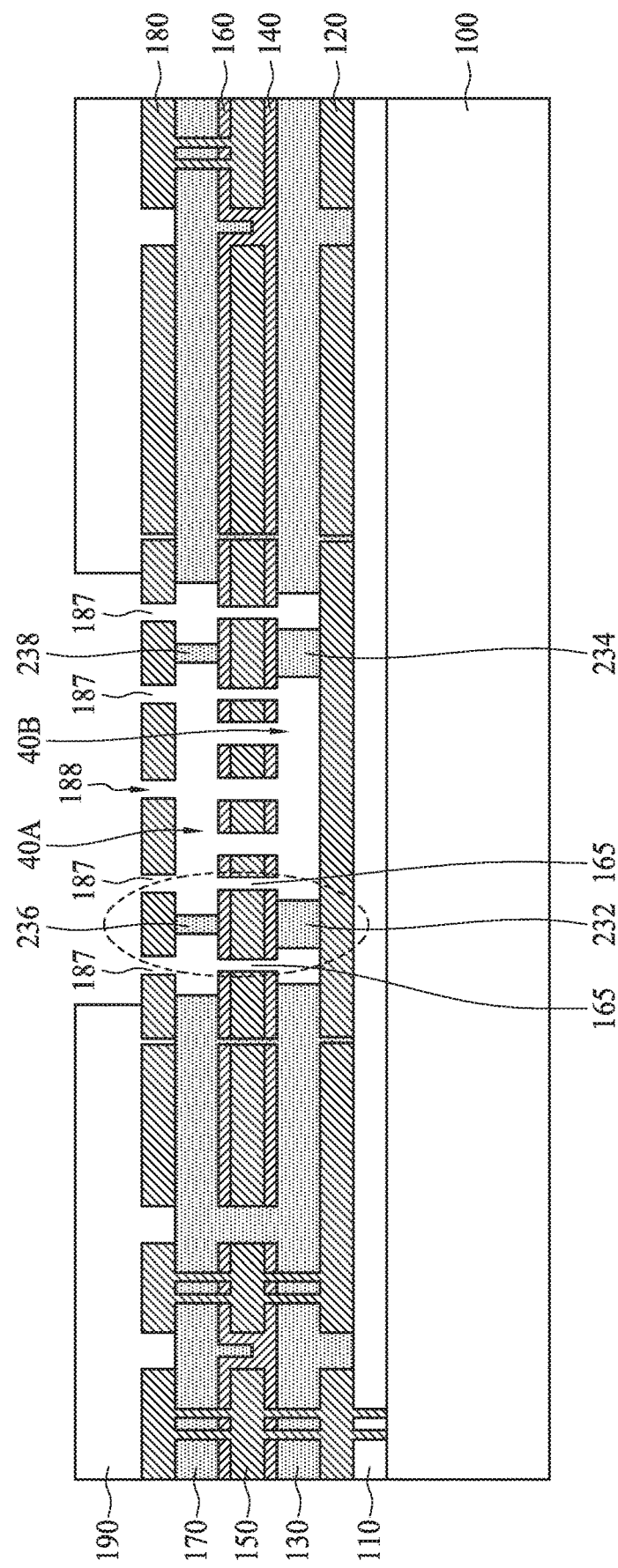
FIG. 49A shows a schematic cross sectional view of one of the various stages of a manufacturing operation for a MEMS microphone according to another embodiment of the present disclosure.

Next, similar to FIG. 18, a mask pattern 190, for example, a photo resist pattern, is formed over the third semiconductor layer 180, as shown in FIG. 49A. The mask pattern 190 is a photo resist pattern in some embodiments. The opening patterns 188 for the release holes are exposed from the resist pattern 190. Then, the third insulating layer 170 and the second insluting layer 130 are partially etched by wet etching, to form a first cavity 40A and a second cavity 40B as shown in FIG. 49A. In some embodiments, a wet etching operation using buffered HF (BHF) as an etchant is employed. The etchant penetrates from the release holes 188 and dissolves a part of the third insulating layer 170. The etchant further penetrates through the acoustic holes and dissolves a part of the second insulating layer 130. By controlling an etching time, the first cavity 40A and the second cavity 40B with a desired size are obtained. Further, first supports 236, 238 formed by the third insulating layer 170 and second supports 232, 234 formed by the second insulating layer 130 are formed. The first and second supports have a columnar or a pillar shape in some embodiments, and have a wall shape in other embodiments.

Figure 49B:
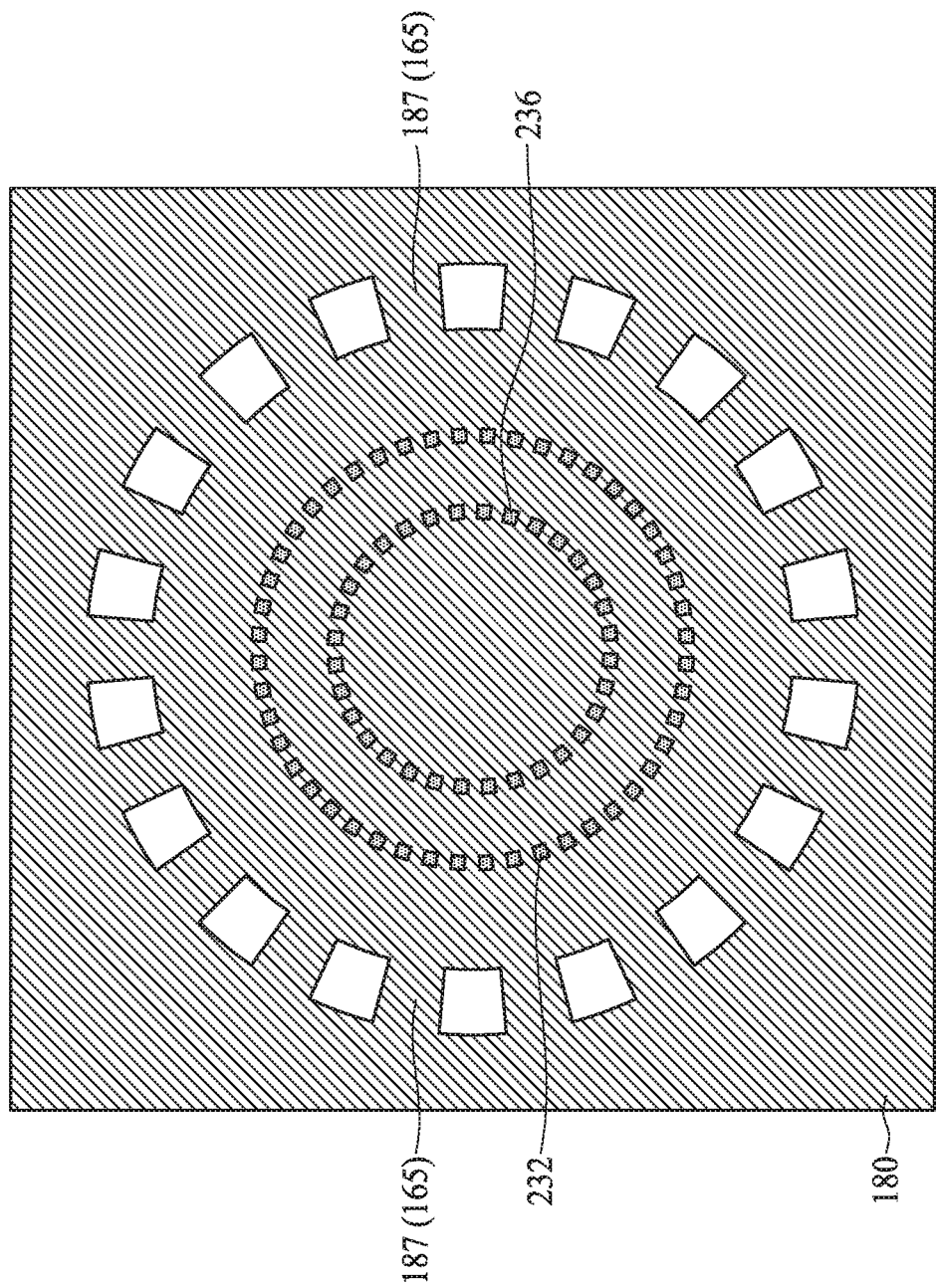
FIG. 49B shows an enlarged schematic cross sectional view around a support structure of FIG. 49A.

As shown in FIG. 49B, the openings 187 are formed by a plurality of openings disposed on a circumference of a circle. The second and third insulating layers are etched through the openings 187 to form a pillar or columnar shape supports 232, 234, 236 and 238.

Figure 50:
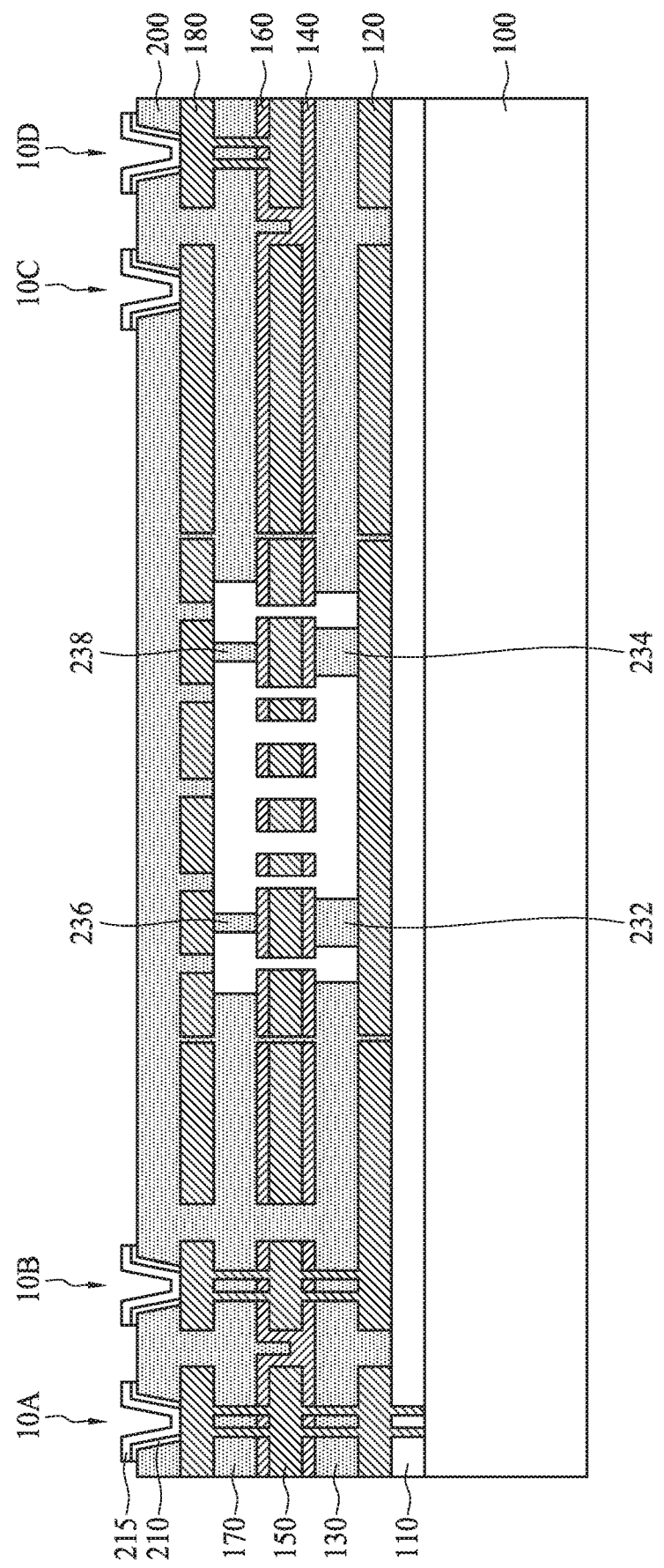
FIG. 50 shows a schematic cross sectional view of one of the various stages of a manufacturing operation for a MEMS microphone according to another embodiment of the present disclosure.

Next, similar to FIG. 20, a fourth insulating layer 200 is formed over the third semiconductor layer 180, as shown in FIG. 50. In some embodiments, the fourth insulating layer 200 is made of silicon oxide having a thickness in a range from about 1000 nm to about 4000 nm. The fourth insulating layer 200 fills and seals the release holes 188, as shown in FIG. 50. A patterning operation including one or more lithography and etching processes is performed to expose parts of the upper surface of the third semiconductor layer 180, and the electrodes 10A-10D are formed by metal deposition and patterning operations. In some embodiments, each of the electrodes includes one or more layers of conductive material. In certain embodiments, each of the electrodes includes an adhesion or barrier layer 210 and a body metal layer 215. In some embodiments, the adhesion or barrier layer 210 is made of Ti, Ta, TiN or TaN, and the body metal layer 215 is made of Cu, Al, AlCu or any other suitable metal.

Figure 51:
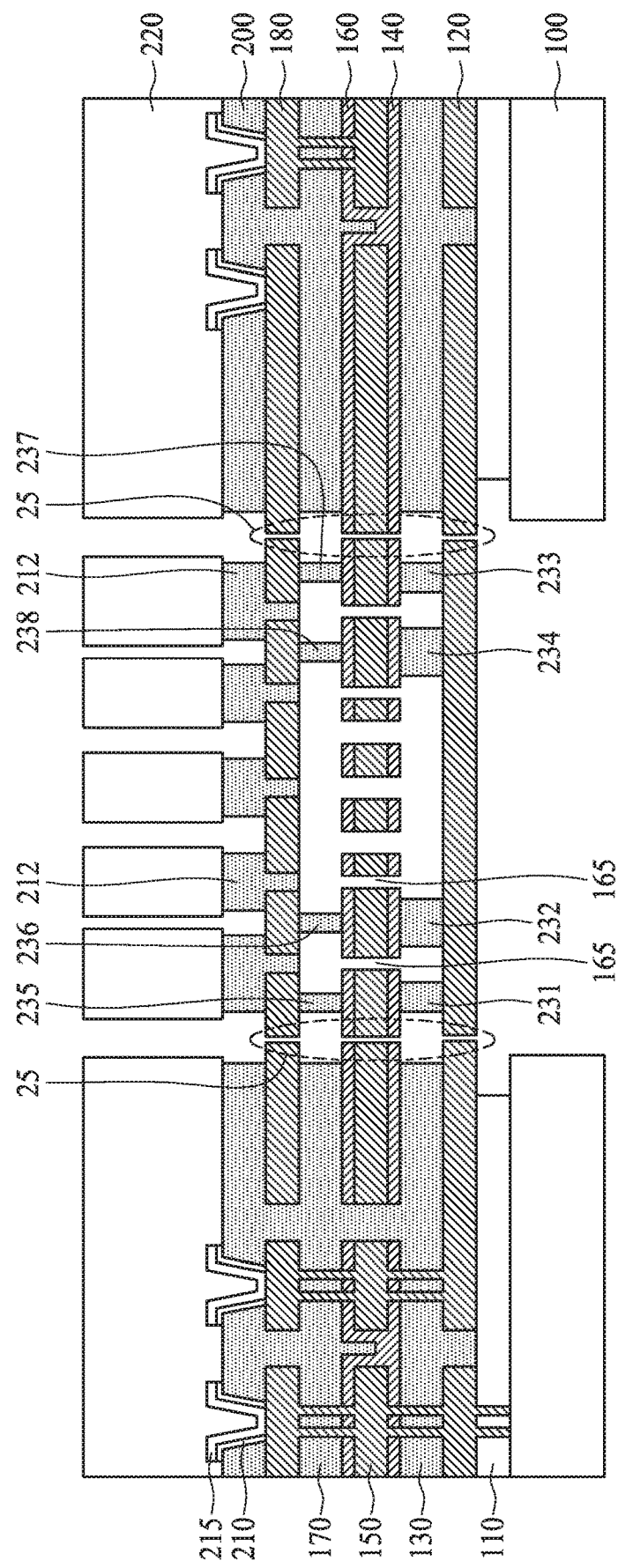
FIG. 51 shows a schematic cross sectional view of one of the various stages of a manufacturing operation for a MEMS microphone according to another embodiment of the present disclosure.

Further, similar to FIG. 21, the backside of the substrate 100 is ground to reduce the thickness of the substrate 100, as shown in FIG. 51. A mask layer 220, for example a photo resist pattern, is formed over the fourth insulating layer 200, and a part of the fourth insulating layer 200 is removed through openings of the mask layer 220. The fourth insulating layer 200 is removed by wet etching using BHF. By the wet etching, a part of the fourth insulating layer 200 is left as sealing members 212 that seal the release holes 188, thereby making the cavities airtight. Further, by the wet etching, the third and second insulating layers around the vent holes 25 are removed. Further, the substrate 100 and the first insulating layer 110 are partially etched by one or more lithography and etching operations to form a backside opening 60. The substrate 100 may be etched after the mask layer 220 is formed and before the wet etching using BHF is performed in some embodiments. Thus, the vent holes 25 pass through the MEMS microphone structure from the front surface (the first membrane 50A formed by the third semiconductor layer 180) to the back surface (the second membrane 50B formed by the first semiconductor layer 120).

Figure 52A:
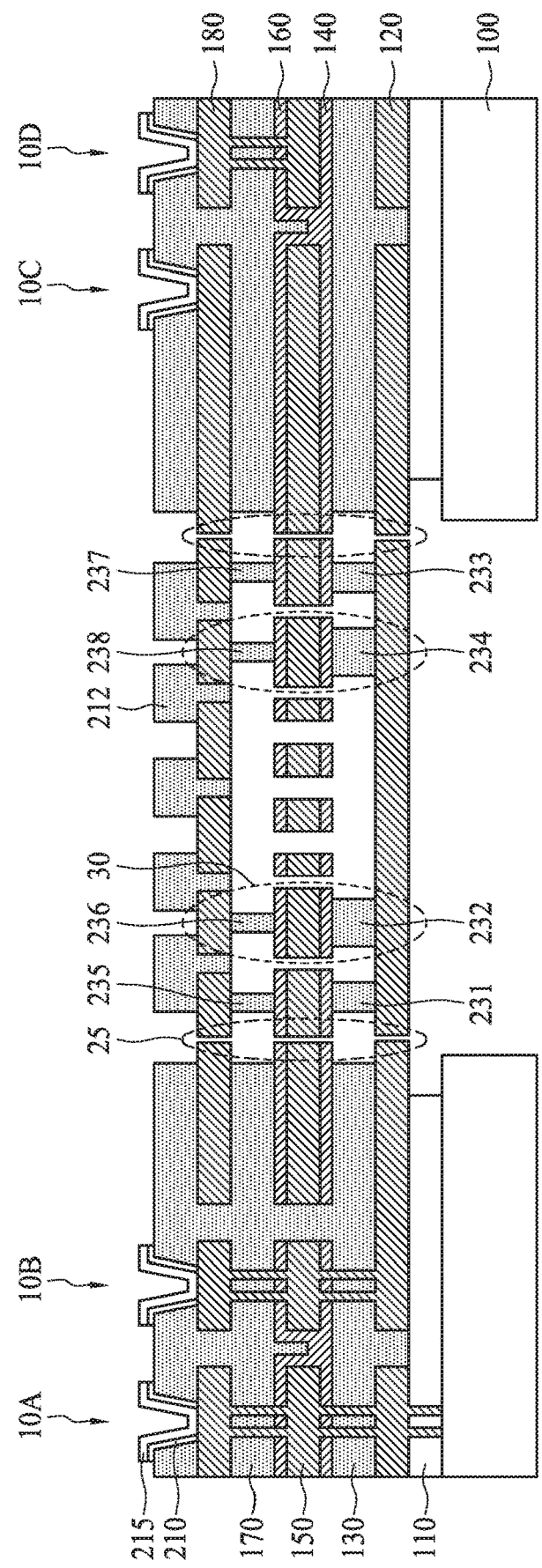
FIGS. 52A and 52B show schematic cross sectional views of one of the various stages of a manufacturing operation for a MEMS microphone according to an embodiment of the present disclosure.
Figure 52B:
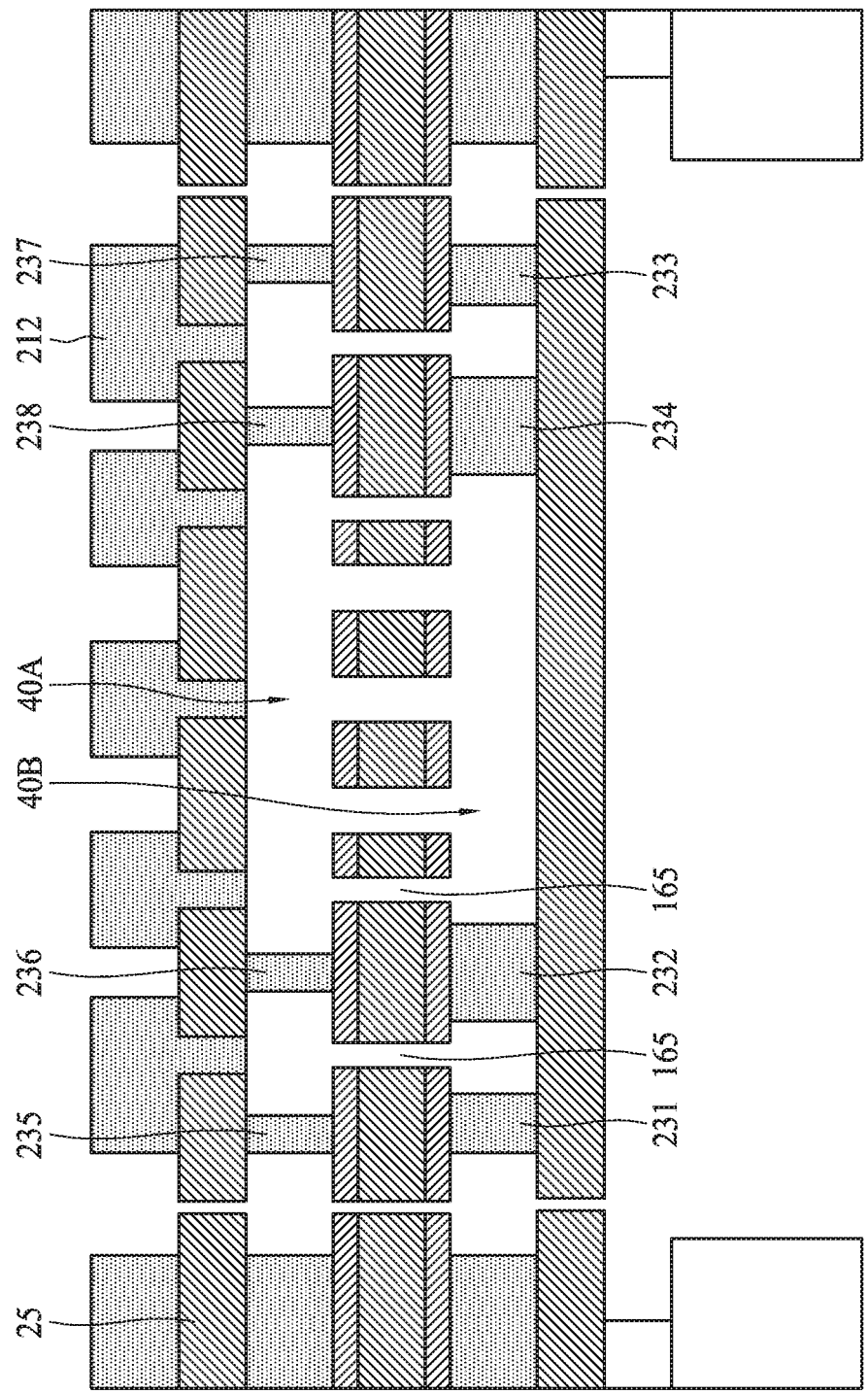

Then, after the mask pattern 220 is removed, a MEMS microphone is obtained, as shown in FIGS. 52A and 52B. FIG. 52B is an enlarged view around the cavities 40A and 40B of FIG. 52A. The supports 231, 233, 235 and 237 formed by the second or third insulating layers surround the vent holes 25.

FIGS. 53-56 show various stages of manufacturing operations for a MEMS microphone in accordance with another embodiment of the present disclosure. It is understood that additional operations can be provided before, during, and after the processes shown by FIGS. 53-56, and some of the operations described below can be replaced or eliminated, for additional embodiments of the method. The order of the operations/processes may be interchangeable. Material, configuration, dimensions and/or processes the same as or similar to the foregoing embodiments described with FIGS. 1A-52 may be employed in the following embodiments, and detailed explanation thereof may be omitted.

Figure 53:
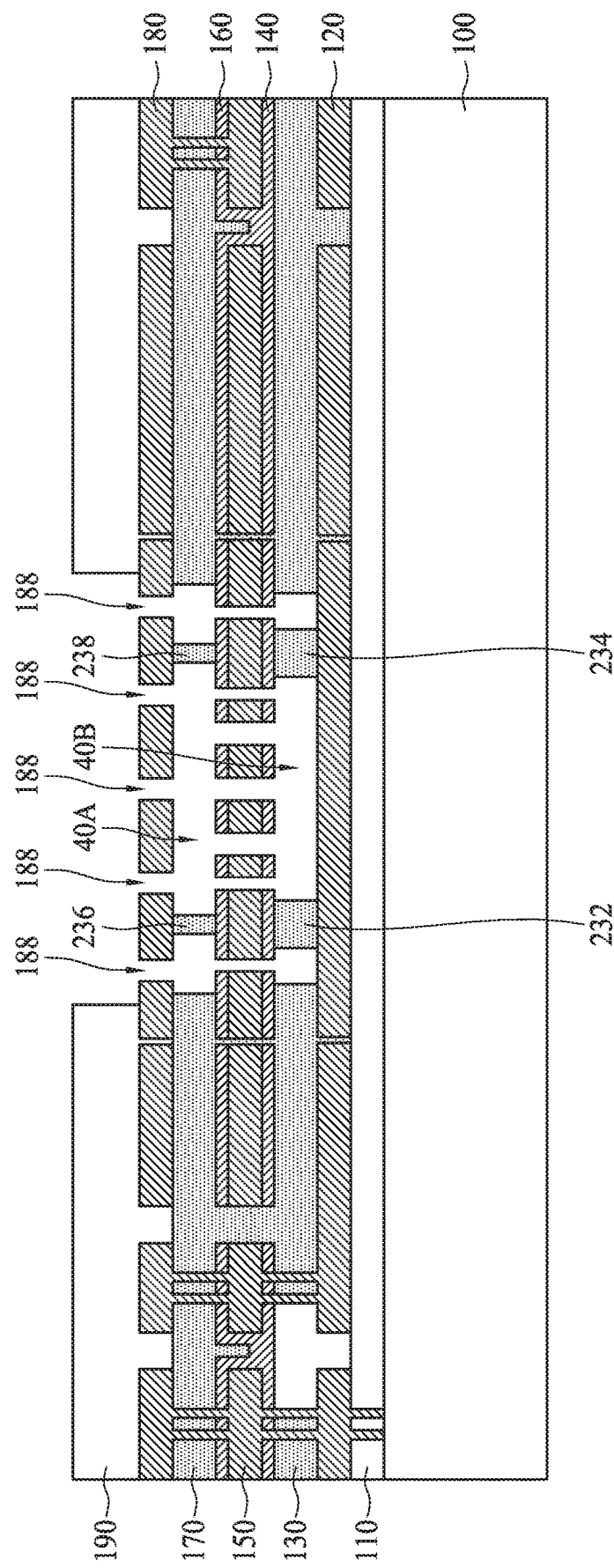
FIG. 53 shows a schematic cross sectional view of one of the various stages of a manufacturing operation for a MEMS microphone according to another embodiment of the present disclosure.
Figure 54:
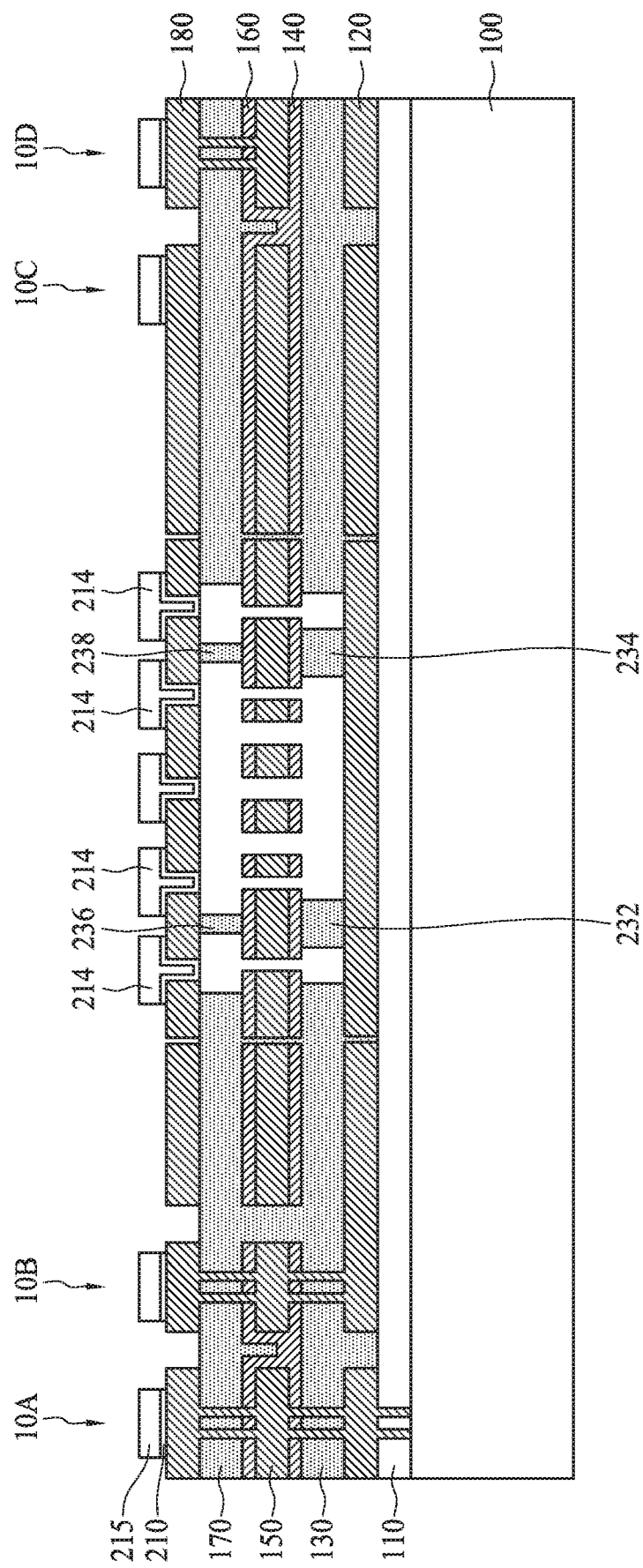
FIG. 54 shows a schematic cross sectional view of one of the various stages of a manufacturing operation for a MEMS microphone according to another embodiment of the present disclosure.

In this embodiment, the release holes are sealed by one or more conductive materials used for the electrodes 10A-10D. FIG. 53 is identical to FIG. 49A. After the cavities are formed and the mask pattern 190 is removed, one or more conductive layers are formed over the third semiconductor layer 180 and a patterning operation including one or more lithography and etching processes is performed to form the electrodes 10A-10D and sealing members 214, as shown in FIG. 54. In certain embodiments, each of the electrodes and the sealing members includes an adhesion or barrier layer 210 and a body metal layer 215. In some embodiments, the adhesion or barrier layer 210 is made of Ti, Ta, TiN or TaN, and the body metal layer 215 is made of Cu, Al, AlCu or any other suitable metal. The conductive layers can be formed by CVD, PVD including sputtering, electroplating or any other suitable film formation method. In some embodiments, a film deposition method with a low conformal condition is used to seal the release holes 188 substantially without depositing the conductive material inside the cavities.

Figure 55:
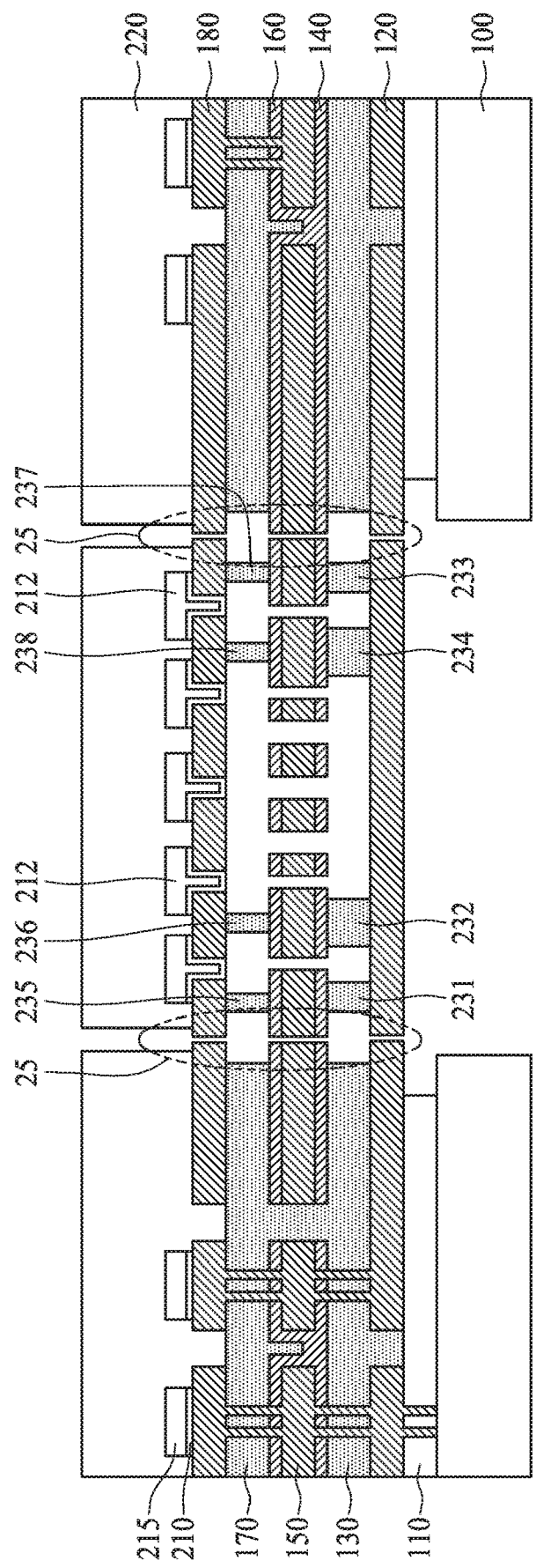
FIG. 55 shows a schematic cross sectional view of one of the various stages of a manufacturing operation for a MEMS microphone according to another embodiment of the present disclosure.
Figure 56:
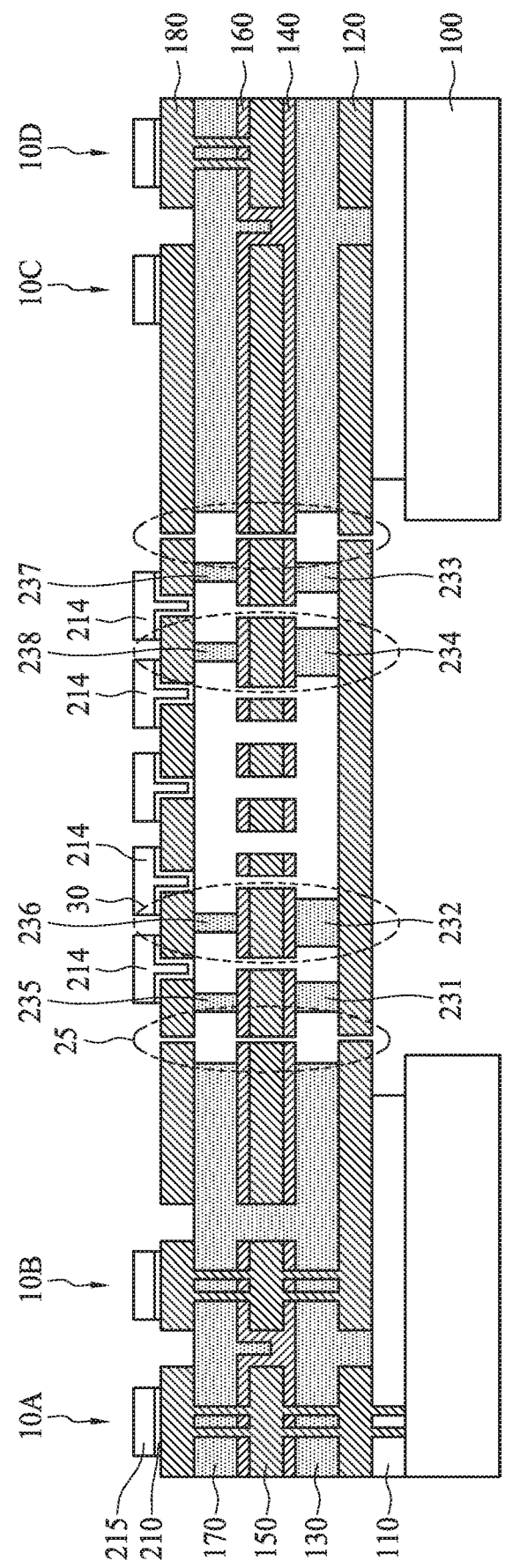
FIG. 56 shows a schematic cross sectional view of one of the various stages of a manufacturing operation for a MEMS microphone according to another embodiment of the present disclosure.

Then, similar to FIG. 21, a mask layer 220 is formed over the third semiconductor layer 180, the electrodes and the sealing members. In some embodiments, the mask layer 220 is a photo resist pattern, as shown in FIG. 55. By the BHF wet etching, the third and second insulating layers around the vent holes 25 are removed. Further, the substrate 100 and the first insulating layer 110 are partially etched to form a backside opening 60. The substrate 100 may be etched after the mask layer 220 is formed and before the wet etching using BHF is performed in some embodiments. Thus, the vent holes 25 pass through the MEMS microphone structure from the front surface to the back surface. Then, after the mask pattern 220 is removed, a MEMS microphone is obtained, as shown in FIG. 56.

FIGS. 57-65 show various stages of manufacturing operations for a MEMS microphone in accordance with another embodiment of the present disclosure. It is understood that additional operations can be provided before, during, and after the processes shown by FIGS. 57-65, and some of the operations described below can be replaced or eliminated, for additional embodiments of the method. The order of the operations/processes may be interchangeable. Material, configuration, dimensions and/or processes the same as or similar to the foregoing embodiments described with FIGS. 1A-56 may be employed in the following embodiments, and detailed explanation thereof may be omitted.

In this embodiment, the release holes are sealed by an insulating material, and the first and second membranes, as back plates, are covered by dielectric material layers.

Figure 57:
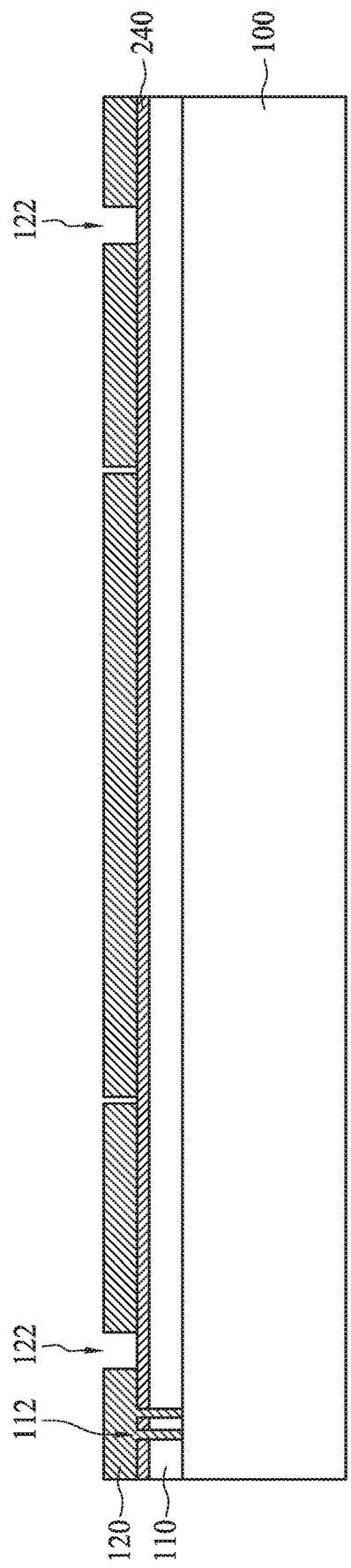
FIG. 57 shows a schematic cross sectional view of one of the various stages of a manufacturing operation for a MEMS microphone according to another embodiment of the present disclosure.

Similar to FIGS. 4-6 and 27-28, a first insulating layer 110 is formed over a substrate 100, as shown in FIG. 57. Further, a first dielectric layer 240 is formed over the first insulating layer 110. In some embodiments, the first insulating layer 110 is made of silicon oxide, and the first dielectric layer 240 is made of silicon nitride. In some embodiments, the thickness of the first insulating layer 110 is in a range from about 400 nm to about 4000 nm, and the thickness of the first dielectric layer 240 is in a range from about 100 nm to about 500 nm. Then, a patterning operation including one or more lithography and etching processes is performed to form a pattern 112 in the first dielectric layer 240 and the first insulating layer 110. The pattern 112 is subsequently used as an electrical path for connecting the substrate 100 and the first electrode 10A. Then, a first semiconductor layer 120 is formed over the first dielectric layer 240, as shown in FIG. 57. In some embodiments, polysilicon doped with impurities such as P, As, and/or B is used as the first semiconductor layer. In some embodiments, the thickness of the first semiconductor layer 120 is in a range from about 300 nm to about 1500 nm. The first semiconductor layer 120 fills the pattern 112 formed in the first insulating layer 110. Next, similar to FIG. 7, a patterning operation including one or more lithography and etching processes is performed to form patterns 122 in the first semiconductor layer 120, as shown in FIG. 57. The pattern 122 is a groove for a separation groove 20.

Figure 58:
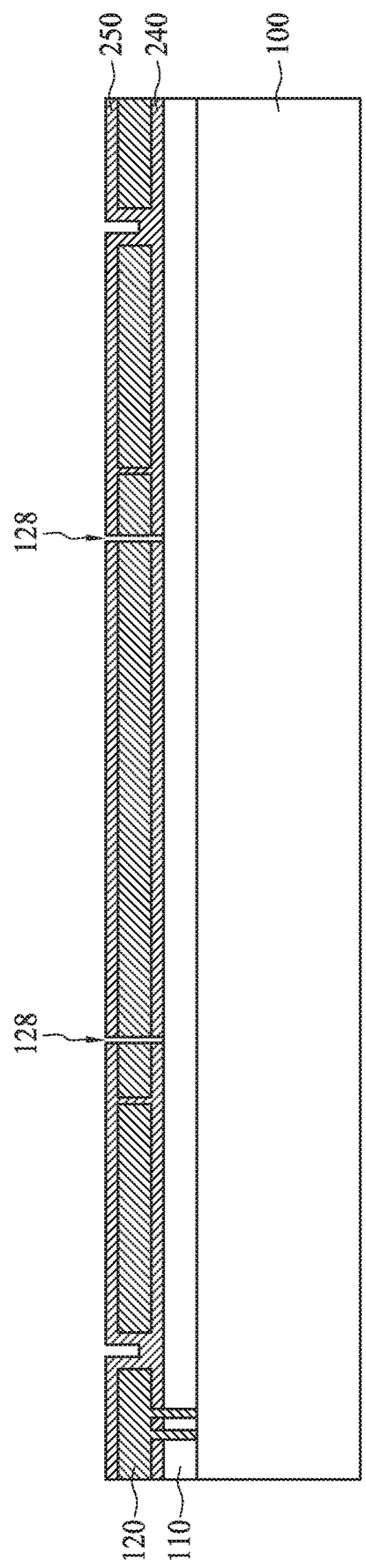
FIG. 58 shows a schematic cross sectional view of one of the various stages of a manufacturing operation for a MEMS microphone according to another embodiment of the present disclosure.

Next, similar to FIG. 29, a second dielectric layer 250 is formed over the first semiconductor layer 120, as shown in FIG. 58. The second dielectric layer at least partially fills the patterns 122. Further, as shown in FIG. 58, one or more via holes 128 passing through the second dielectric layer 250, the first semiconductor layer 120 and the first dielectric layer 240 are formed. The via holes 128 are for vent holes 25.

Figure 59:
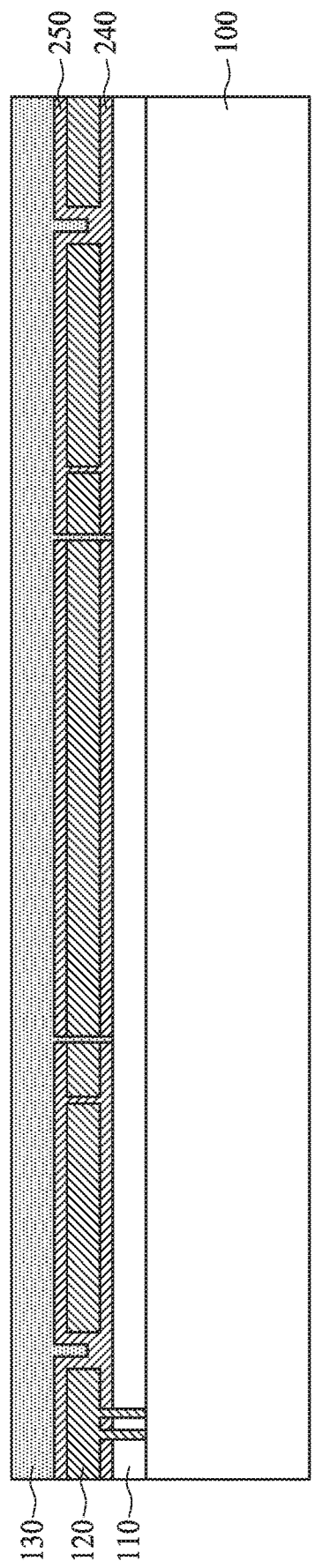
FIG. 59 shows a schematic cross sectional view of one of the various stages of a manufacturing operation for a MEMS microphone according to another embodiment of the present disclosure.

Then, similar to FIGS. 8 and 30, a second insulating layer 130 is formed over the second dielectric layer 250, as shown in FIG. 59. In some embodiments, the second insulating layer 130 is made of silicon oxide, and has a thickness in a range from about 1000 nm to about 4000 nm. The second insulating layer 130 fills the via holes 128.

Figure 60:
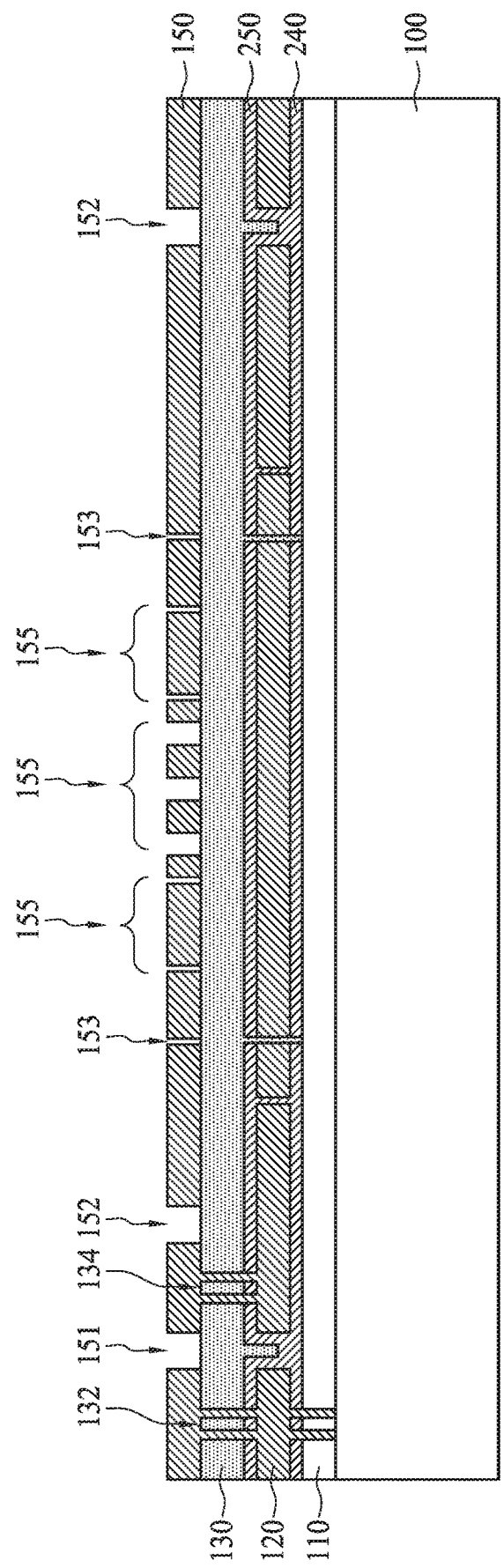
FIG. 60 shows a schematic cross sectional view of one of the various stages of a manufacturing operation for a MEMS microphone according to another embodiment of the present disclosure.

Next, similar to FIGS. 9-10 and 31-32, one or more via holes 132 and 134 passing through the second insulating layer 130 and the second dielectric layer 250 are formed by a patterning operation including one or more lithography and etching processes, as shown in FIG. 60. The pattern 132 is subsequently used as the electrical path for connecting the substrate 100 and the first electrode 10A, and the pattern 134 is subsequently used as an electrical path for connecting the second membrane 50B formed by the first semiconductor layer 120 and the second electrode 10B. Further, a second semiconductor layer 150 is formed over the second insulating layer 130, as shown in FIG. 60. In some embodiments, polysilicon doped with impurities such as P, As, and/or B having a thickness in a range from about 300 nm to about 1500 nm is used as the second semiconductor layer 150. The second semiconductor layer fills the via holes 132 and 134. Then, one or more openings 151, 152, 153, 155 and 157 passing through the second semiconductor layer 150 are formed by a patterning operation including one or more lithography and etching processes, as shown in FIG. 60. The opening patterns 151 and 152 are for the isolation grooves, the opening patterns 153 are for the vent holes, the opening patterns 157 are for support structures and the opening patterns 157 are acoustic holes.

Figure 61:
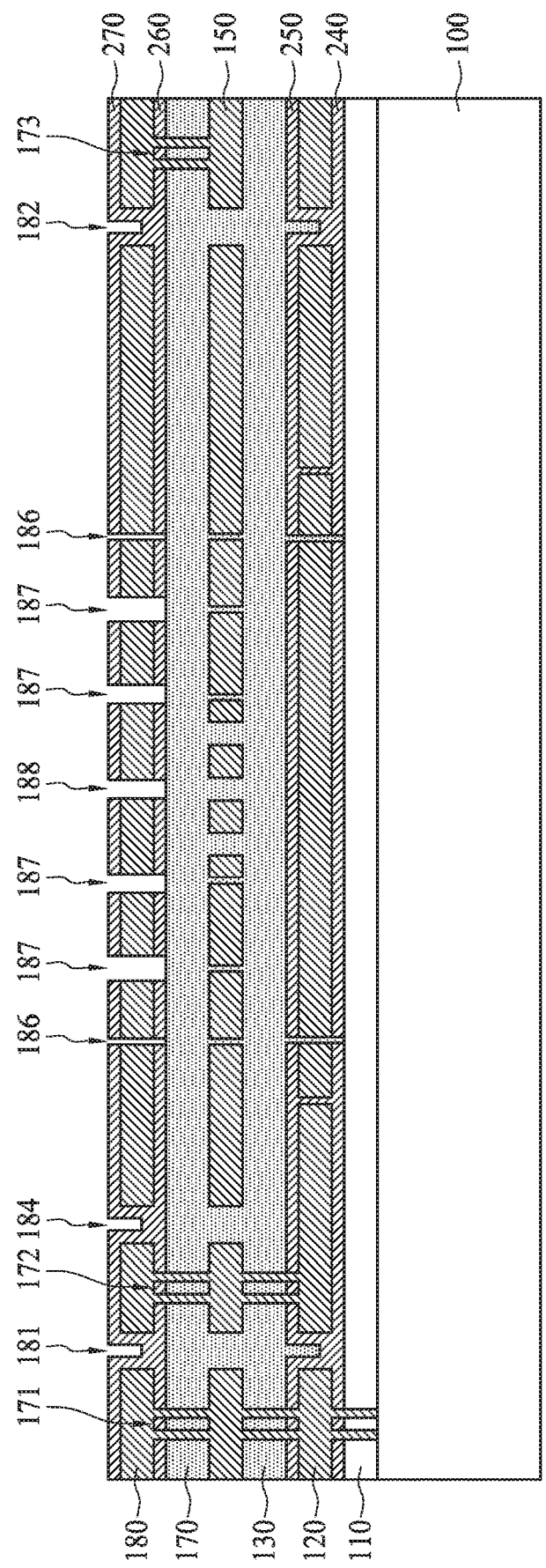
FIG. 61 shows a schematic cross sectional view of one of the various stages of a manufacturing operation for a MEMS microphone according to another embodiment of the present disclosure.

Then, similar to FIGS. 33-36, a third insulating layer 170 is formed over the second semiconductor layer 150 and a third dielectric layer 260 is formed over the third insulating layer 170, as shown in FIG. 61. In some embodiments, the third insulating layer 170 is made of silicon oxide, and has a thickness in a range from about 1000 nm to about 4000 nm. The third insulating layer 170 fills the openings 151, 152, 153, 155 and 157. In some embodiments, the third dielectric layer 260 is made of silicon nitride, and has a thickness in a range from about 100 nm to about 500 nm. Then, one or more via holes 171, 172 and 173 passing through the third dielectric layer 260 and the third insulating layer 170 are formed by a patterning operation including one or more lithography and etching processes, as shown in FIG. 61. The patterns 171, 172 and 173 are for electrical paths from the first, second and fourth electrodes to the substrate, the second membrane and the base plate, respectively. A third semiconductor layer 180 is further formed over the third dielectric layer 260, as shown in FIG. 61. In some embodiments, polysilicon doped with impurities such as P, As, and/or B having a thickness in a range from about 300 nm to about 1500 nm is used as the third semiconductor layer 180. The third semiconductor layer 180 fills the via holes 171, 172 and 173.

Then, one or more openings 181, 182 and 184 passing through the third semiconductor layer 180 are formed by a patterning operation including one or more lithography and etching processes, as shown in FIG. 61. The opening patterns 181, 182 and 184 are for the isolation groove. Further, as shown in FIG. 61, a fourth dielectric layer 270 is formed over the third semiconductor layer 180. In some embodiments, the fourth dielectric layer 270 is made of silicon nitride, and has a thickness in a range from about 100 nm to about 500 nm. Further, as shown in FIG. 61, one or more openings 186, 187 and 188 passing through the fourth dielectric layer 270, the third semiconductor layer 180 and the third dielectric layer 260 are formed by a patterning operation including one or more lithography and etching processes. The opening patterns 186 are for the vent holes and the opening patterns 188 are for release holes.

Figure 62:
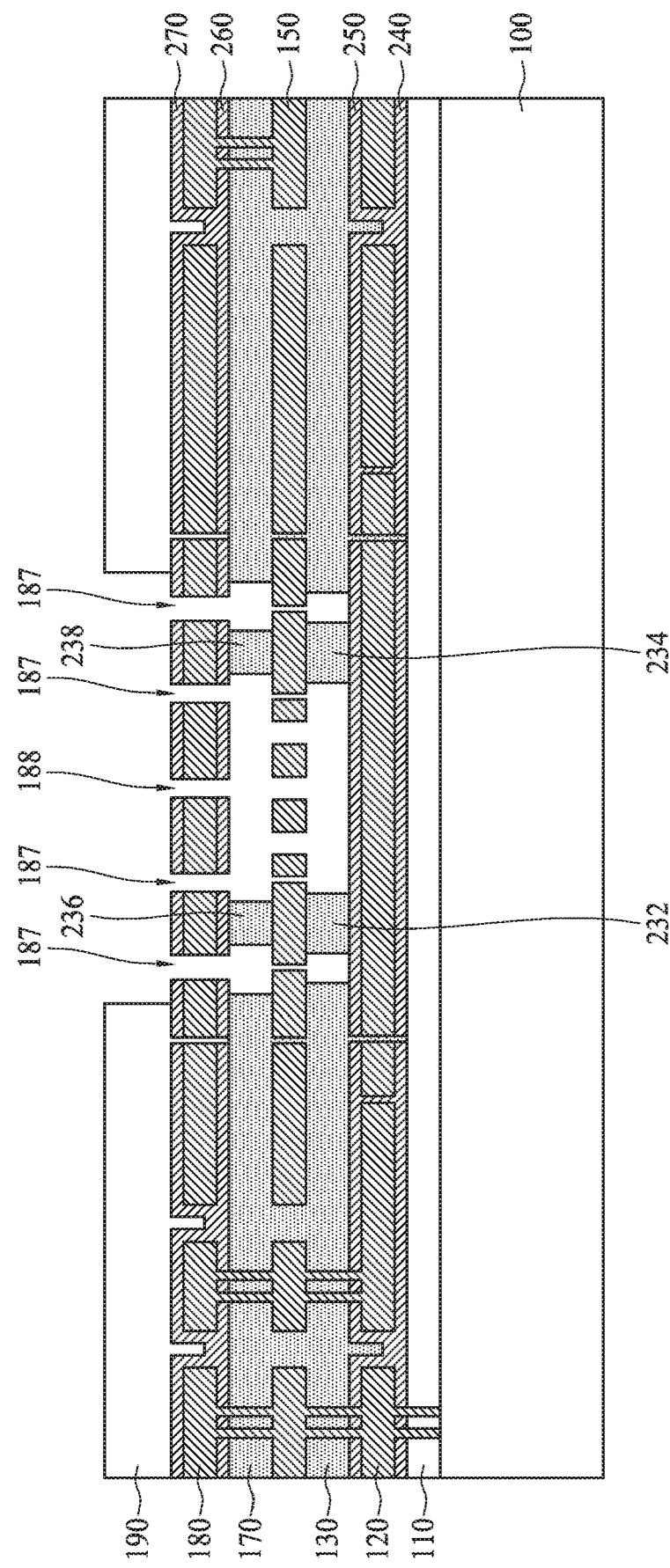
FIG. 62 shows a schematic cross sectional view of one of the various stages of a manufacturing operation for a MEMS microphone according to another embodiment of the present disclosure.

Next, similar to FIGS. 18, 37 and 49A, a mask pattern 190, for example, a photo resist pattern, is formed over the fourth dielectric layer 270, such that the opening patterns 188 for the release holes and the opening patterns 87 for the support structures are exposed from the resist pattern 190, as shown in FIG. 62. Then, the third insulating layer 170 and the second insulting layer 130 are partially etched to form a first cavity 40A and a second cavity 40B as shown in FIG. 62. In some embodiments, a wet etching operation using BHF as an etchant is employed. The etchant penetrates from the release holes 188 and dissolves a part of the third insulating layer 170. The etchant further penetrate through the acoustic holes and dissolves a part of the second insulating layer 130. By controlling an etching time, the first cavity 40A and the second cavity 40B with a desired size are obtained. Further, first supports 236, 238 formed by the third insulating layer 150 and second supports 232, 234 formed by the second insulating layer 130 are formed. The first and second supports have a columnar or a pillar shape in some embodiments, and have a wall shape in other embodiments.

Figure 63:
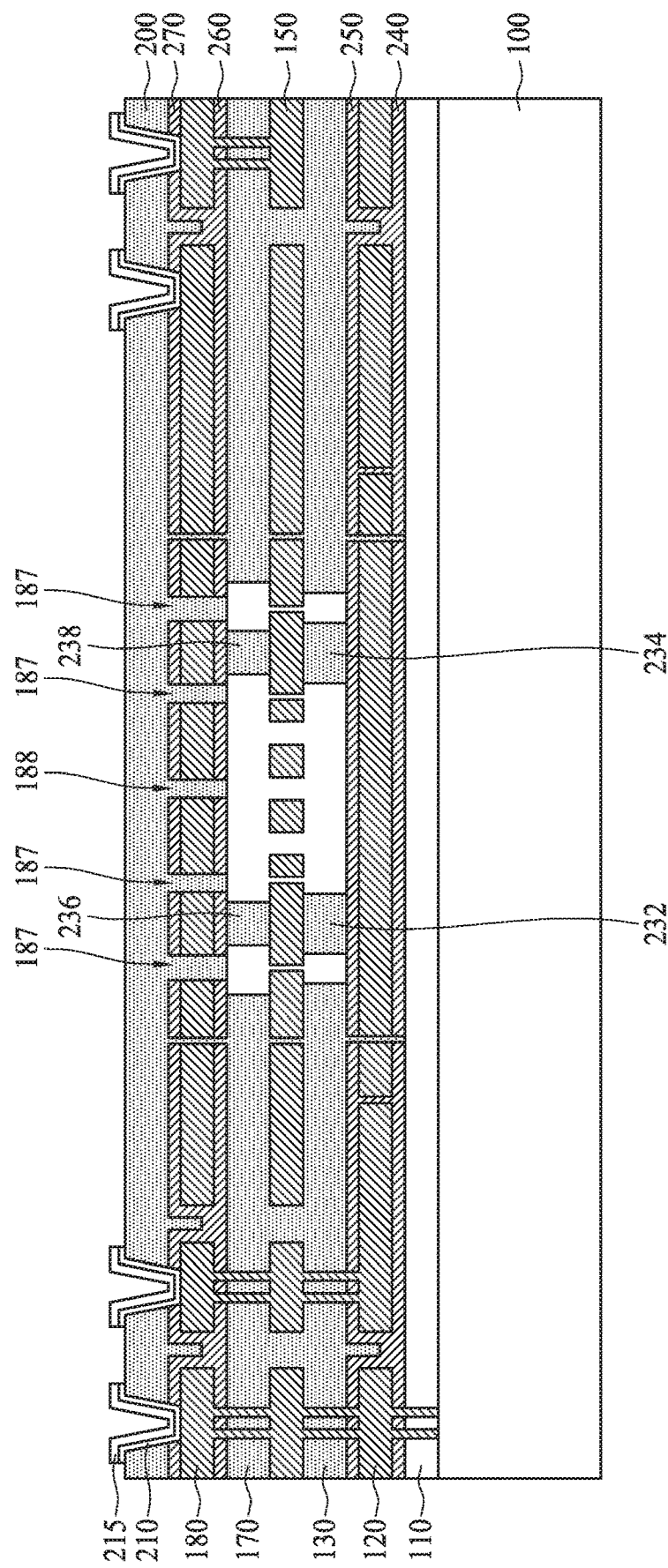
FIG. 63 shows a schematic cross sectional view of one of the various stages of a manufacturing operation for a MEMS microphone according to another embodiment of the present disclosure.

Next, similar to FIGS. 20, 38 and 50, a fourth insulating layer 200 is formed over the third semiconductor layer 180, as shown in FIG. 63. In some embodiments, the fourth insulating layer 200 is made of silicon oxide, and has a thickness in a range from about 1000 nm to about 4000 nm. The fourth insulating layer 200 fills and seals the release holes 188. Subsequently, a patterning operation including one or more lithography and etching processes is performed to expose parts of the upper surface of the third semiconductor layer 180 and the electrodes 10A-10D are formed by metal deposition and patterning operations, as shown in FIG. 63. In some embodiments, each of the electrodes includes one or more layers of conductive material. In certain embodiments, each of the electrodes includes an adhesion or barrier layer 210 and a body metal layer 215. In some embodiments, the adhesion or barrier layer 210 is made of Ti, Ta, TiN or TaN, and the body metal layer 215 is made of Cu, Al, AlCu or any other suitable metal.

Figure 64:
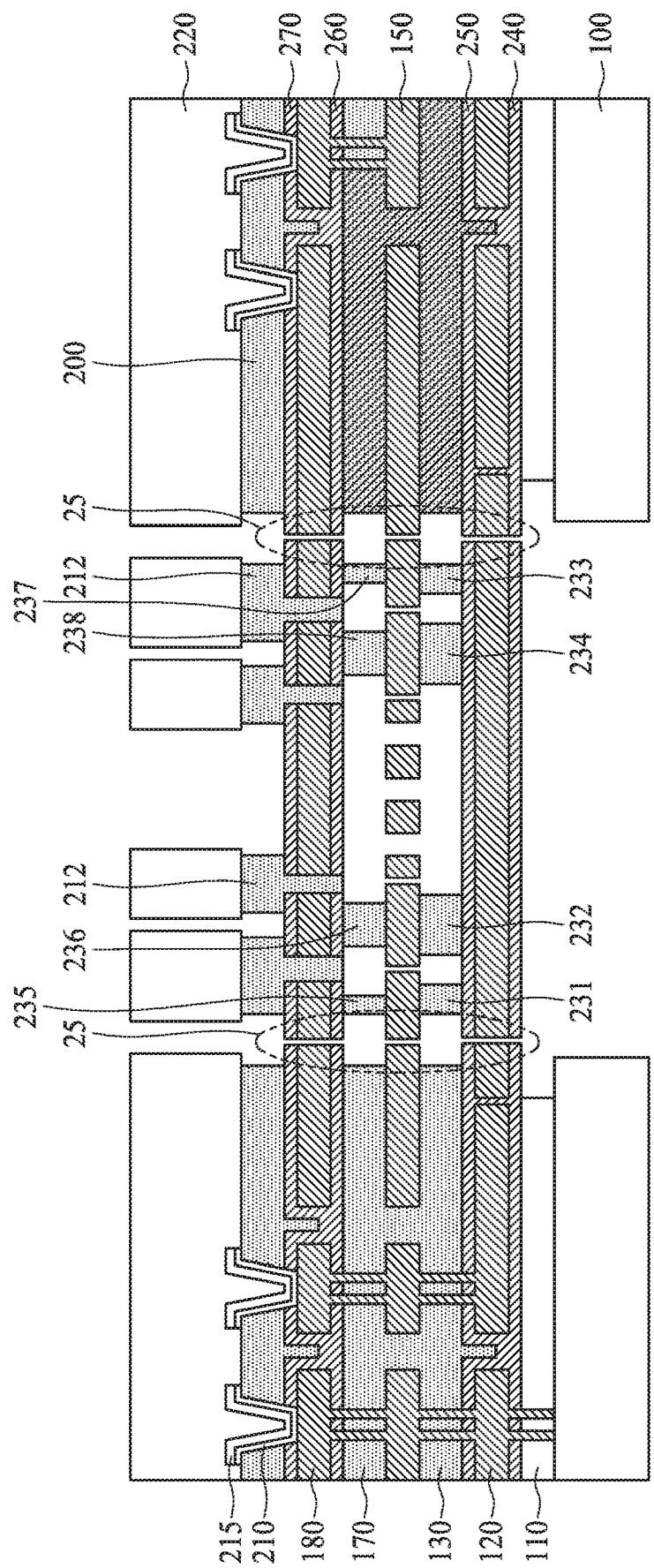
FIG. 64 shows a schematic cross sectional view of one of the various stages of a manufacturing operation for a MEMS microphone according to another embodiment of the present disclosure.

Further, similar to FIGS. 21 and 39, the backside of the substrate 100 is ground to reduce the thickness of the substrate 100, as shown in FIG. 64. A mask layer 220, for example, a resist pattern, is formed over the fourth insulating layer 200, and a part of the fourth insulating layer 200 is removed through openings of the mask layer 220. The fourth insulating layer 200 is removed by using BHF wet etching in some embodiments. By the wet etching, a part of the fourth insulating layer 200 is left as sealing members 212 that seal the release holes 188, thereby making the cavities airtight. Further, by the wet etching, the third and second insulating layers around the vent holes 25 are removed. Further, the substrate 100 and the first insulating layer 110 are partially etched to form a backside opening 60. The substrate 100 is etched after the mask layer 220 is formed and before the wet etching using BHF is performed, in some embodiments. Thus, the vent holes 25 pass through the MEMS microphone structure from the front surface to the back surface.

Figure 65:
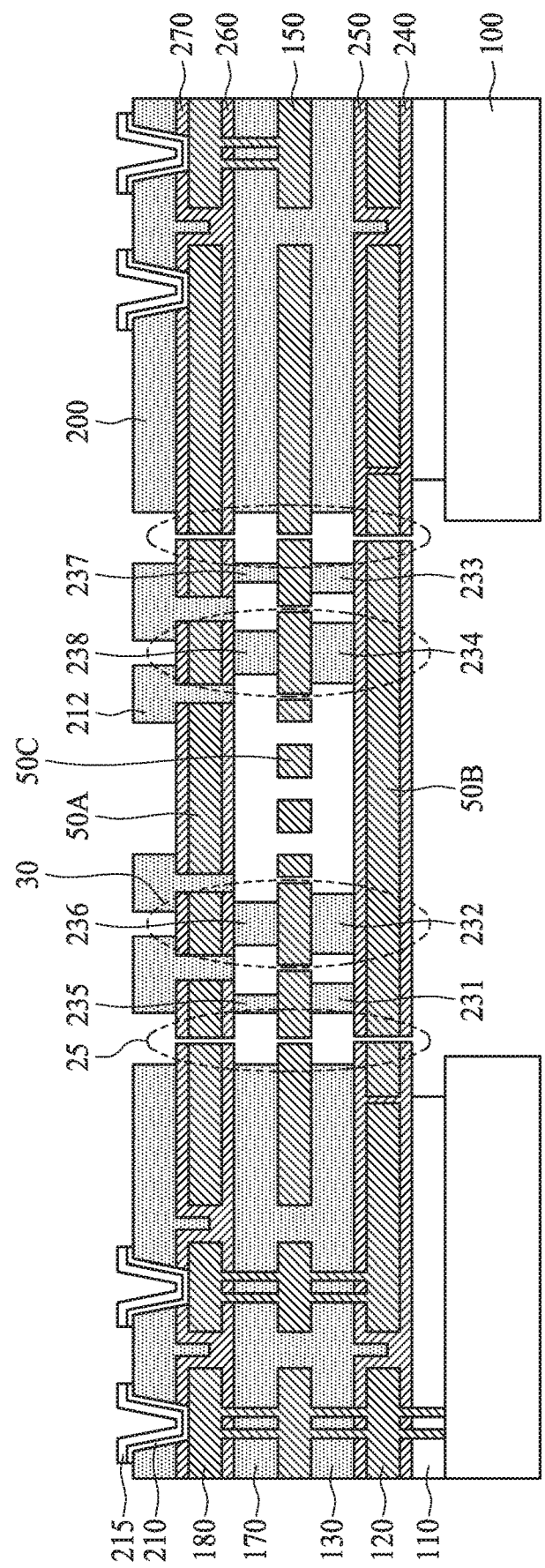
FIG. 65 shows a schematic cross sectional view of one of the various stages of a manufacturing operation for a MEMS microphone according to another embodiment of the present disclosure.

Then, after the mask pattern 220 is removed, a MEMS microphone is obtained, as shown in FIG. 65. As shown in FIG. 65, the first membrane 50A formed by the third semiconductor layer and the second membrane 50B formed by the first semiconductor layer 120 are covered by dielectric layers, such as silicon nitride. Thus, the stiffness of the first membrane 50A and the second membrane 50B can increase. Further, the first supports 235, 236, 237, 238 and second supports 231, 232, 233, 234 are connected via a part of the second semiconductor layer 150.

FIGS. 66-69 show various stages of manufacturing operations for a MEMS microphone in accordance with another embodiment of the present disclosure. It is understood that additional operations can be provided before, during, and after the processes shown by FIGS. 66-69, and some of the operations described below can be replaced or eliminated, for additional embodiments of the method. The order of the operations/processes may be interchangeable. Material, configuration, dimensions and/or processes the same as or similar to the foregoing embodiments described with FIGS. 1A-65 may be employed in the following embodiments, and detailed explanation thereof may be omitted.

Figure 66:
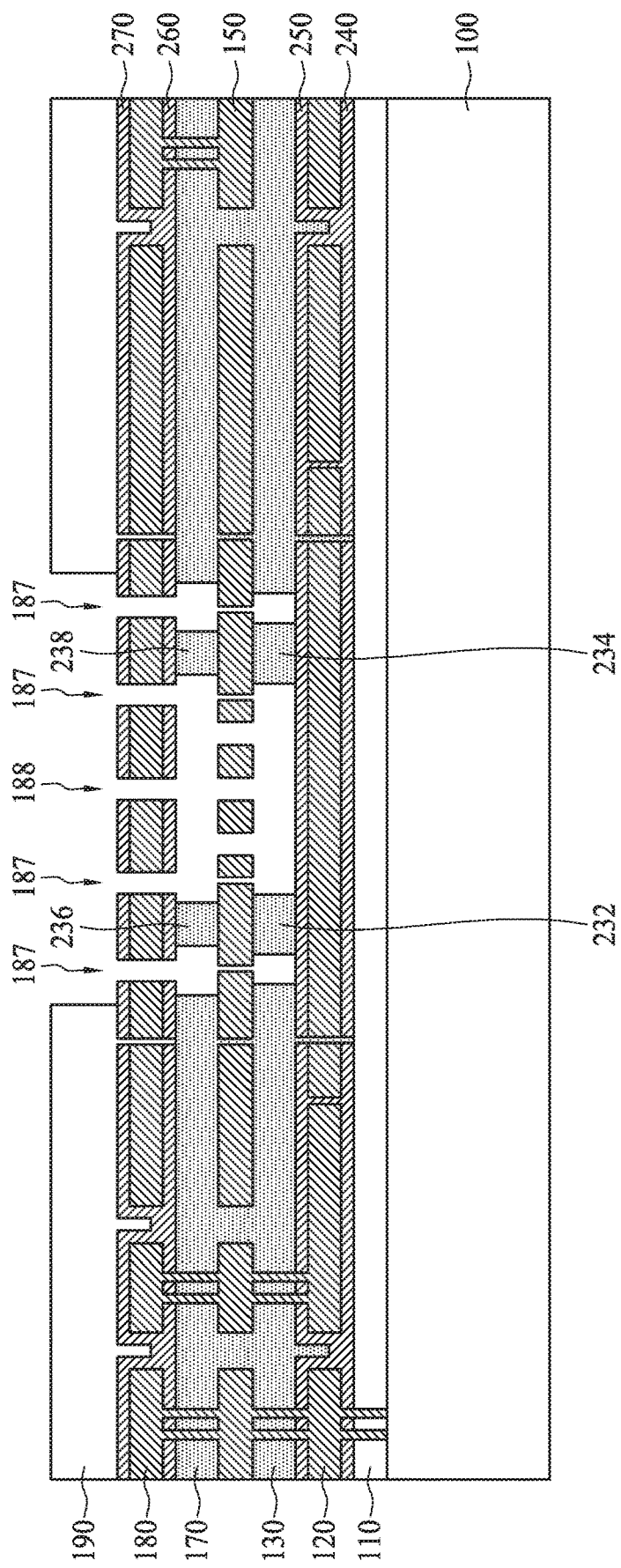
FIG. 66 shows a schematic cross sectional view of one of the various stages of a manufacturing operation for a MEMS microphone according to another embodiment of the present disclosure.
Figure 67:
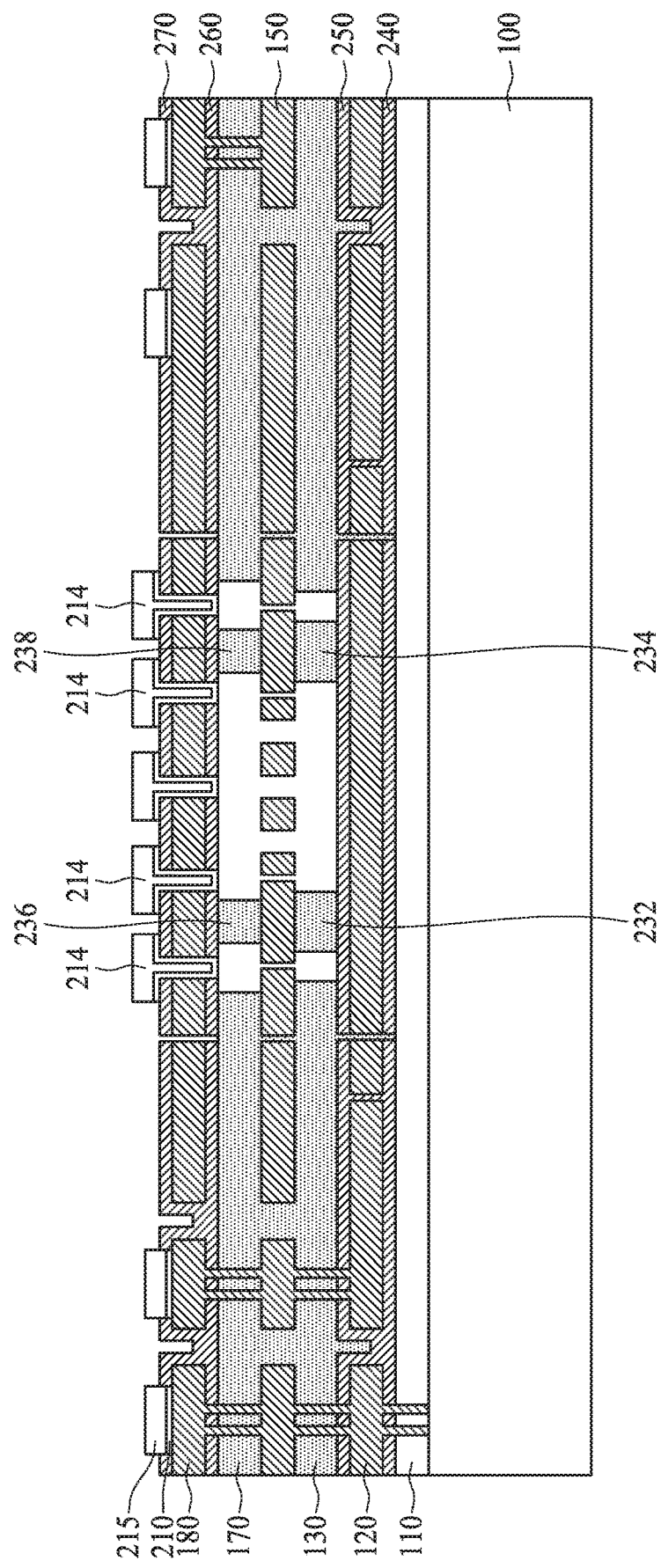
FIG. 67 shows a schematic cross sectional view of one of the various stages of a manufacturing operation for a MEMS microphone according to another embodiment of the present disclosure.

In this embodiment, the release holes are sealed by one or more conductive materials used for the electrodes 10A-10D. FIG. 66 is identical to FIG. 62. After the cavities are formed and the mask pattern 190 is removed, one or more conductive layers are formed over the fourth dielectric layer 270 and a patterning operation including one or more lithography and etching processes is performed to form the electrodes 10A-10D and sealing members 214, as shown in FIG. 67. In certain embodiments, each of the electrodes and the sealing members includes an adhesion or barrier layer 210 and a body metal layer 215. In some embodiments, the adhesion or barrier layer 210 is made of Ti, Ta, TiN or TaN, and the body metal layer 215 is made of Cu, Al, AlCu or any other suitable metal. The conductive layers can be formed by CVD, PVD including sputtering, electroplating or any other suitable film formation method. In some embodiments, a film deposition method with a low conformal condition is used to seal the release holes 187, 188 substantially without depositing the conductive material inside the cavities.

Figure 68:
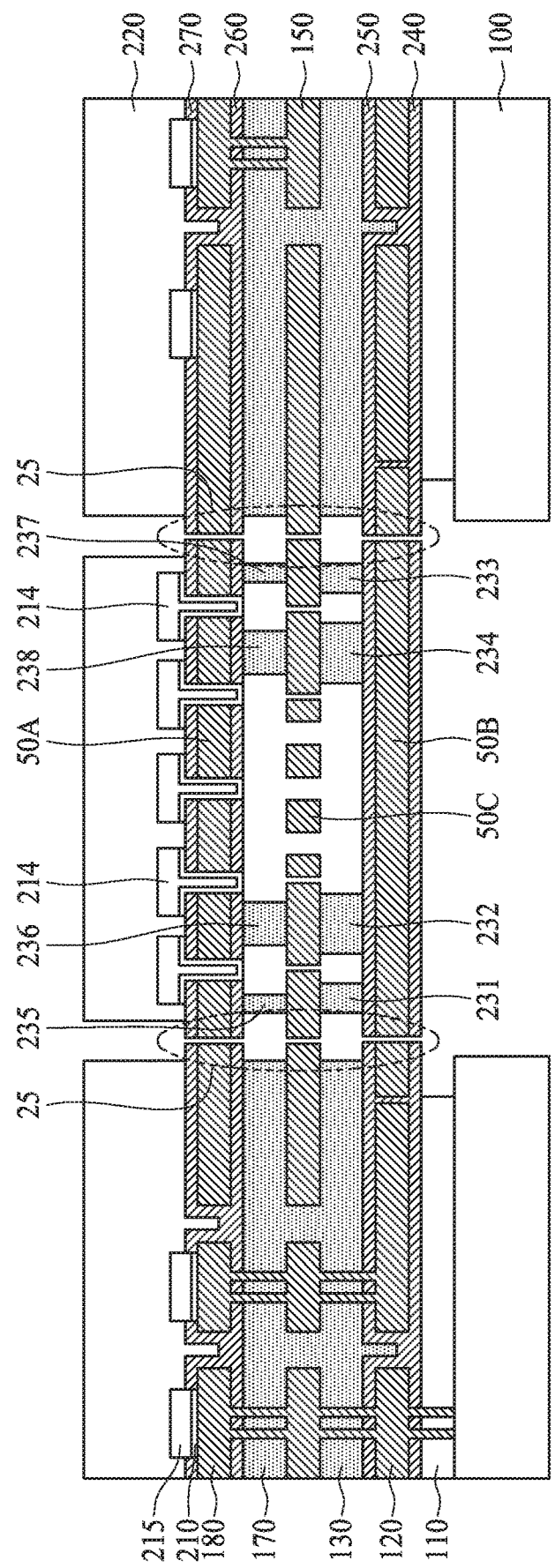
FIG. 68 shows a schematic cross sectional view of one of the various stages of a manufacturing operation for a MEMS microphone according to another embodiment of the present disclosure.
Figure 69:
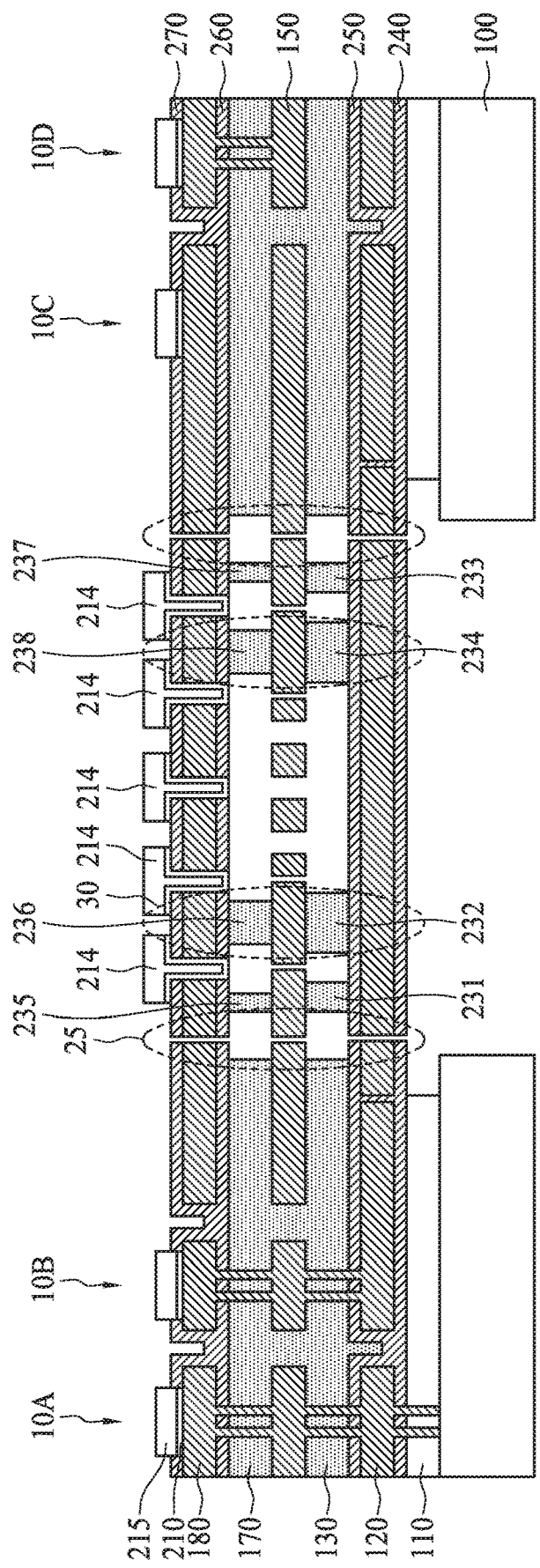
FIG. 69 shows a schematic cross sectional view of one of the various stages of a manufacturing operation for a MEMS microphone according to another embodiment of the present disclosure.

Then, similar to FIGS. 21 and 43, a mask layer 220 is formed over the third semiconductor layer 180, the electrodes and the sealing members, as shown in FIG. 68. In some embodiments, the mask layer 220 is a photo resist pattern. By BHF wet etching, the third and second insulating layers around the vent holes 25 are removed. Further, the substrate 100 and the first insulating layer 110 are partially etched to form a backside opening 60. The substrate 100 is etched after the mask layer 220 is formed and before the wet etching using BHF is performed, in some embodiments. Thus, the vent holes 25 pass through the MEMS microphone structure from the front surface to the back surface. Then, after the mask pattern 220 is removed, a MEMS microphone is obtained, as shown in FIG. 69.

The various embodiments or examples described herein offer several advantages over the existing art, as set forth above. It will be understood that not all advantages have been necessarily discussed herein, no particular advantage is required for all embodiments or examples, and other embodiments or examples may offer different advantages.

In the present disclosure, a MEMS microphone includes one or more support structures between the first (front/top) membrane and the base (back) plate and between the second (bottom/rear) membrane and the base plate, which are disposed in the cavities between the first membrane and the base plate and between the second membrane and the base plate. Accordingly, stiffness of the first and second membranes can be increased, and thus it is possible to improve the AOP as well as the SNR. In addition, a sealing member (hermetic sealing) can reduce air-dumping in the first and second cavities and also prevent dirt, dust and/or moisture from entering the cavities, thereby improving microphone performances.

In accordance with one aspect of the present disclosure, a micro electro mechanical system (MEMS) microphone includes a first membrane, a second membrane, a third membrane disposed between the first membrane and the second membrane, a first cavity disposed between the first membrane and the third membrane and surrounded by a first wall, a second cavity disposed between the second membrane and the third membrane and surrounded by a second wall, and one or more first supports disposed in the first cavity and connecting the first membrane and the third membrane. In one or more of the foregoing and following embodiments, one or more through holes that connect the first cavity and the second cavity are provided in the third membrane. In one or more of the foregoing and following embodiments, the MEMS microphone further includes one or more second supports disposed in the second cavity and connecting the second membrane and the third membrane. In one or more of the foregoing and following embodiments, the one or more first supports and the one or more second supports are made of a conductive material. In one or more of the foregoing and following embodiments, the one or more first supports and the one or more second supports are made of a dielectric material. In one or more of the foregoing and following embodiments, the first, second and third membranes are made of a polycrystalline semiconductor material. In one or more of the foregoing and following embodiments, the one or more first supports and the one or more second supports are made of a polycrystalline semiconductor material. In one or more of the foregoing and following embodiments, the one or more first supports are electrically insulated from the one or more second supports. In one or more of the foregoing and following embodiments, two or more first supports are provided to be point symmetric with respect to a center of the first cavity. In one or more of the foregoing and following embodiments, the first membrane includes one or more through holes, and the one or more through holes are sealed with a sealing material. In one or more of the foregoing and following embodiments, the sealing material is a dielectric material. In one or more of the foregoing and following embodiments, the sealing material includes one or more layers of a conductive material. In one or more of the foregoing and following embodiments, the MEMS microphone further includes one or more vent holes passing through the first, second and third membranes. In one or more of the foregoing and following embodiments, the MEMS microphone further includes dielectric layers disposed on two main surfaces opposing to each other of at least one of the first, second and third membranes. In one or more of the foregoing and following embodiments, the dielectric layers are disposed on two main surfaces of the third membrane. In one or more of the foregoing and following embodiments, the dielectric layers are disposed on two main surfaces of the first and second membranes, respectively.

In accordance with another aspect of the present disclosure, a MEMS microphone includes a first diaphragm made of polysilicon, a second diaphragm made of polysilicon, a base plate made of polysilicon and disposed between the first diaphragm and the second diaphragm, a first cavity disposed between the first diaphragm and the base plate and surrounded by a first wall, a second cavity disposed between the second diaphragm and the base plate and surrounded by a second wall, acoustic holes passing through the base plate, first pillars disposed in the first cavity and connecting the first diaphragm and the base plate, second pillars disposed in the second cavity and connecting the second diaphragm and the base plate, a first electrode electrically coupled to the first diaphragm, a second electrode electrically coupled to the second diaphragm, and a third electrode electrically coupled to the base plate. In one or more of the foregoing and following embodiments, the MEMS microphone further includes a substrate, an insulating layer disposed on the substrate, and a backside opening formed in the substrate and the insulating layer, through which the second diaphragm is exposed. In one or more of the foregoing and following embodiments, the MEMS microphone includes electric circuitry coupled to the first, second and third electrodes and configured to detect a capacitance change of a first capacitor formed by the first diaphragm and the base plate and a capacitance change of a second capacitor formed by the second diaphragm and the base plate, caused by sound pressure applied to the first diaphragm, and output an electric signal responsive to the sound pressure based on the capacitance changes.

In accordance with another aspect of the present disclosure, a MEMS microphone includes a diaphragm made of polysilicon, a base plate made of polysilicon and facing the diaphragm, a dielectric layer disposed between the diaphragm and e base plate, a cavity disposed between the diaphragm and the base plate and surrounded by a wall formed by the dielectric layer, and pillars disposed in the cavity and connecting the diaphragm and the base plate. The pillars are separated from the wall.

In accordance with one aspect of the present disclosure, in a method of manufacturing a micro electro mechanical system (MEMS) microphone, a first insulating layer is formed over a substrate. A first semiconductor layer is formed over the first insulating layer. A second insulating layer is formed over the first semiconductor layer. First via holes are formed in the second insulating layer. A second semiconductor layer is formed over the second insulating layer. First pillars are formed by filling the first via holes with part of the second semiconductor layer. First through holes are formed in the second semiconductor layer. A third insulating layer is formed over the second semiconductor layer. Second via holes are formed in the third insulating layer. A third semiconductor layer is formed over the third insulating layer. Second pillars are formed by filling the second via holes with part of the third semiconductor layer. Release holes are formed in the third semiconductor layer. A first cavity is formed by partially etching the third insulating layer through the release holes and a second cavity is formed by partially etching the second insulating layer through the first cavity and the through hole. The first pillars are disposed in the first cavity, and the second pillars are disposed in the second cavity. In one or more of the foregoing and following embodiments, the first, second and third semiconductor layers are made of one selected from the group consisting of polysilicon, amorphous silicon, amorphous carbon, and polycrystalline diamond. In one or more of the foregoing and following embodiments, the first, second and third semiconductor layers are made of polysilicon doped with impurities. In one or more of the foregoing and following embodiments, before the first via holes are formed in the second insulating layer, a first dielectric layer is formed over the second insulating layer. The first via holes pass through the first dielectric layer. In one or more of the foregoing and following embodiments, a second dielectric layer is formed over the second semiconductor layer and filling the first through holes. In one or more of the foregoing and following embodiments, before the third insulating layer is formed, second through holes passing through the second dielectric layer, the second semiconductor layer and the first dielectric layer, are formed. The third insulating layer fills the second through holes. In one or more of the foregoing and following embodiments, when the first and second cavities are formed, the third insulating layer filled in the second through holes is removed. In one or more of the foregoing and following embodiments, the release holes are sealed with a sealing material. In one or more of the foregoing and following embodiments, the sealing material is an insulating material. In one or more of the foregoing and following embodiments, the sealing material includes one or more layers of a conductive material. In one or more of the foregoing and following embodiments, a part of the substrate and a part of the first insulating layer are removed, thereby forming an opening in which a part of a bottom surface of the first semiconductor layer is exposed. In one or more of the foregoing and following embodiments, vent holes passing through the first, second and third semiconductor layers into the opening, are formed.

In accordance with another aspect of the present disclosure, in a method of manufacturing a MEMS microphone, a first insulating layer is formed over a substrate. A first semiconductor layer is formed over the first insulating layer. A second insulating layer is formed over the first semiconductor layer. A second semiconductor layer is formed over the second insulating layer. First through holes are formed in the second semiconductor layer. A third insulating layer is formed over the second semiconductor layer. A third semiconductor layer is formed over the third insulating layer, and second pillars are formed by filling the second via holes with part of the third semiconductor layer. Release holes are formed in the third semiconductor layer. A first cavity is formed by partially etching the third insulating layer through the release holes and a second cavity is formed by partially etching the second insulating layer through the first cavity and the first through hole. First pillars formed by the third insulating layer are disposed in the first cavity, and second pillars formed by the second insulating layer are disposed in the second cavity. In one or more of the foregoing and following embodiments, the first, second and third semiconductor layers are made of polysilicon doped with impurities. In one or more of the foregoing and following embodiments, a first dielectric layer is formed between the second insulating layer and the second semiconductor layer. A second dielectric layer is formed between the second semiconductor layer and the third semiconductor layer. The first through holes pass through the second dielectric layer, the second semiconductor layer and the first insulating layer. In one or more of the foregoing and following embodiments, the release holes are sealed with a sealing material. In one or more of the foregoing and following embodiments, the sealing material is an insulating material. In one or more of the foregoing and following embodiments, the sealing material includes one or more layers of a conductive material.

In accordance with another aspect of the present disclosure, in a method of manufacturing a MEMS microphone, a first insulating layer is formed over a substrate. A first membrane layer is formed over the first insulating layer. The first membrane layer includes a first polysilicon layer disposed between first and second dielectric layers. A second insulating layer is formed over the first semiconductor layer. First via holes are formed in the second insulating layer. A second semiconductor layer is formed over the second insulating layer, and first pillars are formed by filling the first via holes with part of the second semiconductor layer. First through holes are formed in the second semiconductor layer. A third insulating layer is formed over the second semiconductor layer. A third dielectric layer is formed over the third insulating layer. Second via holes are formed in the third dielectric layer and the third insulating layer. A third semiconductor layer is formed over the third insulating layer, and second pillars are formed by filling the second via holes with part of the third semiconductor layer. A fourth dielectric layer is formed over the third semiconductor layer. Release holes passing through the fourth dielectric layer, the third semiconductor layer and the third dielectric layer, are formed. A first cavity is formed by partially etching the third insulating layer through the release hole and a second cavity is formed by partially etching the second insulating layer through the first cavity and the through hole. The first pillars are disposed in the first cavity, and the second pillars are disposed in the second cavity. In one or more of the foregoing and following embodiments, the release holes are sealed with a sealing material.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A micro electro mechanical system (MEMS) microphone, comprising:
a first diaphragm made of polysilicon;
a second diaphragm made of polysilicon;
a base plate made of polysilicon and disposed between the first diaphragm and the second diaphragm;
a first cavity disposed between the first diaphragm and the base plate and surrounded by a first wall;
a second cavity disposed between the second diaphragm and the base plate and surrounded by a second wall;
acoustic holes passing through the base plate;
first pillars disposed in the first cavity, connecting the first diaphragm and the base plate and having one end fixed to the first diaphragm and another end fixed to the base plate;
second pillars disposed in the second cavity, connecting the second diaphragm and the base plate and having one end fixed to the second diaphragm and another end fixed to the base plate;
a first electrode electrically coupled to the first diaphragm;
a second electrode electrically coupled to the second diaphragm;
a third electrode electrically coupled to the base plate; and
dielectric layers disposed on two main surfaces opposing to each other of at least one of the first diaphragm, the second diaphragm and the base plate, wherein:
at least one of the dielectric layers includes a first surface opposite to a second surface disposed on a corresponding one of the two main surfaces and the first surface is exposed in the first cavity or the second cavity, and
the dielectric layers are disposed on:
two main surfaces of the base plate and are exposed in the first cavity and the second cavity, respectively, or
two main surfaces of the first and second diaphragms, respectively.

2. The MEMS microphone of claim 1, further comprising:
a substrate:
an insulating layer disposed on the substrate; and
a backside opening formed in the substrate and the insulating layer, through which the second diaphragm is exposed.

3. The MEMS microphone of claim 1, further comprising electric circuitry coupled to the first, second and third electrodes and configured to detect a capacitance change of a first capacitor formed by the first diaphragm and the base plate and a capacitance change of a second capacitor formed by the second diaphragm and the base plate, caused by sound pressure applied to the first diaphragm, and output an electric signal responsive to the sound pressure based on the capacitance changes.

4. The MEMS microphone of claim 1, wherein the first pillars and the second pillars are made of polysilicon.

5. The MEMS microphone of claim 1, wherein the first pillars are electrically insulated from the second pillars.

6. The MEMS microphone of claim 1, wherein the first pillars are provided to be point symmetric with respect to a center of the first cavity.

7. The MEMS microphone of claim 1, wherein:
the first diaphragm includes one or more through holes, and
the one or more through holes are sealed with a sealing material.

8. The MEMS microphone of claim 7, wherein the sealing material is a dielectric material.

9. The MEMS microphone of claim 7, wherein the sealing material includes one or more layers of a conductive material.

10. The MEMS microphone of claim 7, further comprising one or more vent holes passing through the first diaphragm, the second diaphragm and the base plate.

11. The MEMS microphone of claim 1, wherein the dielectric layers are made of silicon nitride.

12. The MEMS microphone of claim 1, wherein a thickness of each of the dielectric layers is in a range from 100 nm to 500 nm.

13. The MEMS microphone of claim 1, wherein the dielectric layers are made of silicon oxide.

14. T MEMS microphone of claim 1, wherein the first pillars and the second pillars are offset from each other in a vertical direction.

15. The MEMS microphone of claim 1, wherein:
the base plate includes a polysilicon layer and a dielectric layer,
the polysilicon layer includes a first cylindrical opening filled by the dielectric layer, the base plate includes a second cylindrical through opening passing through the polysilicon layer and the dielectric layer, one or more of the first pillars are surrounded by the first cylindrical opening in plan view, and one or more of the second pillars are surrounded by the second cylindrical opening in plan view.

16. A micro electro mechanical system (MEMS) microphone, comprising:

a first diaphragm made of a polycrystalline semiconductor material;

a second diaphragm made of the polycrystalline semiconductor material;

a base plate made of the polycrystalline semiconductor material and disposed between the first diaphragm and the second diaphragm;

a first cavity disposed between the first diaphragm and the base plate and surrounded by a first wall;

a second cavity disposed between the second diaphragm and the base plate and surrounded by a second wall;

acoustic holes passing through the base plate;

first pillars disposed in the first cavity, connecting the first diaphragm and the base plate and having one end fixed to the first diaphragm and another end fixed to the base plate;

a first gap disposed between the first diaphragm and the base plate and separated by the first wall;

a first electrode electrically coupled to the first diaphragm;

a second electrode electrically coupled to the second diaphragm;

a third electrode electrically coupled to the base plate; and dielectric layers disposed on two main surfaces opposing to each other of the base plate, wherein the dielectric layers are exposed in the first cavity and the second cavity, respectively.

17. The MEMS microphone of claim 16, wherein:

the first diaphragm is bonded to the base plate by a bonding layer, and one of the first pillars is in contact with the bonding layer.

18. A micro electro mechanical system (MEMS) microphone, comprising:

a diaphragm made of polysilicon;

a base plate including a polysilicon layer and a dielectric layer, and facing the diaphragm;

a dielectric layer disposed between the diaphragm and the base plate;

a cavity disposed between the diaphragm and the base plate and surrounded by a wall formed by the dielectric layer;

first pillars disposed in the cavity, connecting the diaphragm and the base plate and having one end fixed to the diaphragm and another end fixed to the base plate;

a second pillar, connecting the diaphragm and the base plate and having one end fixed to the diaphragm and another end fixed to the base plate;

a first electrode electrically coupled to the diaphragm; and a second electrode electrically coupled to the base plate, wherein the first pillars are separated from the wall, and the second pillar is in direct contact with the wall, the polysilicon layer includes a first cylindrical opening filled by the dielectric layer, the base plate includes a second cylindrical through opening passing through the polysilicon layer and the dielectric layer, one or more of the first pillars are surrounded by the first cylindrical opening in plan view, and the second pillar is surrounded by the second cylindrical through opening in plan view.

19. The MEMS microphone of claim 18, wherein the first pillars and the second pillar are made of polysilicon.

* * * * *